(12) United States Patent
Chen et al.

(10) Patent No.: US 12,419,104 B2
(45) Date of Patent: Sep. 16, 2025

(54) SEMICONDUCTOR DEVICE AND METHOD OF FORMING THE SAME

(71) Applicant: Taiwan Semiconductor Manufacturing Company, Ltd., Hsinchu (TW)

(72) Inventors: Yi-Ren Chen, Taoyuan (TW); Chung-Ting Li, Hsinchu (TW); Shih-Hsun Chang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 430 days.

(21) Appl. No.: 18/152,775

(22) Filed: Jan. 11, 2023

(65) Prior Publication Data
US 2024/0088148 A1     Mar. 14, 2024

Related U.S. Application Data

(60) Provisional application No. 63/405,888, filed on Sep. 13, 2022.

(51) Int. Cl.
| | |
|---|---|
| *H10D 84/85* | (2025.01) |
| *H10D 30/01* | (2025.01) |
| *H10D 30/43* | (2025.01) |
| *H10D 30/67* | (2025.01) |
| *H10D 62/10* | (2025.01) |
| *H10D 64/01* | (2025.01) |
| *H10D 84/01* | (2025.01) |
| *H10D 84/03* | (2025.01) |

(52) U.S. Cl.
CPC ............ *H10D 84/85* (2025.01); *H10D 30/014* (2025.01); *H10D 30/43* (2025.01); *H10D 30/6735* (2025.01); *H10D 62/121* (2025.01); *H10D 64/017* (2025.01); *H10D 84/0167* (2025.01); *H10D 84/038* (2025.01)

(58) Field of Classification Search
CPC ............ H10D 30/6215; H10D 30/6217; H10D 84/0193; H10D 84/853
See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |

(Continued)

*Primary Examiner* — Christine S. Kim
*Assistant Examiner* — Cole Leon Lindsey
(74) *Attorney, Agent, or Firm* — JCIPRNET

(57) ABSTRACT

A semiconductor device includes a substrate, a stack of semiconductor nanosheets, a dielectric wall, and a gate structure. The substrate includes a nanosheet mesa, and the stack of semiconductor nanosheets is disposed on the nanosheet mesa. The dielectric wall crosses through the nanosheet mesa and the stack of semiconductor nanosheets. The gate structure wraps the stack of semiconductor nanosheets and crosses over the dielectric wall, wherein a top of the dielectric wall has a recess.

20 Claims, 80 Drawing Sheets

(56) References Cited

U.S. PATENT DOCUMENTS

| | | |
|---|---|---|
| 9,608,116 B2 | 3/2017 | Ching et al. |
| 2021/0296315 A1* | 9/2021 | Lilak .................... H10D 88/01 |
| 2022/0271171 A1* | 8/2022 | Su ....................... H10D 62/151 |
| 2023/0178559 A1* | 6/2023 | Xie .................... H10D 30/6757 |
| | | 257/288 |

* cited by examiner

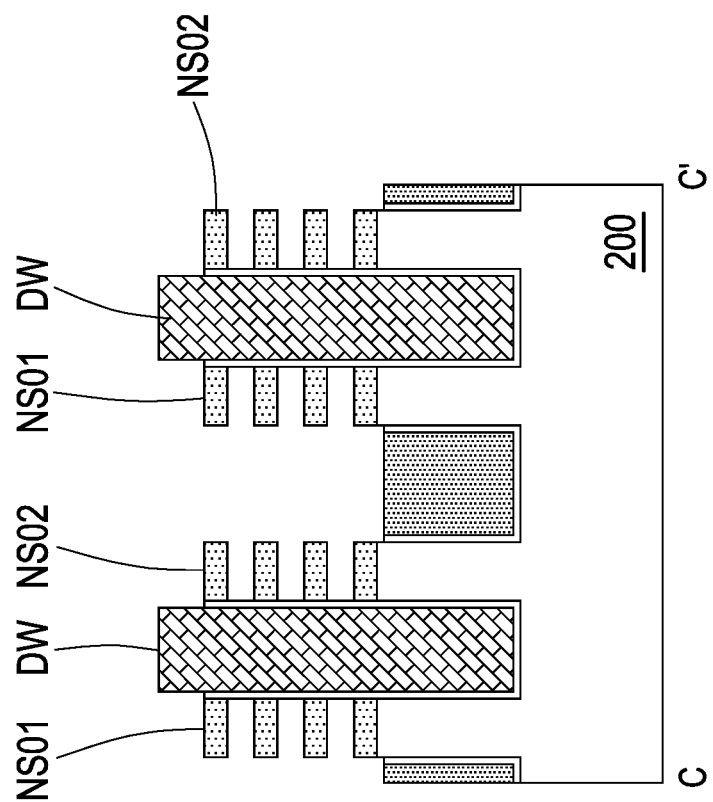

SEMICONDUCTOR DEVICE AND METHOD OF FORMING THE SAME

CROSS-REFERENCE TO RELATED APPLICATION

This application claims the priority benefit of U.S. provisional application Ser. No. 63/405,888, filed on Sep. 13, 2022. The entirety of the above-mentioned patent application is hereby incorporated by reference herein and made a part of this specification.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (e.g., the number of interconnected devices per chip area) has generally increased while geometry size (e.g., the smallest component (or line) that can be created using a fabrication process) has decreased. This scaling down process generally provides benefits by increasing production efficiency and lowering associated costs. However, scaling down has also led to challenges that may not have been presented by previous generations at larger geometries.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 26A-26B are various views of a portion of a semiconductor device after removal of the dummy gate structure according to the fourth embodiment of the present disclosure.

DETAILED DESCRIPTION

Figure 1A:
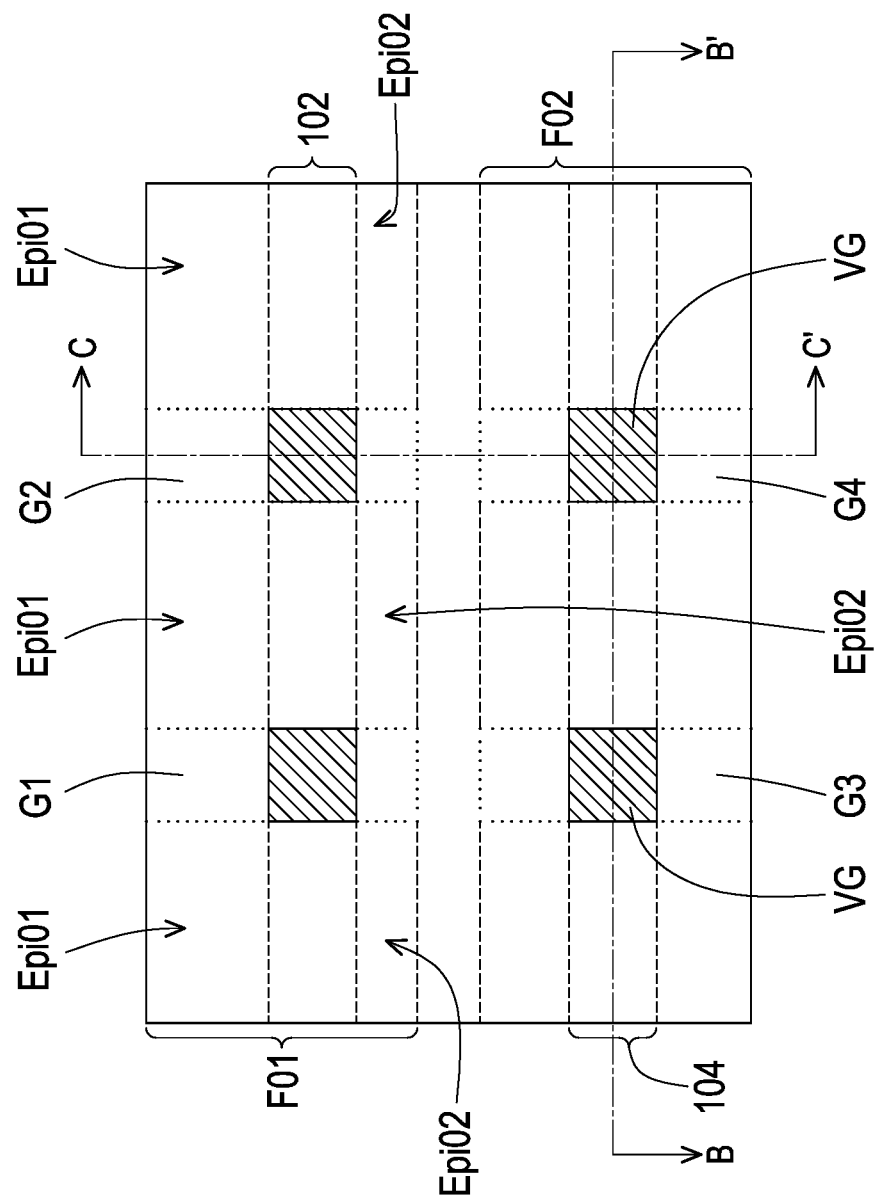
FIGS. 1A-1C are various views of a semiconductor device according to a first embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "over," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Generally, the structures and methods of the present disclosure may be used to form a semiconductor structure including multi-gate transistors (planar or vertical) such as FinFET devices, gate-all-around (GAA) devices, Omega-gate (a-gate) devices, or Pi-gate (H-gate) devices, as well as strained-semiconductor devices, silicon-on-insulator (SOI) devices, partially-depleted SOI devices, fully-depleted SOI devices, or other devices as known in the art. In addition, embodiments disclosed herein may be employed in the formation of p-type and/or n-type devices. One of ordinary skill may recognize other embodiments of semiconductor devices that may benefit from aspects of the present disclosure.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Figure 1B:
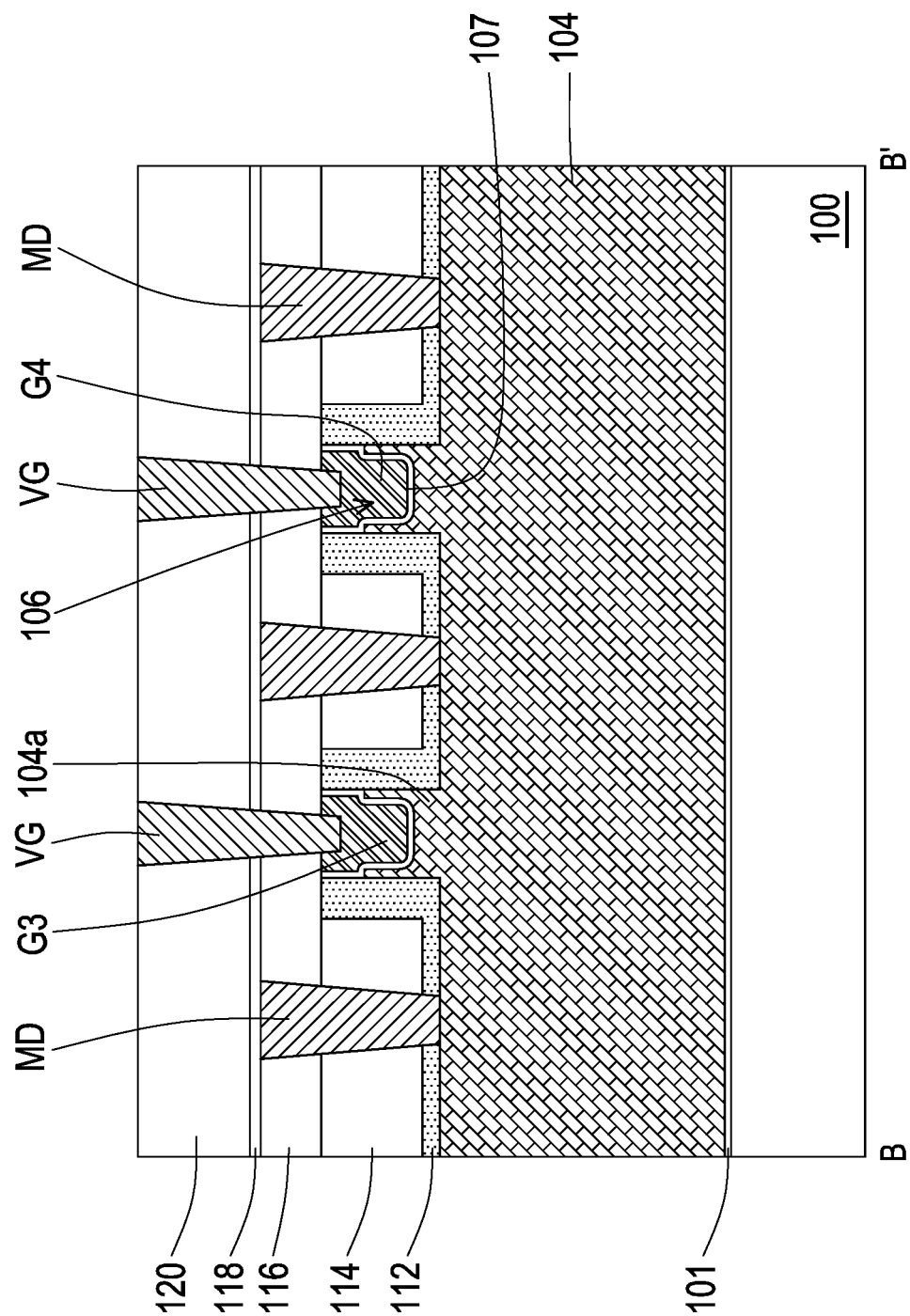
Figure 1C:
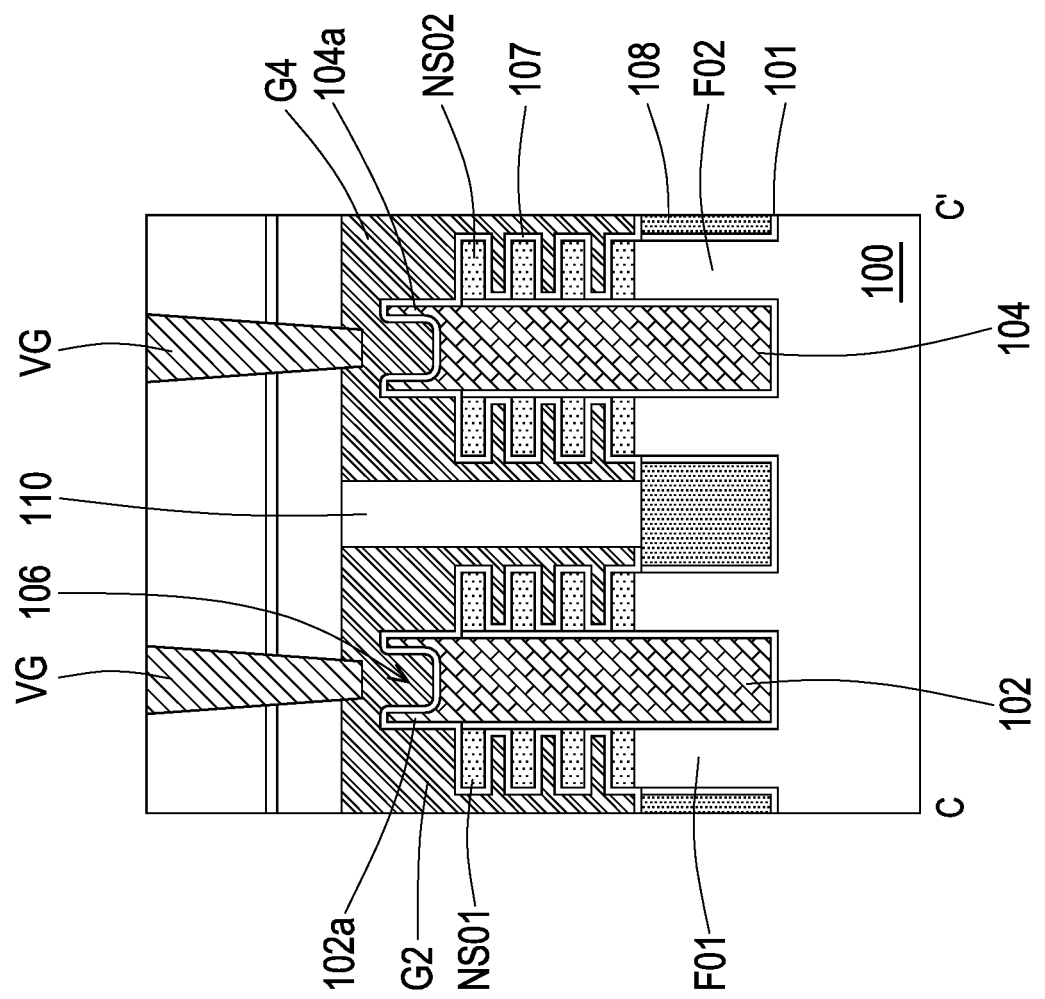

FIGS. 1A-1C are various views of a semiconductor device according to a first embodiment of the present disclosure. FIG. 1A is a top-down view, FIG. 1B is a vertical cross-sectional view along the vertical plane B-B' of FIG. 1A, and FIG. 1C is a vertical cross-sectional view along the vertical plane C-C' of FIG. 1A.

Referring to FIG. 1A-1C, a first exemplary structure according to the first embodiment of the present disclosure is illustrated. The first exemplary structure includes a substrate 100. In some embodiments, the substrate 100 includes an element semiconductor such as silicon or germanium, a compound semiconductor such as silicon carbide, gallium arsenic, gallium phosphide, indium phosphide, indium arsenide and indium antimonide, an alloy semiconductor such as SiGe, GaAsP, AlInAs, AlGaAs, GaInAs, GaInP and GaInAsP or a combination thereof. The substrate 100 may include various doped regions (e.g., p-type well and/or n-type well) depending on design requirements. In some embodiments, the doped regions may be doped with p-type or n-type dopants. The doped regions may be configured for an n-type device, or alternatively, configured for a p-type device. The substrate 100 includes nanosheet mesas F01 and F02. In some embodiments, the nanosheet mesas F01 and F02 are parallel to each other. Although two nanosheet mesas F01 and F02 are illustrated in FIG. 1A, the embodiments of the present disclosure are not limited thereto. In other embodiments, the number of the nanosheet mesas F01 and F02 may be adjusted as needed. In some embodiments, insulating regions 108 are formed between the nanosheet mesas F01 and F02. The material of the insulating regions 108 may include silicon oxide, silicon nitride, silicon oxynitride, a spin-on dielectric material, or a low-k material. The low-k material has a dielectric constant less than 3.9, less than 3, less than 2.5, or even less. In the first embodiment, as shown in FIG. 1C, the top surfaces of the nanosheet mesas F01 and F02 are substantially coplanar with the top surfaces of the insulating regions 108. The insulating regions 108 are referred to as "isolation strips", "shallow trench isolation (STI) regions" or "deep trench isolation (DTI) regions" in some examples.

Stacks of semiconductor nanosheets NS01 and NS02 are disposed on the nanosheet mesas F01 and F02 respectively. In some embodiments, the stack of semiconductor nanosheets includes a first stack of semiconductor nanosheets NS01 and a second stack of semiconductor nanosheets NS02. The nanosheets are referred to as "nanowires" or "semiconductor nanosheets" in some examples. In some embodiments, the stacks of semiconductor nanosheets NS01 and NS02 are referred to as "channel members", "channel portions" or "channel regions" which will serve as semiconductor channels. Although fours semiconductor nanosheets NS01 and four semiconductor nanosheets NS02 in each stack are illustrated in FIG. 1C, the embodiments of the present disclosure are not limited thereto. In other embodiments, the number of the semiconductor nanosheets NS01 and NS02 may be adjusted as needed.

Dielectric wall 102 crosses through the nanosheet mesa F01 and the stack of semiconductor nanosheets NS01, and dielectric wall 104 crosses through the nanosheet mesa F02 and the stack of semiconductor nanosheets NS02. In some embodiments, the first stack of semiconductor nanosheets NS01 are separated into two stacks, one is disposed at a first side of the dielectric wall 102 on the substrate 100; another is disposed at a second side of the dielectric wall 102 on the substrate 100. A top 102a of the dielectric wall 102 has a recess 106, and a top 104a of the dielectric wall 104 also has a recess 106. A bottom surface of the recess 106 is higher than a top surface of the stack of semiconductor nanosheets NS01 and NS02. The top 102a of the dielectric wall 102 is bowl-shaped, and the top 104a of the dielectric wall 104 is bowl-shaped. The dielectric walls 102 and 104 may be made by forming trenches in the nanosheet mesas F01 and F02, forming a liner layer 101 on inner surfaces of the trenches, and then depositing insulating materials in the trenches followed by planarization process. The material of the dielectric walls 102 and 104 may include silicon nitride, SiCN, or a high-k material. Examples of the high-k material include metal oxide, such as $HfO_2$, HfSiO, HfSiON, HfTaO, HfSiO, HfZrO, zirconium oxide, aluminum oxide, titanium oxide, hafnium dioxide-alumina ($HfO_2$—$Al_2O_3$) alloy, the like, or combinations thereof. The high-k material has a dielectric constant less than 8, less than 15, less than 20, or even more.

Gate structure G2 wraps the stack of semiconductor nanosheets NS01 and crosses over the dielectric wall 102. There are spaces between two semiconductor nanosheets NS01 for the gate structure G2. Gate structure G4 wraps the stack of semiconductor nanosheets NS02 and crosses over the dielectric wall 104. There are spaces between two semiconductor nanosheets NS02 for the gate structure G4. The gate structures G1 and G2 cover the top 102a of the dielectric wall 102 and fill in the recess 106. The gate structures G3 and G4 cover the top 104a of the dielectric wall 104 and fill in the recess 106. In some embodiments, the gate structures G1-G4 may include one or more conductive materials, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloy, a suitable material, or a combination thereof. In some embodiments, a gate dielectric layer 107 is disposed between the stacks of semiconductor nanosheets NS01-NS02 and the gate structures G1-G4. The gate dielectric layer 107 includes at least one dielectric material, such as a high-k material. Examples of the high-k material include metal oxide, such as $HfO_2$, HfSiO, HfSiON, HfTaO, HfSiO, HfZrO, zirconium oxide, aluminum oxide, titanium oxide, hafnium dioxide-alumina ($HfO_2$—$Al_2O_3$) alloy, the like, or combinations thereof. The gate dielectric layer 107 may be formed by CVD, ALD or a suitable method. In one embodiment, the gate dielectric layer 107 is formed by using a highly conformal deposition process, such as ALD in order to ensure the formation of a gate dielectric layer having a uniform thickness around each channel members. In some embodiments, the recess 106 is a hole, and the gate structures G1-G4 fill the hole.

A contact etch stop layer (CESL) 112 is disposed over the dielectric walls 102, 104 and on the sidewalls of the top 102a and 104a. In some embodiments, the CESL 112 conformally covers the sidewalls of the top 102a and 104a and the sidewalls of gate structures G1-G4. The CESL 112 may include silicon nitride, silicon oxynitride, silicon nitride with oxygen (O) or carbon (C) elements, metal oxide such as $Al_2O_3$, the like, or a combination thereof. An interlayer dielectric (ILD) layer 114 is formed over the CESL 112. In some embodiments, the ILD layer 114 includes silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), polyimide, the like, or a combination thereof. In some other embodiments, the ILD layer 114 includes a low-k material.

In some embodiments, cut gate structures 110 are formed between the gate structures G2 and G4, as shown in FIG. 1C. Each sidewall of the cut gate structures 110 comprises a continuously extending vertical segment parallel to the dielectric walls 102 and 104, but the embodiments of the present disclosure are not limited thereto. In other embodiments, each of the cut gate structures 110 is disposed between the CESL 112 and between two gate structures (e.g., the gate structures G2 and G4). The material of the cut gate structures 110 may include silicon oxide, silicon nitride, silicon oxynitride, a spin-on dielectric material, or a low-k material. The cut gate structures 110 are referred to as "isolation strips", "shallow trench isolation (STI) regions" or "deep trench isolation (DTI) regions" in some examples.

The semiconductor device further includes an n-type epitaxial layer Epi01 disposed at the first side of the dielectric wall 102, and a p-type epitaxial layer Epi02 disposed at the second side of the dielectric wall 102 in FIG. 1A, and thus CMOS design can be accomplished. In some embodiments, the n-type epitaxial layer Epi01 and the p-type epitaxial layer Epi02 are formed by an epitaxial growth process, such as a molecular beam epitaxy (MBE) process, a metalorganic chemical vapor deposition (MOCVD) process, or the like. In the case, the n-type epitaxial layer Epi01 and the p-type epitaxial layer Epi02 may be epitaxial SiGe layers or epitaxial Si layers.

In some embodiments, the semiconductor device further includes a middle end-of-line (MEOL) structure. For example, an interlayer dielectric (ILD) layer 116 is disposed over the ILD layer 114 and the CESL 112, contacts MD are formed in the ILD layers 114 and 116 for the connection of the n-type epitaxial layer Epi01 and the connection of the p-type epitaxial layer Epi02, respectively. In some embodiments, an etch stop layer 118 is disposed on the contacts MD and the ILD layer 116, another ILD layer 120 is disposed on the etch stop layer 118, and vertical gate contacts VG are formed in the ILD layers 116 and 120 over the recess 106. Due to the presence of the recess 106 at the top 102a/104a of the dielectric wall 102/104, the resistance of the vertical gate contacts VG can be reduced. In addition, even if the vertical gate contacts VG are slightly misaligned, the connection between the vertical gate contacts VG and the gate structures G1-G4 cannot be affected. In some embodiments, the contacts MD are across the dielectric wall 102/104 as shown in FIG. 1B, but the embodiments of the present disclosure are not limited thereto. In other embodiments, the contacts MD are not across the dielectric wall 102/104 but formed in the form of vias on each of the n-type epitaxial layer Epi01 and the p-type epitaxial layer Epi02, respectively.

Among figures of a second embodiment labeled with a figure numeral and an alphabetical suffix, figures with the alphabetical suffix "A" are a top-down view; figures of the second embodiment with the alphabetical suffix "B" are a vertical cross-sectional view along the vertical plane B-B' within the figure with the same figure numeral and the alphabetical suffix "A," figures of the second embodiment with the alphabetical suffix "C" are a vertical cross-sectional view along the vertical plane C-C' within the figure with the same figure numeral and the alphabetical suffix "A." Figures with the same figure numeral and different alphabetical suffices correspond to a same processing step.

Figure 2A:
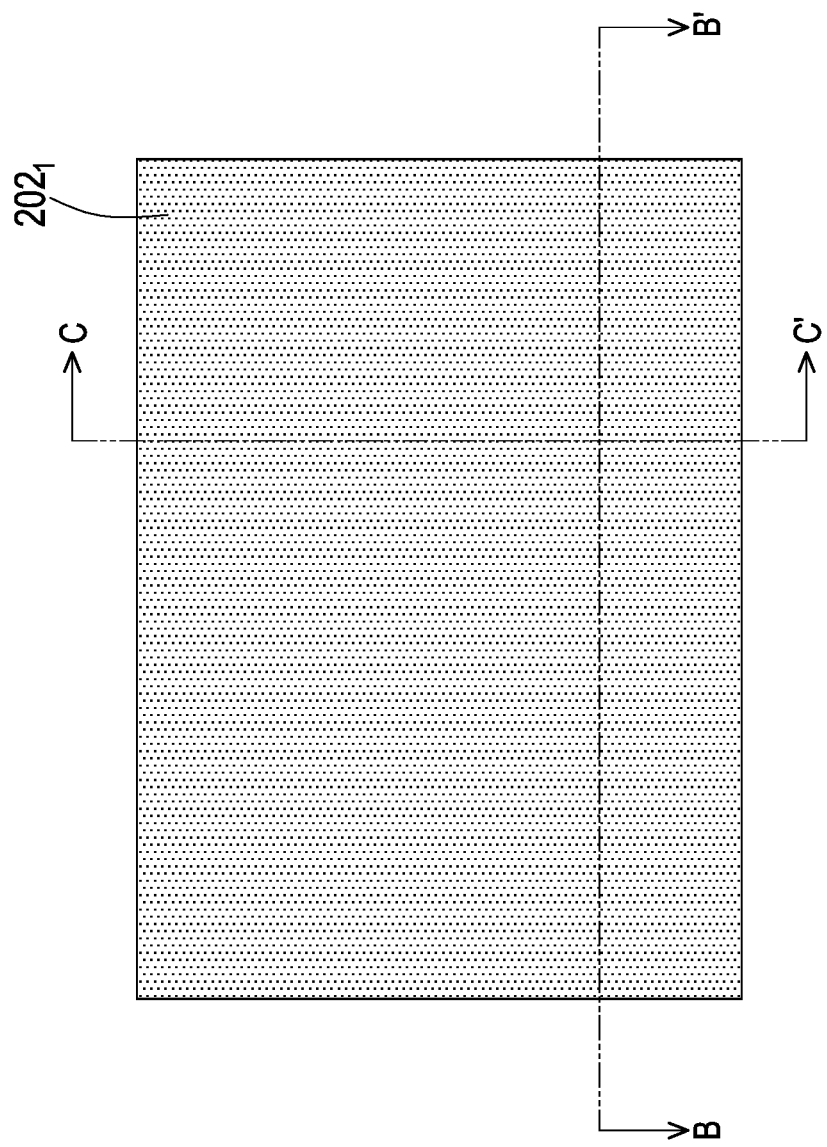
FIGS. 2A-2C are various views of a portion of a semiconductor device after formation of a semiconductor stack according to a second embodiment of the present disclosure.
Figure 2B:
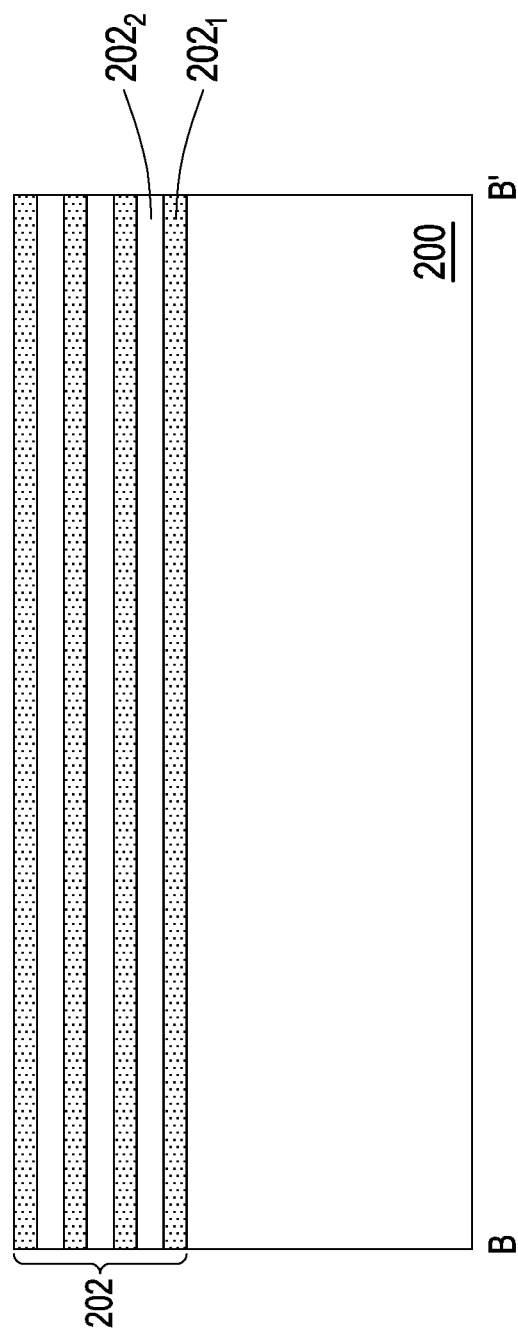
Figure 2C:
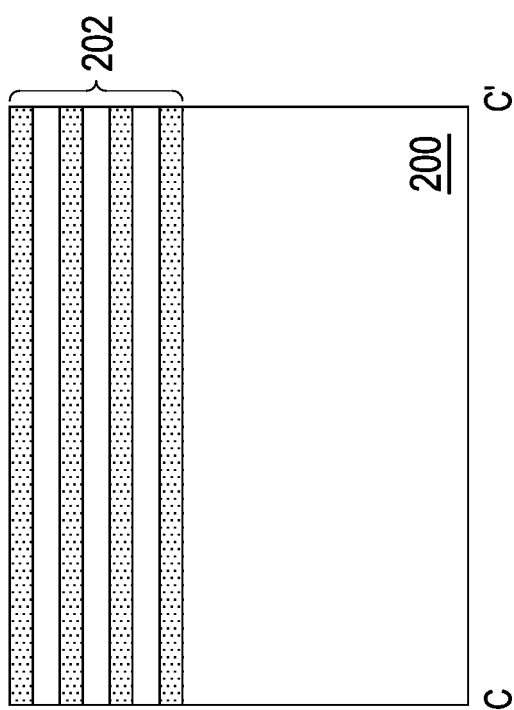

Referring to FIGS. 2A-2C, a semiconductor stack 202 is formed on a substrate 200. The semiconductor stack 202 includes first layers $202_1$ and second layers $202_2$ stacked alternately. The first layers $202_1$ and the second layer $202_2$ include different materials. For example, the semiconductor stack 202 is a superlattice structure. In some embodiments, the second layers $202_2$ are SiGe layers having a germanium percentage in the range between about 15 wt % and 40 wt %, and the first layers $202_1$ are Si layers free of germanium. In other embodiments, either of the first layers $202_1$ and second layers $202_2$ may include other materials such as germanium, a compound semiconductor (e.g., silicon carbide, gallium arsenide, gallium phosphide, indium phosphide, indium arsenide, or indium antimonide), an alloy semiconductor (e.g., SiGe, GaAsP, AlInAs, AlGaAs, InGaAs, GaInP, or GaInAsP), the like, or a combination thereof.

The first layers $202_1$ and the second layers $202_2$ have materials with different etching selectivity. In some embodiments, the first layers $202_1$ and the second layers $202_2$ are formed by an epitaxial growth process, such as a molecular beam epitaxy (MBE) process, a metalorganic chemical vapor deposition (MOCVD) process, or the like. In the case, the first layers $202_1$ are epitaxial Si layers, and the second layers $202_2$ are epitaxial SiGe layers. In some embodiments, the first and second blanket layers 204 and 206 are substantially dopant-free (i.e., having an extrinsic dopant concentration from about 0 $cm^{-3}$ to about $1 \times 10^{17}$ $cm^{-3}$), where for example, no intentional doping is performed during the epitaxial growth process. In other embodiments, the first layers $202_1$ and the second layers $202_2$ are formed by a suitable deposition, such as chemical vapor deposition (CVD), atomic layer deposition (ALD), or the like. In the case, the first layers $202_1$ are poly-Si layers, and the second layers $202_2$ are poly-SiGe layers.

Figure 3A:
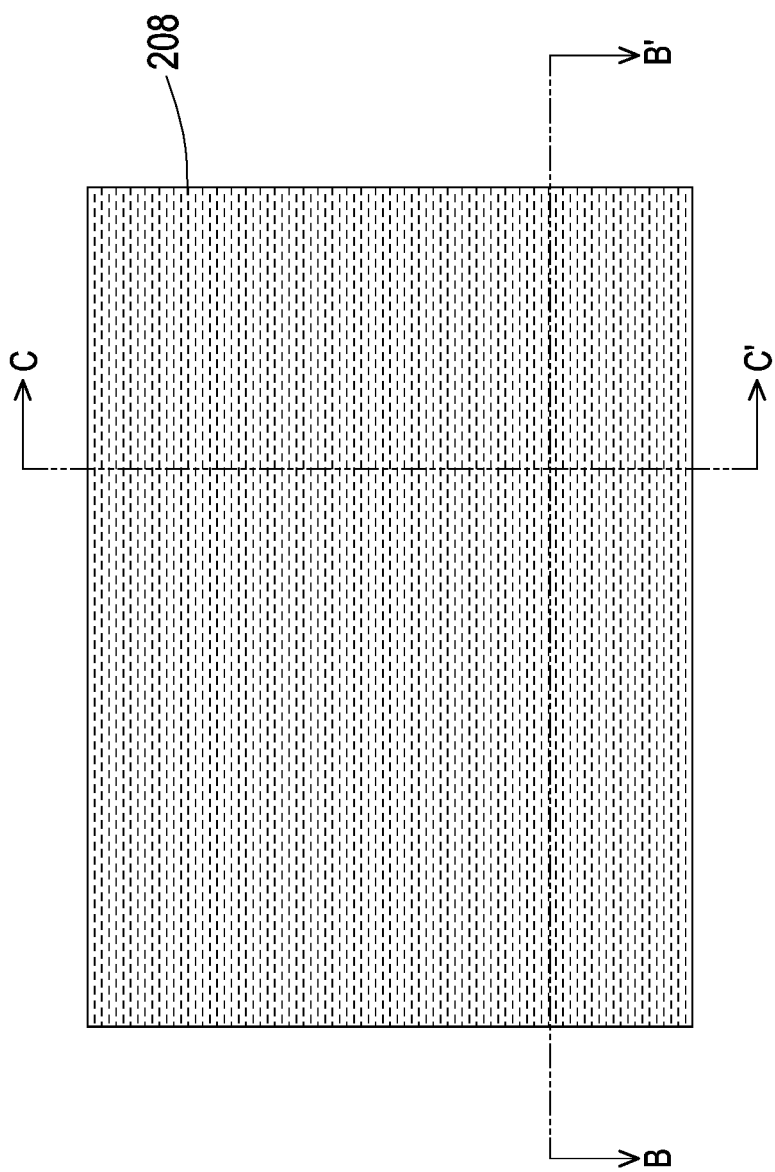
FIGS. 3A-3C are various views of a portion of a semiconductor device after formation of multilayer structure according to the second embodiment of the present disclosure.
Figure 3B:
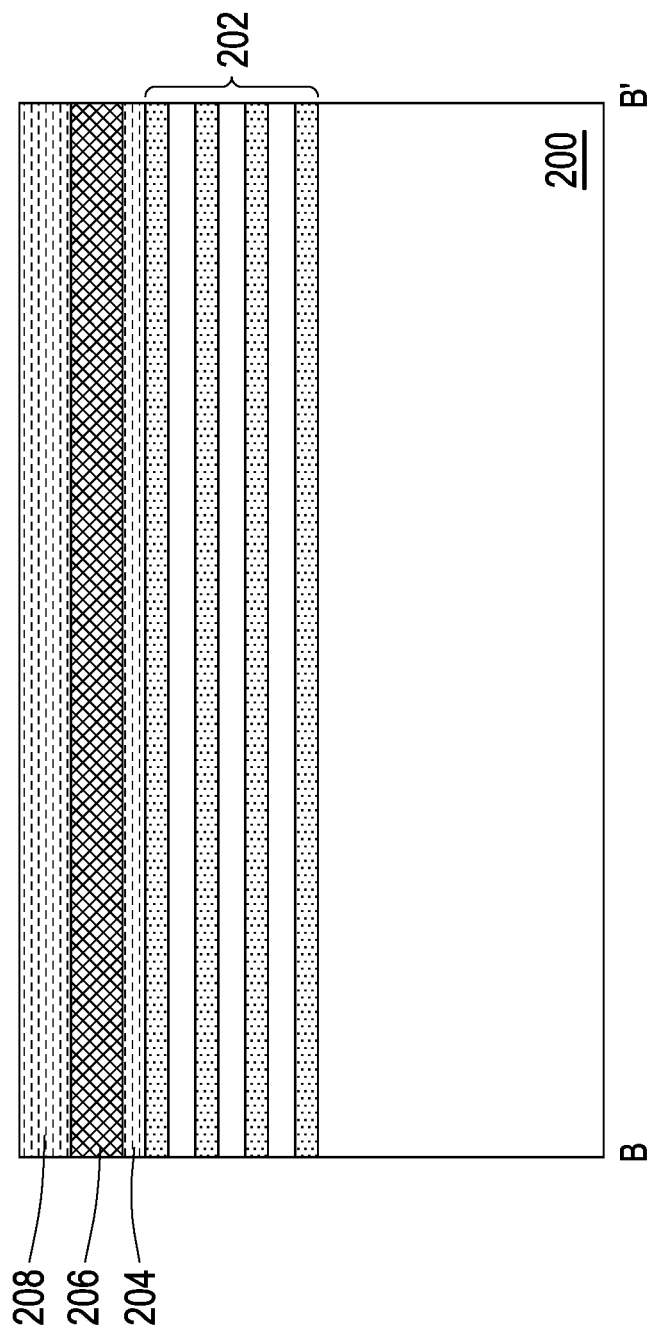
Figure 3C:
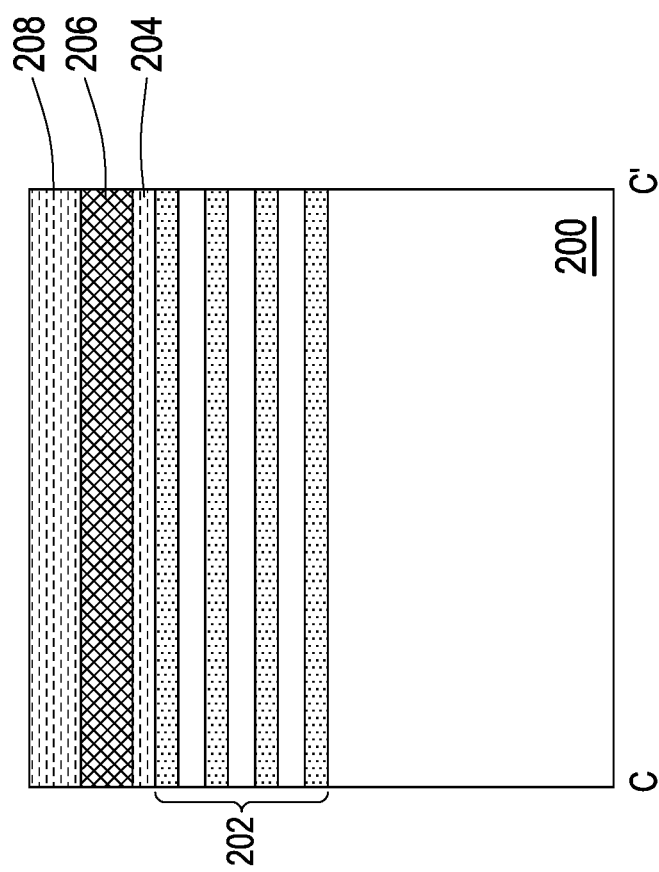

Referring to FIGS. 3A-3C, a multilayer structure is formed on the semiconductor stack 202. The multilayer structure may include a dielectric material 204, a first mask layer 206, and a second mask layer 208. The dielectric material 204 is, for example, silicon oxide, silicon nitride, SiON, SiC, SiCN, SiCON, the like, or a combination thereof. Other materials such as a low-k material may be applicable. The low-k material has a dielectric constant less than 3.9, less than 3, less than 2.5, or even less. For example, the first mask layer 206 formed on the dielectric material 204 is a pad oxide layer made of a silicon oxide, which may be formed by a thermal oxidation. The second mask layer 208 formed on the first mask layer 206 is made of a silicon nitride (SiN), which is formed by chemical vapor deposition (CVD), low pressure CVD (LPCVD), plasma enhanced CVD (PECVD), physical vapor deposition (PVD), atomic layer deposition (ALD), or a suitable process.

Figure 4A:
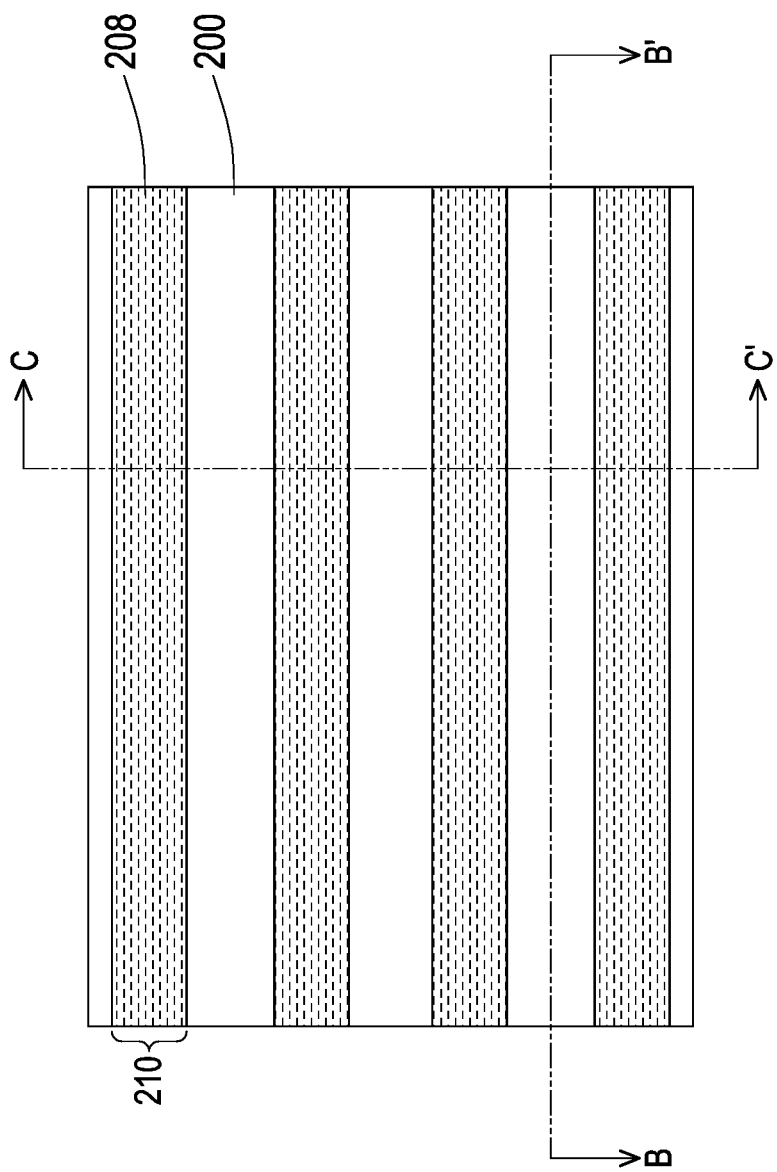
FIGS. 4A-4C are various views of a portion of a semiconductor device after formation of semiconductor strips according to the second embodiment of the present disclosure.
Figure 4B:
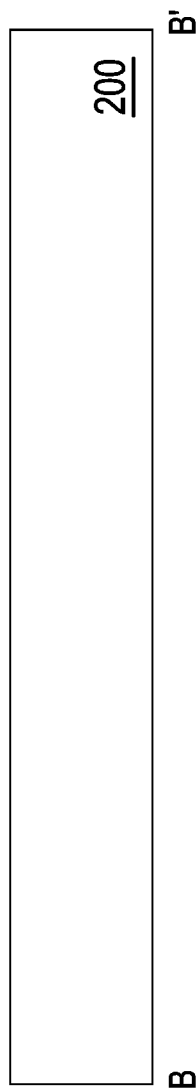
Figure 4C:
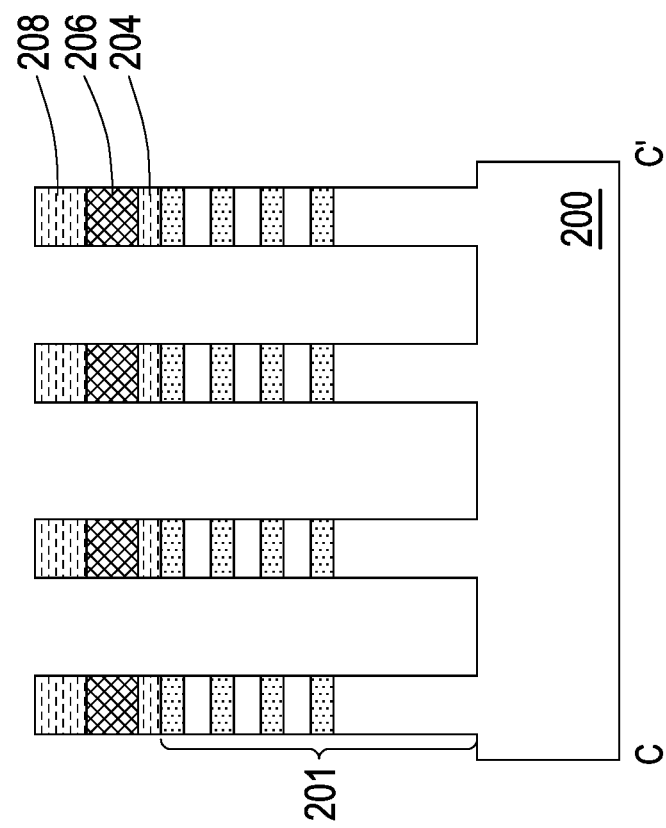

Referring to FIGS. 4A-4C, a plurality of semiconductor strips 210 is formed, and the steps include, for example, patterning the second mask layer 208, etching the first mask layer 206 and the dielectric material 204 using the patterned second mask layer 208 as an etching mask, and then etching the semiconductor stack 202 using the first mask layer 206 as an etching mask. The patterning process includes an etching process, such as a dry etching or the like.

Figure 5A:
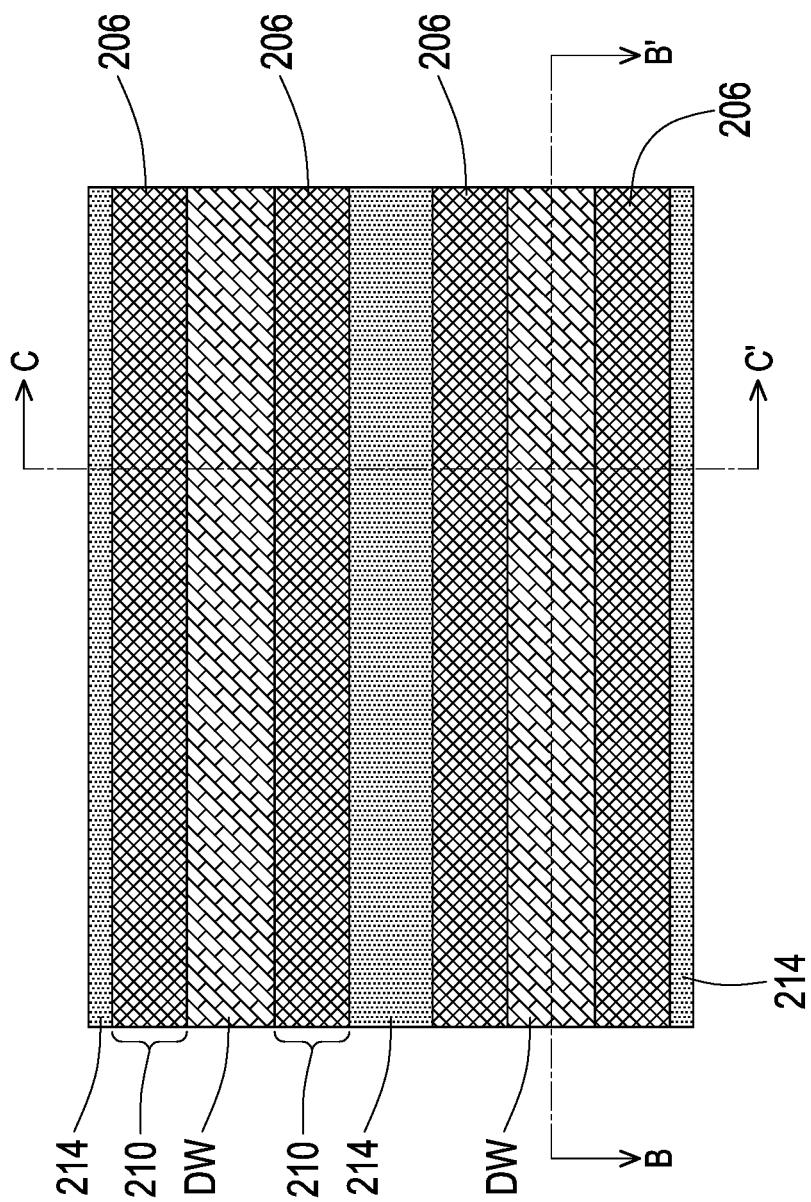
FIGS. 5A-5C are various views of a portion of a semiconductor device after formation of dielectric walls according to the second embodiment of the present disclosure.
Figure 5B:
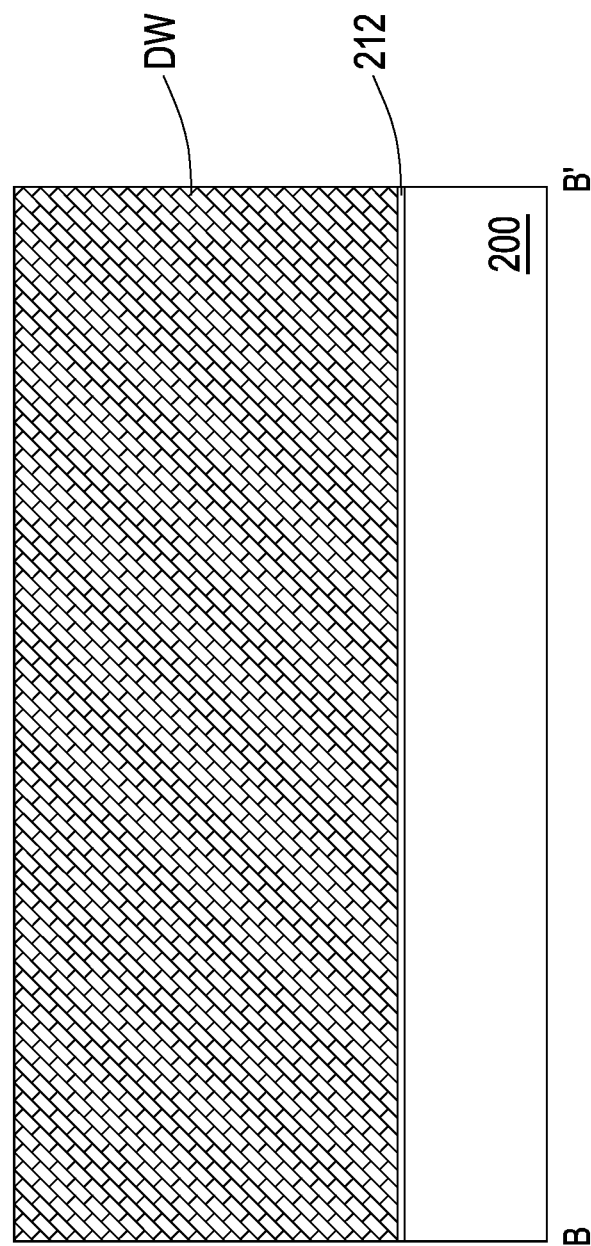
Figure 5C:
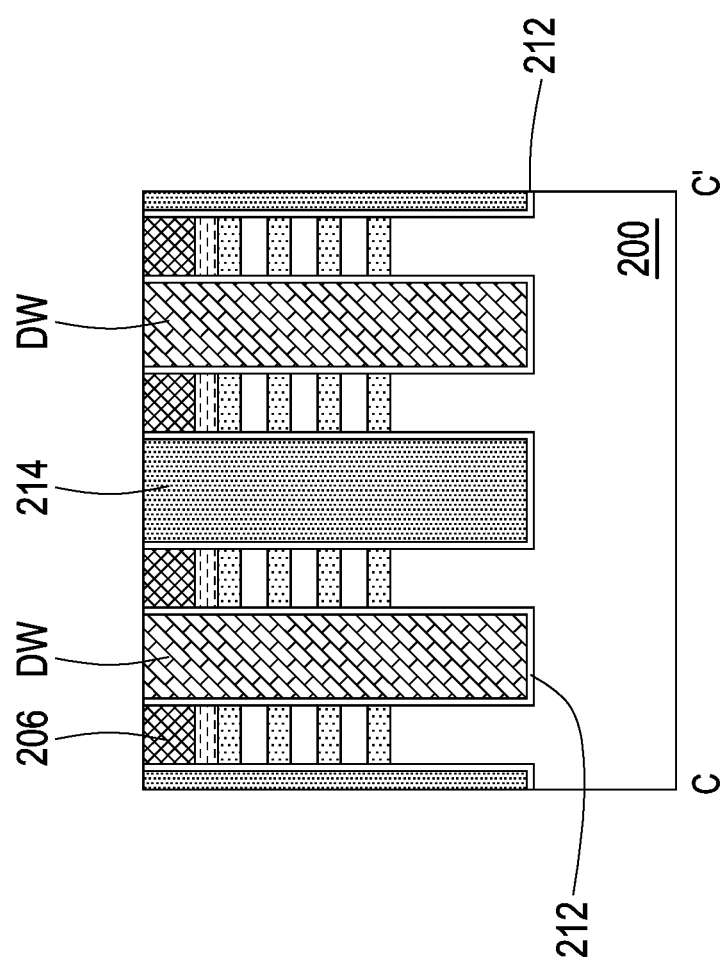

Referring to FIGS. 5A-5C, a plurality of dielectric walls DW is formed between two of the semiconductor strips 210, and before or after the formation of the dielectric walls DW, a plurality of insulating regions 214 is formed between other two of the semiconductor strips 210. In some embodiments, the dielectric walls DW and the insulating regions 214 are different materials, and they may be formed by flowable chemical vapor deposition (FCVD), high-density-plasma chemical vapor deposition (HDP-CVD), sub-atmospheric CVD (SACVD), or spin-on process. The material of the dielectric walls DW may include silicon nitride, SiCN, or a high-k material. Examples of the high-k material include metal oxide, such as $HfO_2$, HfSiO, HfSiON, HfTaO, HfSiO, HfZrO, zirconium oxide, aluminum oxide, titanium oxide, hafnium dioxide-alumina ($HfO_2$—$Al_2O_3$) alloy, the like, or combinations thereof. The high-k material has a dielectric constant less than 8, less than 15, less than 20, or even more. A planarization process may be performed to remove the second mask layer 208, and a portion of the dielectric walls DW and the insulating regions 214. In the case, as shown in FIG. 5C, the top surfaces of the dielectric walls DW are substantially coplanar with the top surfaces of the insulating regions 214. In some embodiments, the planarization process includes a chemical mechanical polish (CMP), an etching back process, the like, or a combination thereof.

Figure 6A:
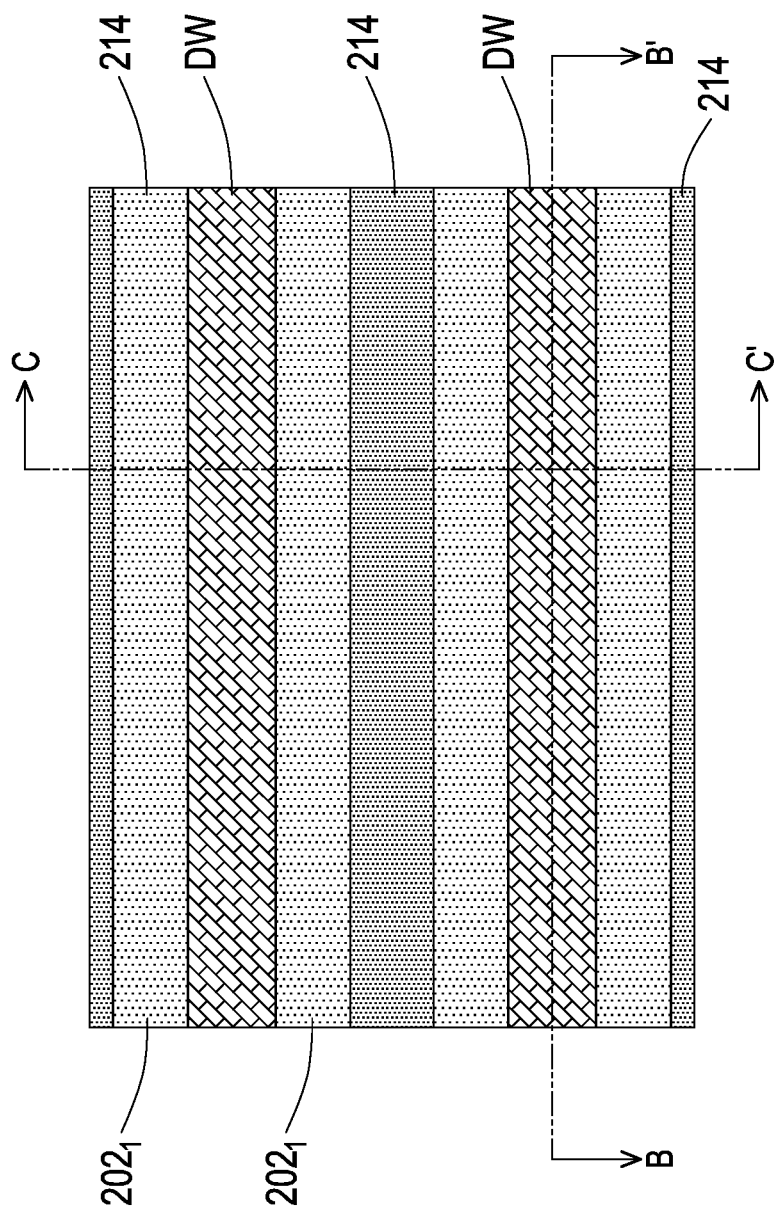
FIGS. 6A-6C are various views of a portion of a semiconductor device after nanosheet mesa recess step according to the second embodiment of the present disclosure.
Figure 6B:
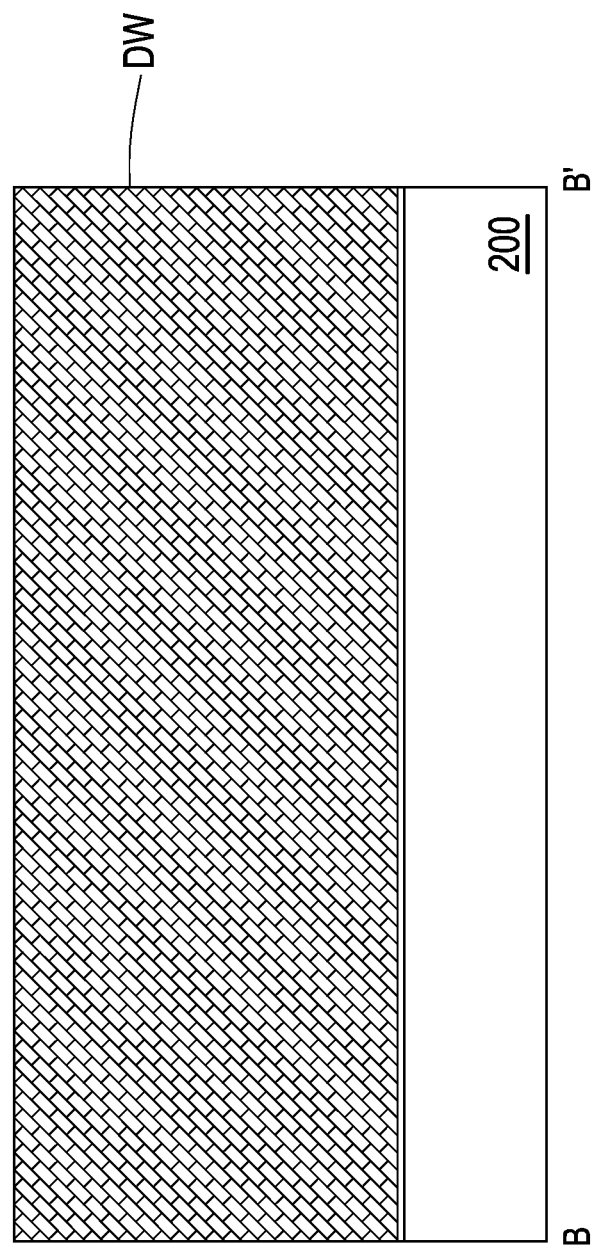
Figure 6C:
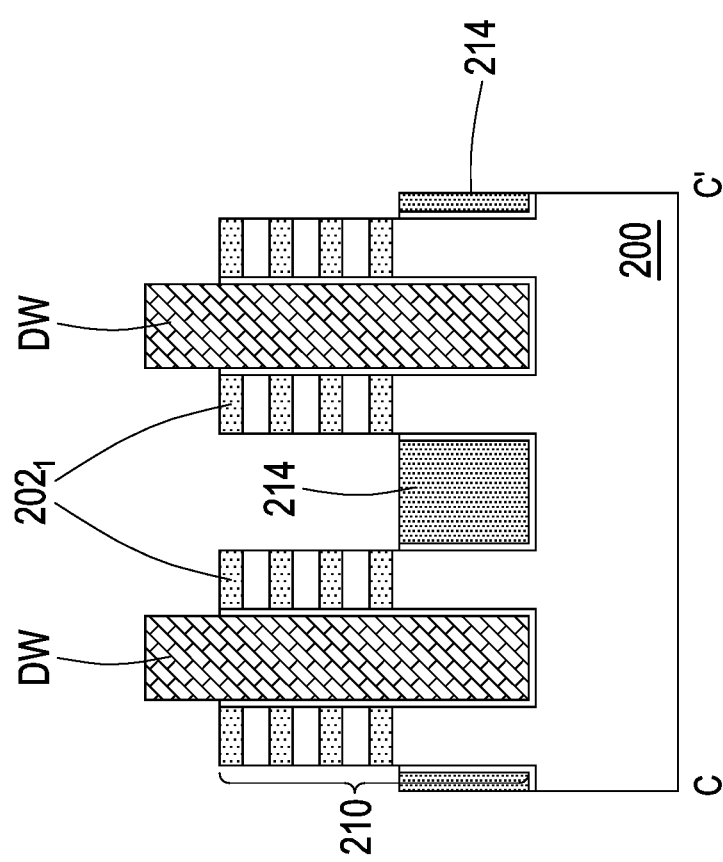

Referring to FIGS. 6A-6C, a nanosheet mesa recess step is performed, until the semiconductor strips 210 protrude from top surfaces of the remaining insulating regions 214. Specifically, after the nanosheet mesa recess step, the top surfaces of the insulating regions 214 are lower than the top surfaces of the semiconductor strips 210. In some embodiments, the insulating regions 214 are etched back until the semiconductor strips 210 are exposed while the dielectric walls DW are protected by a protection layer (not shown), and the etching process is, for example, a wet etching process with hydrofluoric acid (HF), a dry etching process, or a combination thereof. In some embodiments, the multilayer structure (i.e., the nitride layer 206 and the oxide layer 204) is removed.

Figure 7A:
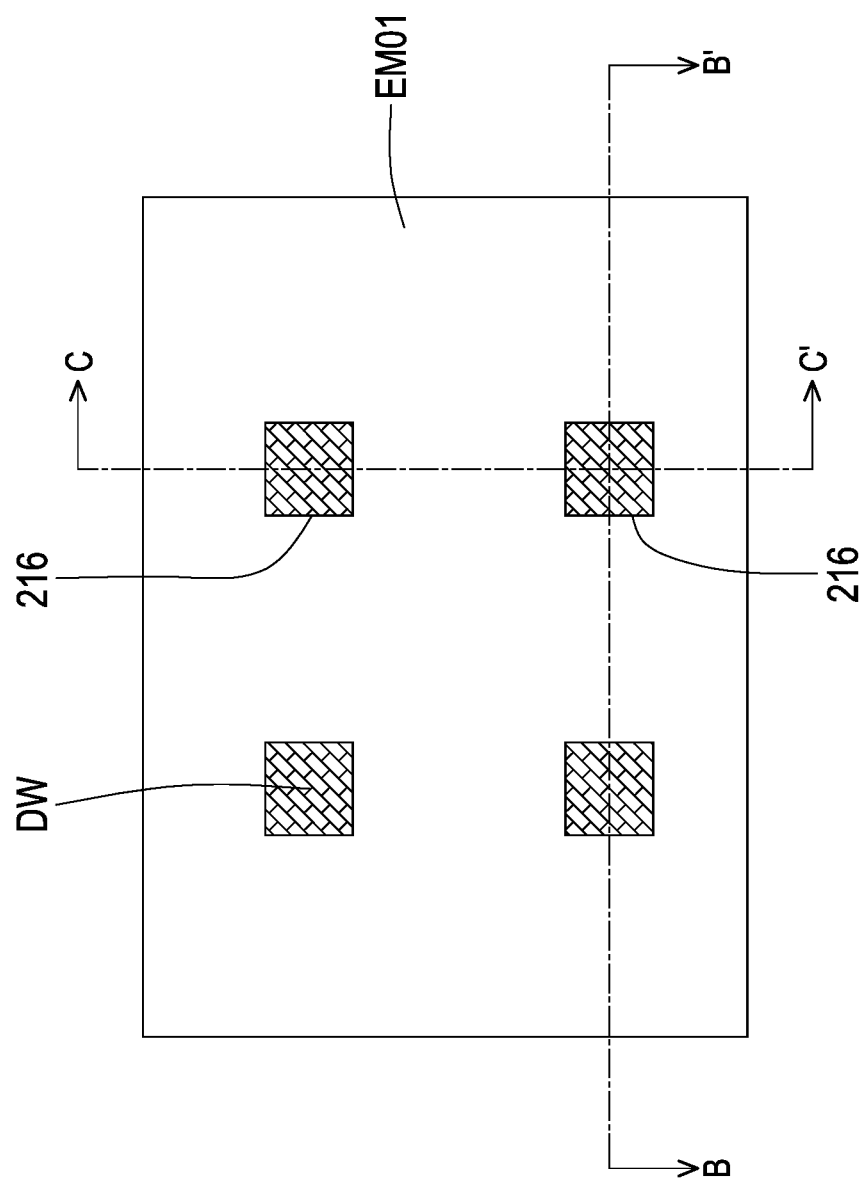
FIGS. 7A-7C are various views of a portion of a semiconductor device after formation of patterned mask according to the second embodiment of the present disclosure.
Figure 7B:
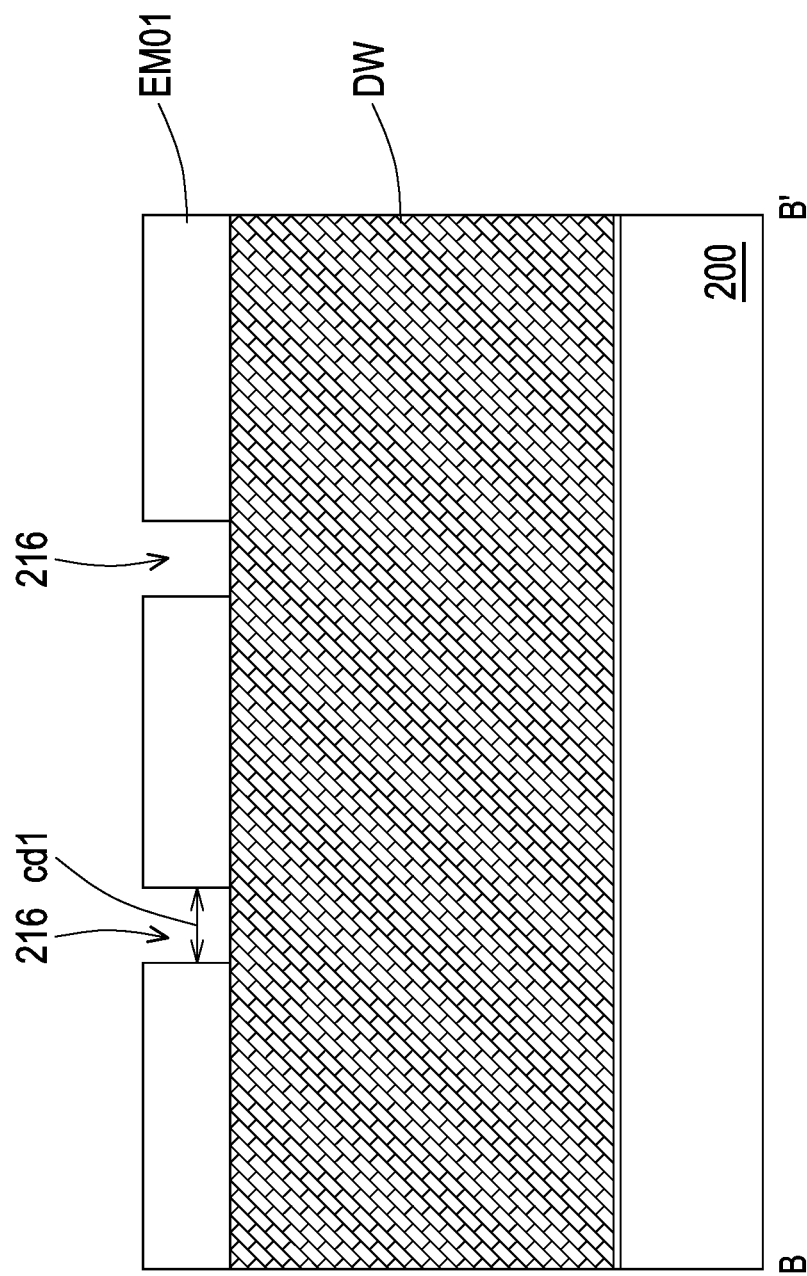
Figure 7C:
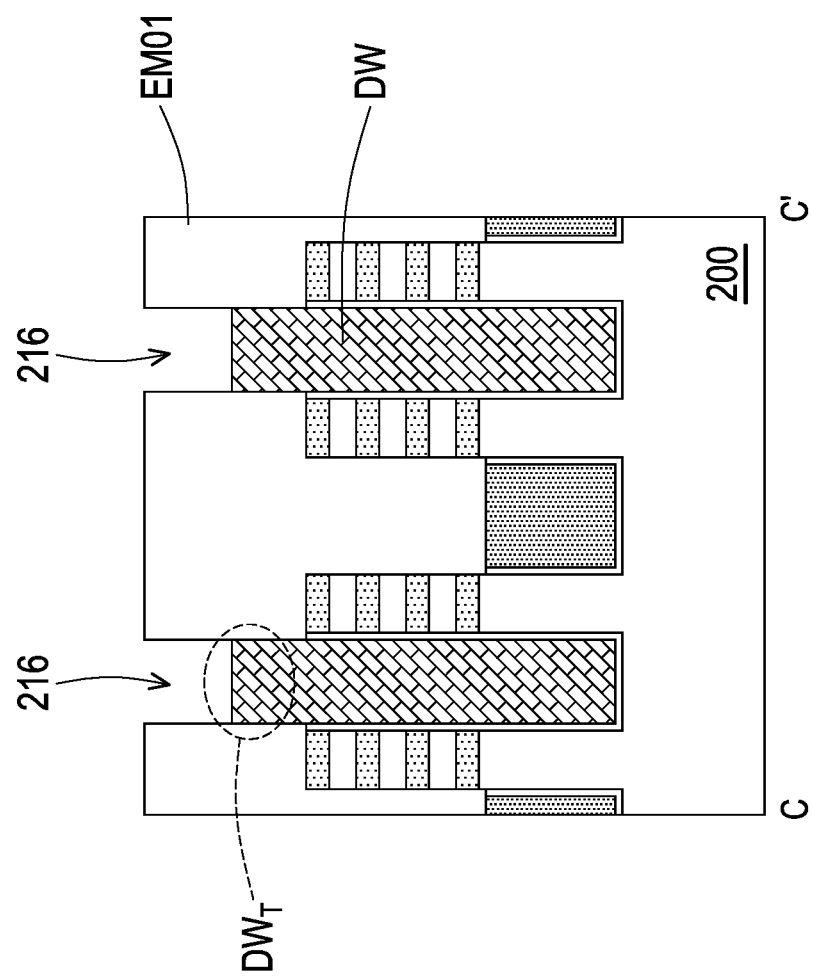

Referring to FIGS. 7A-7C, a first patterned mask EM01 is formed on the substrate 200, wherein a plurality of openings 216 is within the first patterned mask EM01 in order to expose the dielectric walls DW. In some embodiments, the dimension cd1 of the opening 216 is more than 12 nm and 18 nm or less. The steps of forming the first patterned mask EM01 may includes coating a photoresist layer (not shown) over the insulating layer 214, the dielectric walls DW and the semiconductor strips 210, and then lithographically patterning the photoresist layer to form the first patterned mask EM01 with the openings 216.

Figure 8A:
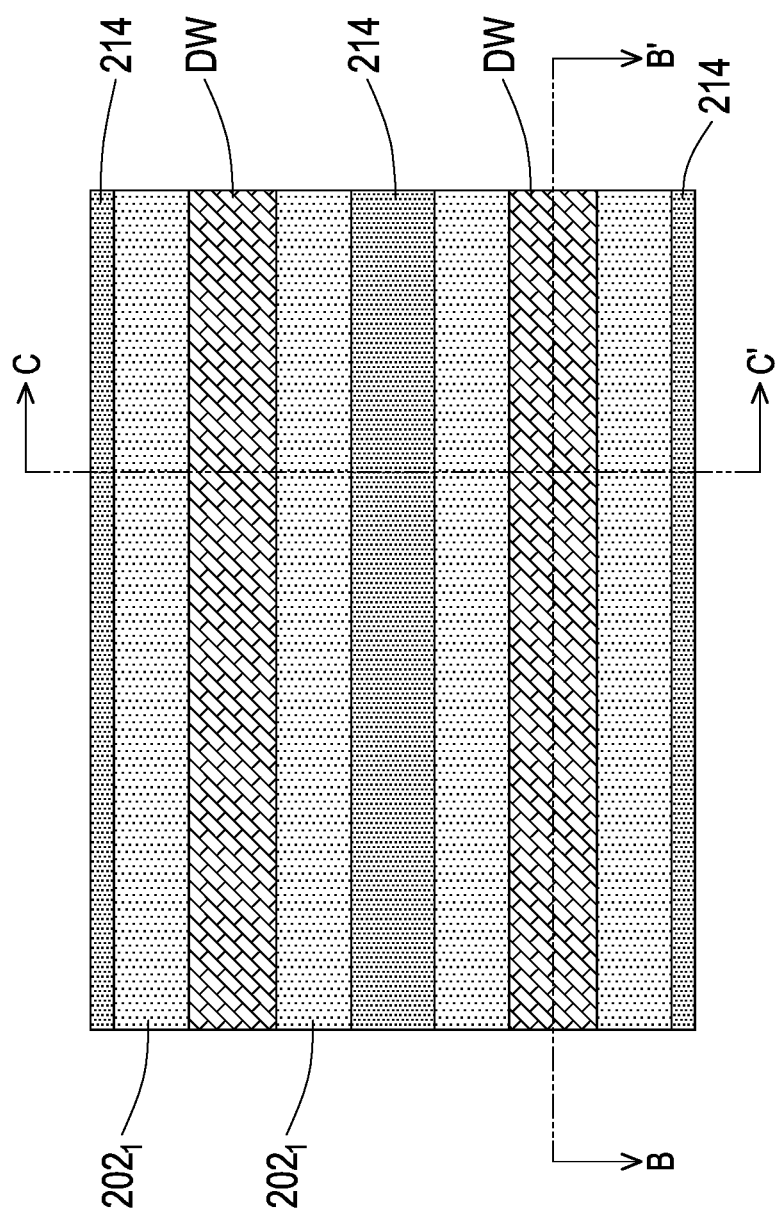
FIGS. 8A-8C are various views of a portion of a semiconductor device after etching the dielectric walls according to the second embodiment of the present disclosure.
Figure 8B:
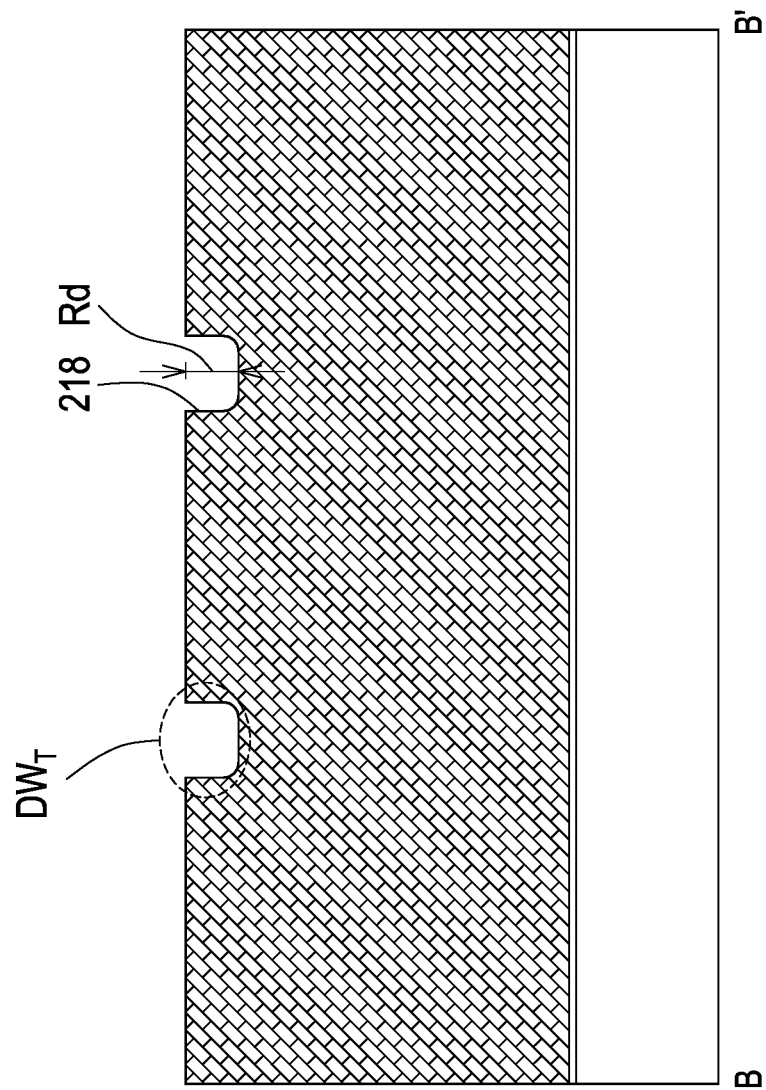
Figure 8C:
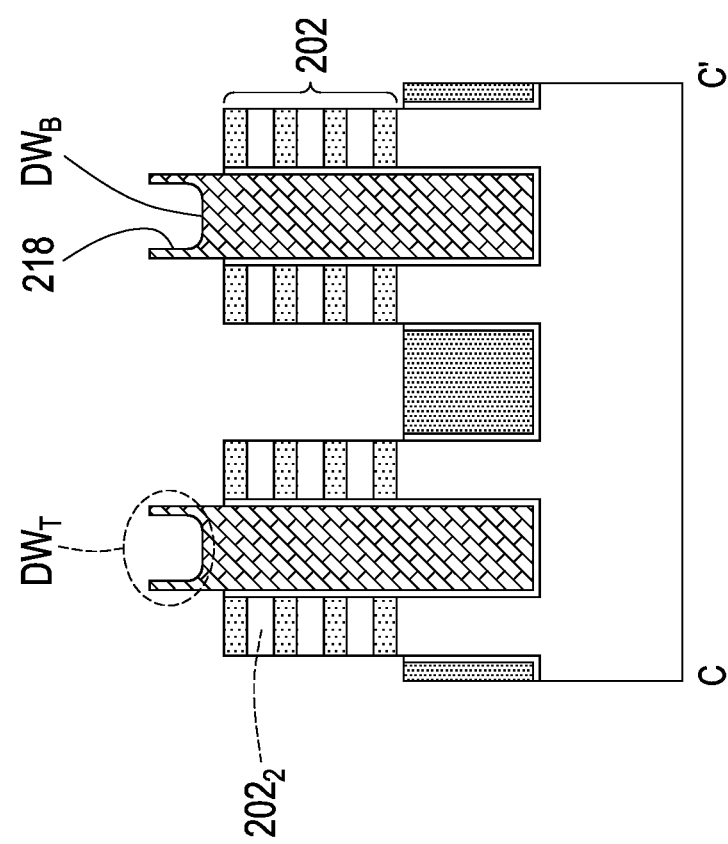

Referring to FIGS. 8A-8C, the dielectric walls DW are etched using the first patterned mask EM01 as an etching mask. The openings 216 in the first patterned mask EM01 may be transferred at least into the top $DW_T$ of each of the dielectric walls DW to form a recess 218 in the dielectric walls DW by performing an anisotropic etch process, wherein an etchant for the anisotropic etch process may include $CF_4$, $NF_3$, Cl like gas, or a combination thereof. The bottom surfaces DW B of the dielectric walls DW may be higher than the top surfaces of the semiconductor strips 210. In some embodiments, a recess depth Rd of the recess 218 is 5 nm to 20 nm, although lesser and greater recess depth may also be used. The first patterned mask EM01 is removed after the formation of the recesses 218.

Figure 9A:
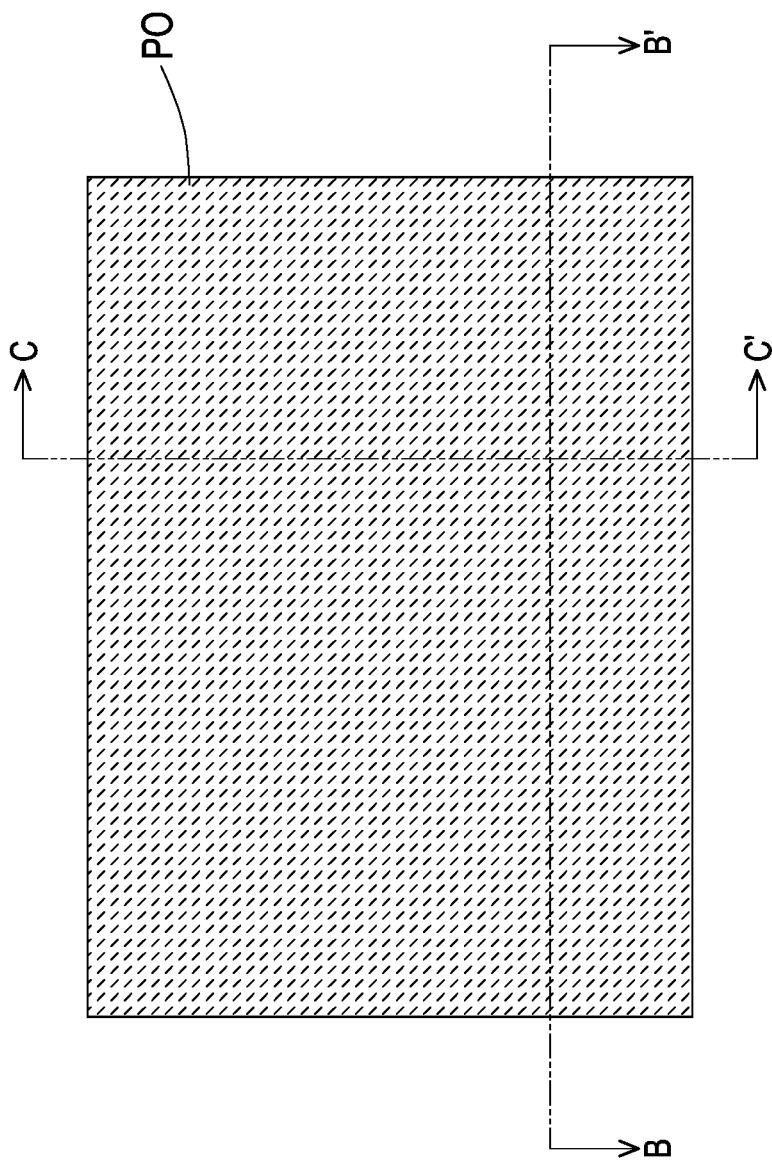
FIGS. 9A-9C are various views of a portion of a semiconductor device after formation of a dummy gate structure according to the second embodiment of the present disclosure.
Figure 9B:
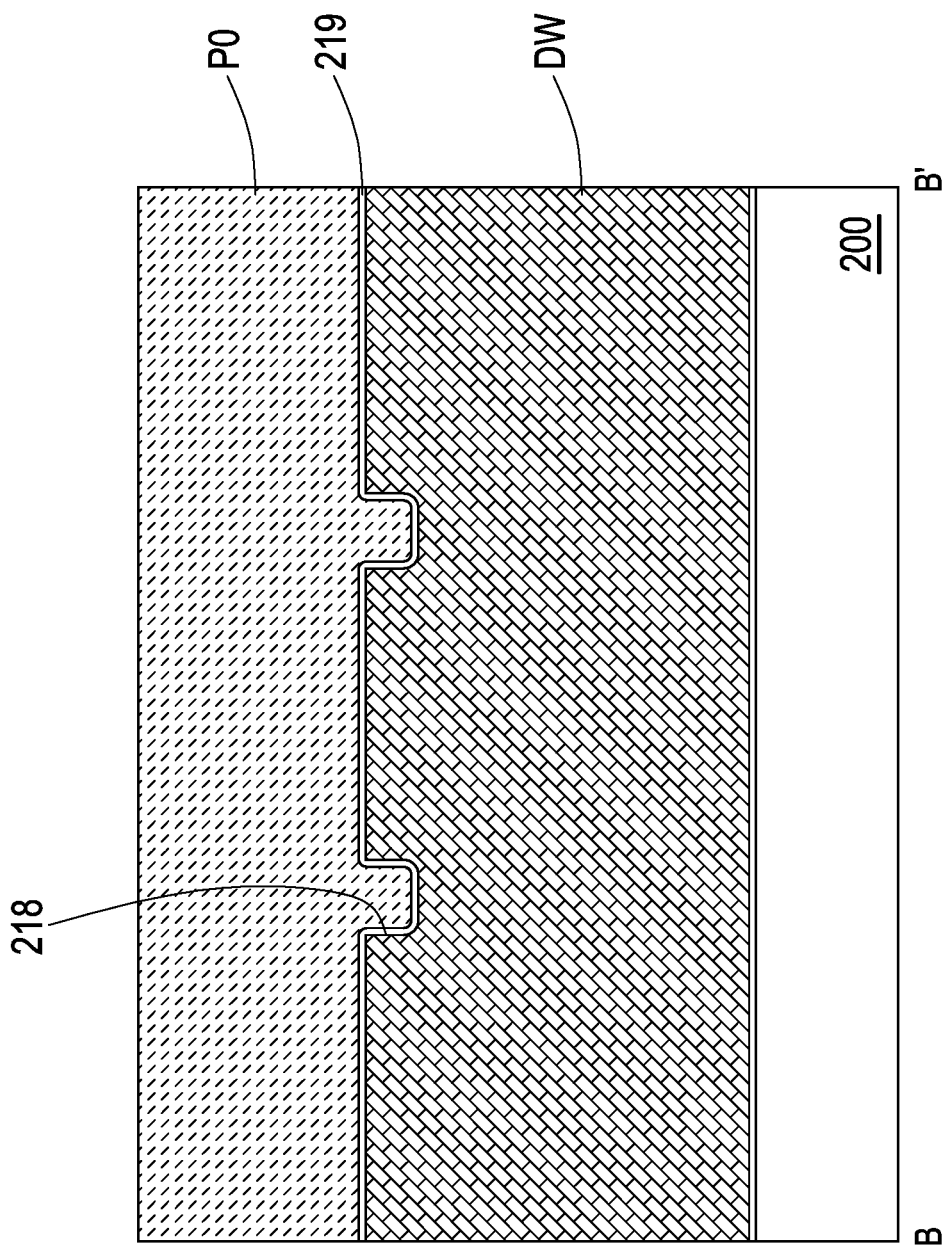
Figure 9C:
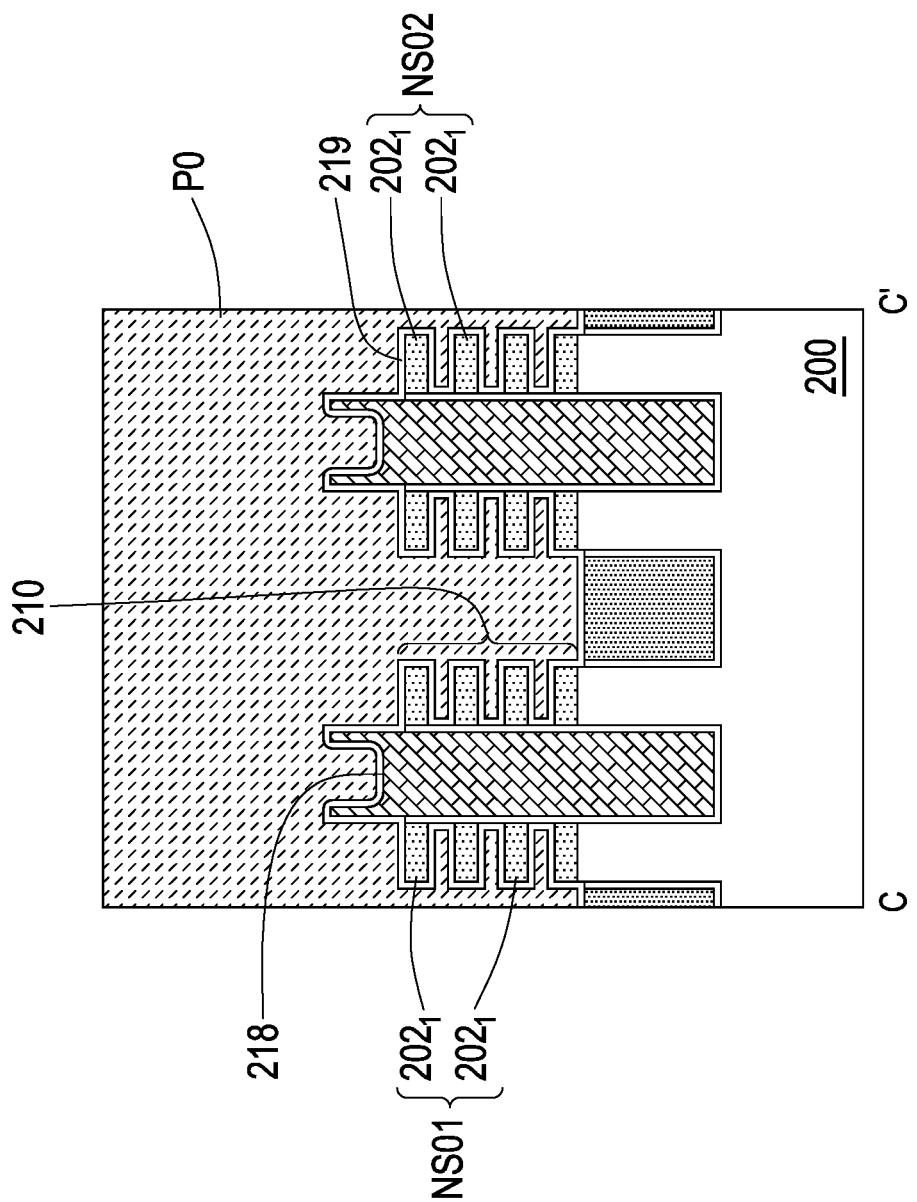

Referring to FIGS. 9A-9C, stacks of semiconductor nanosheets (e.g., NS01-NS02) are formed by removing the second layers $202_2$. In some embodiments, an etching process is performed to remove the second layers $202_2$. In the case, the second layers $202_2$ may be completely removed to form gaps between the first layers $202_1$. Accordingly, the first layers $202_1$ are separated from each other by the gaps. As a result, the first layers $202_1$ are suspended. A dummy gate structure is then formed. In some embodiments, the dummy gate structure includes a dielectric layer 219 conformally deposited on the dielectric walls DW, the stacks of semiconductor nanosheets (e.g., NS01-NS02), and the insulating regions 214 and a thick polysilicon layer PO formed on the dielectric layer 219. The dielectric layer 219 and the polysilicon layer PO are deposited using CVD, LPCVD, PECVD, PVD, ALD, or a suitable process.

Figure 10A:
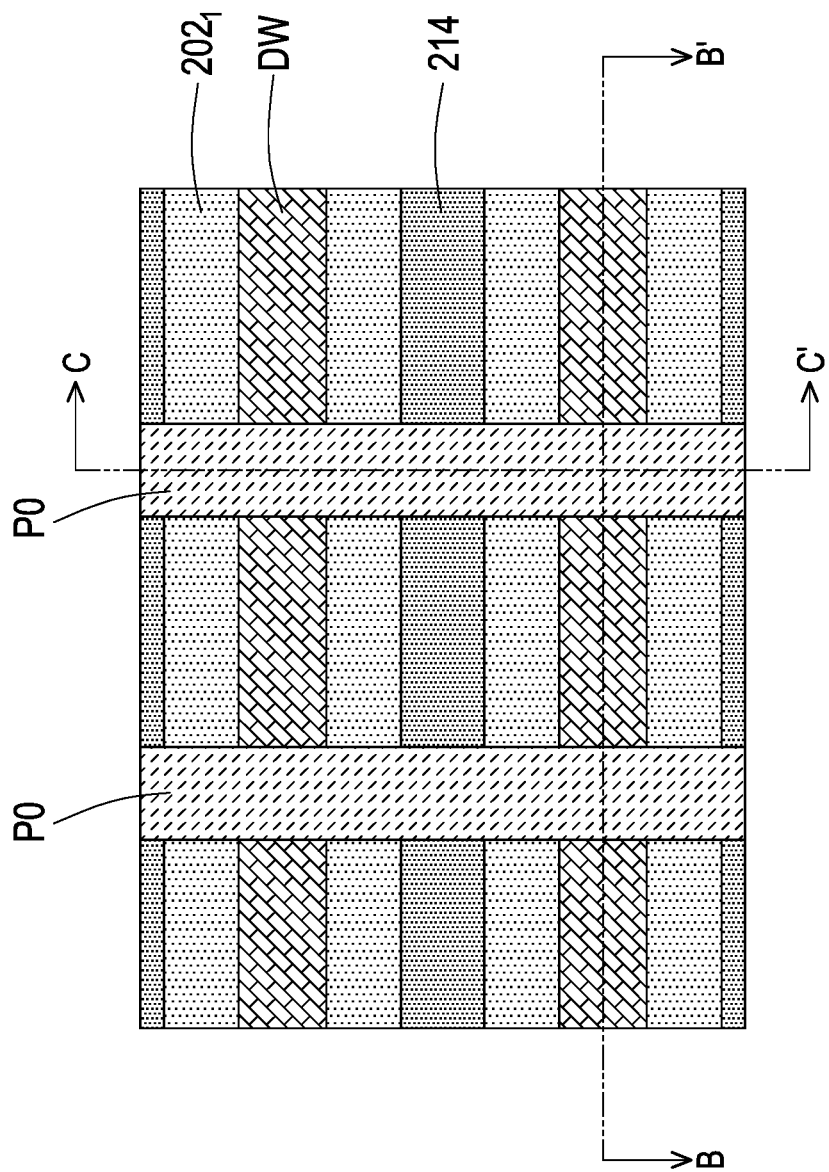
FIGS. 10A-10C are various views of a portion of a semiconductor device after patterning the dummy gate structure according to the second embodiment of the present disclosure.
Figure 10B:
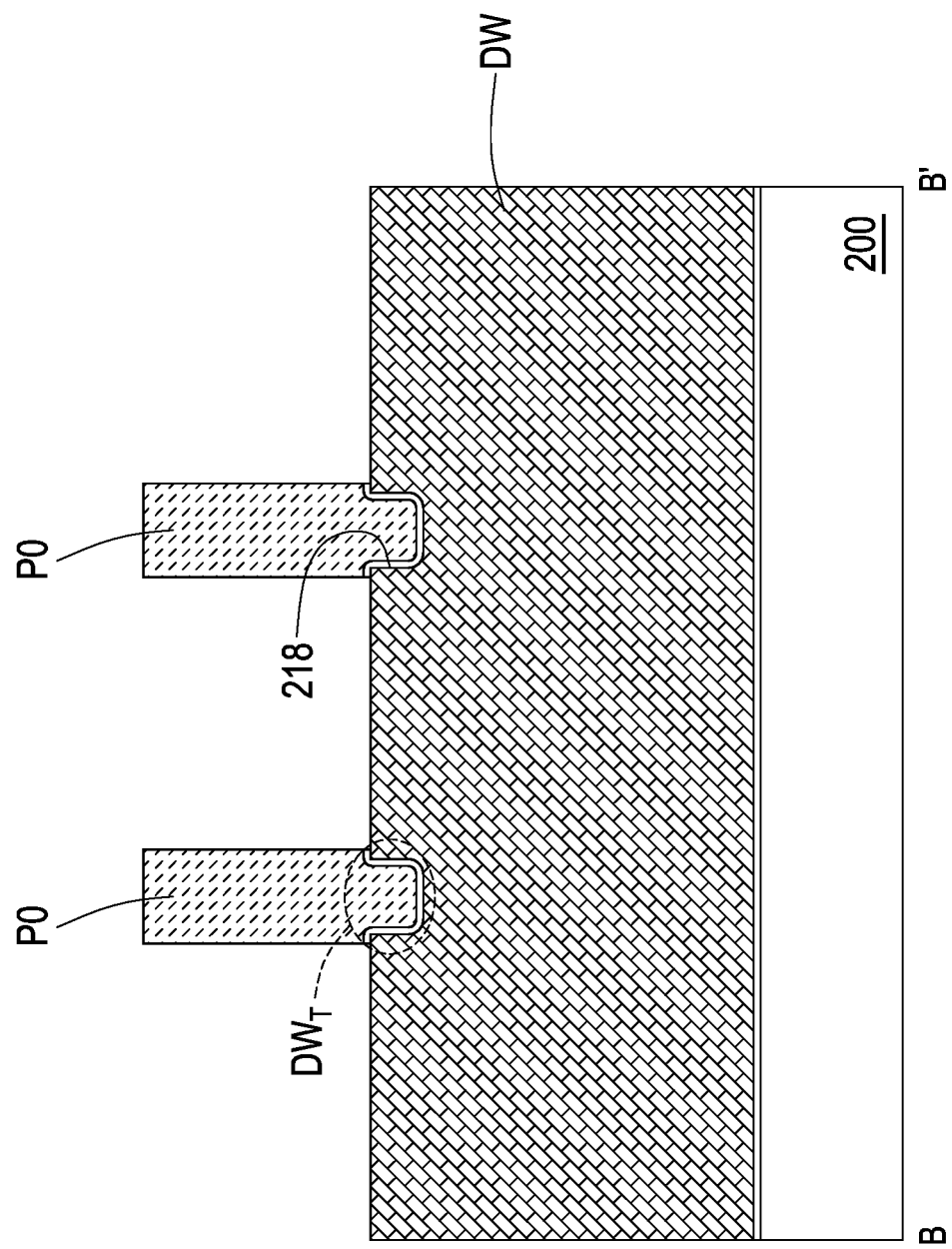
Figure 10C:
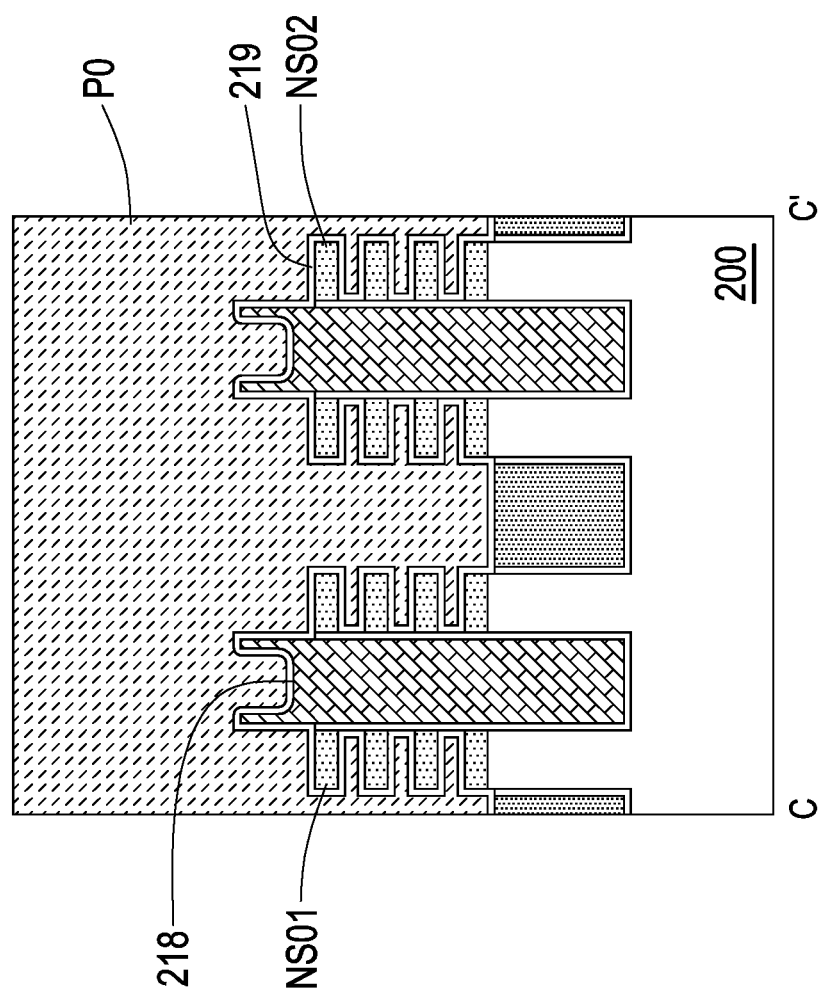

Referring to FIGS. 10A-10C, the dummy gate structure (i.e., the polysilicon layer PO and the dielectric layer 219) is patterned, and the patterned dummy gate structure has an extending direction perpendicular to the extending direction of the dielectric walls DW, for instance.

Figure 11A:
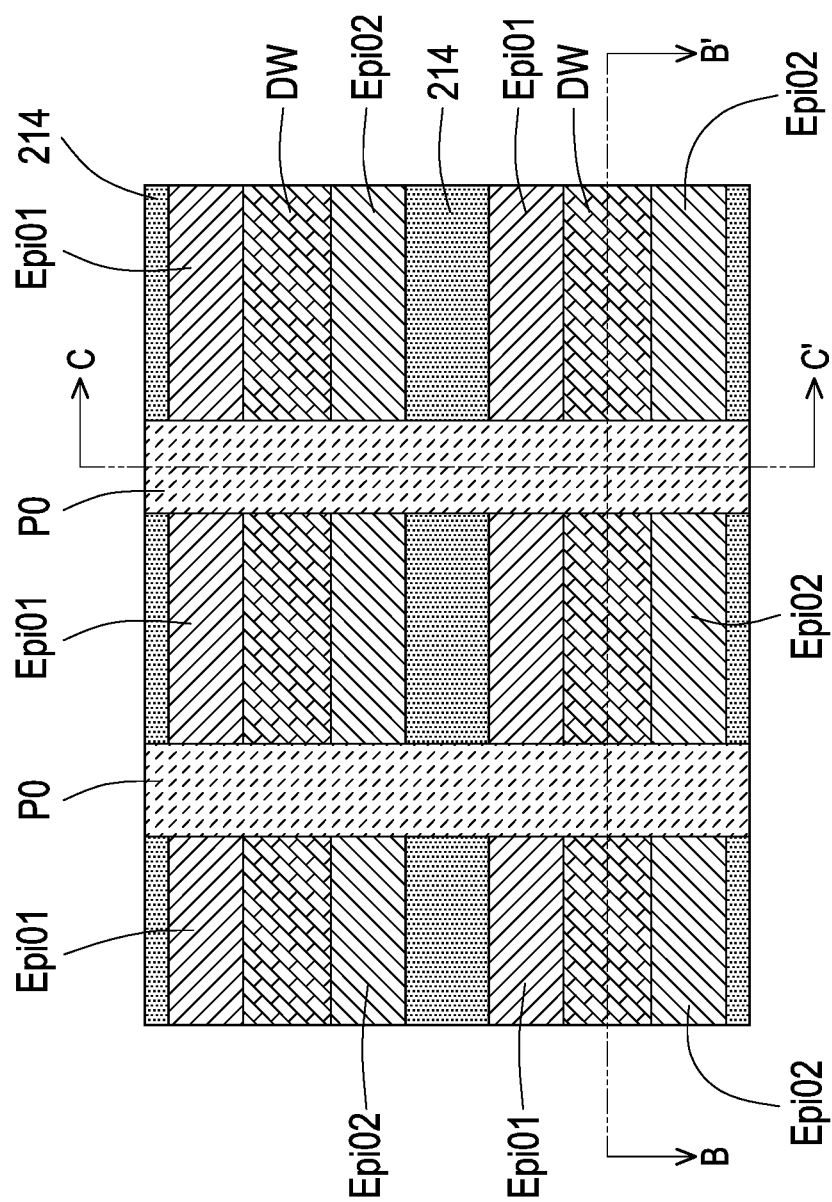
FIGS. 11A-11C are various views of a portion of a semiconductor device after formation of epitaxial layers according to the second embodiment of the present disclosure.
Figure 11B:
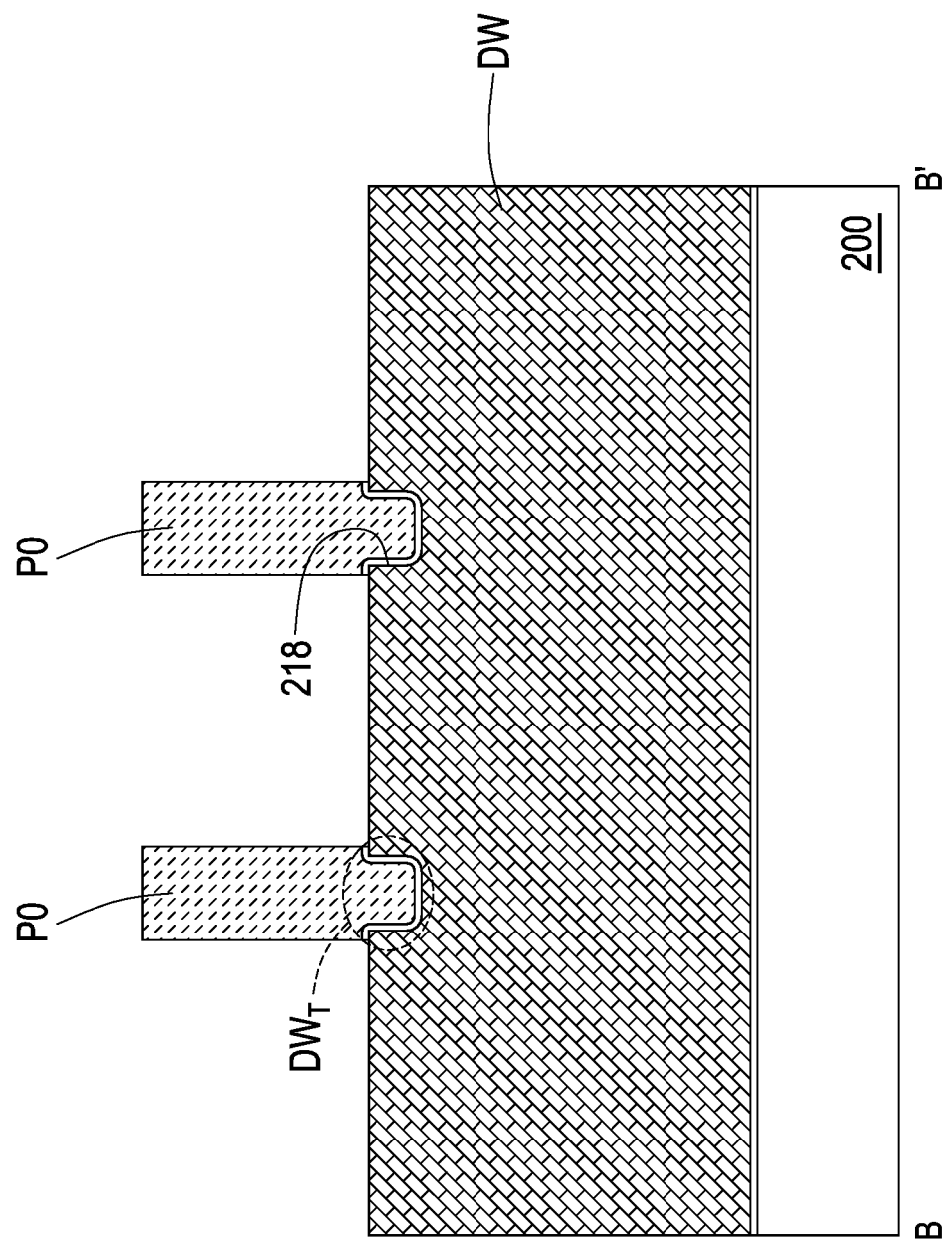
Figure 11C:
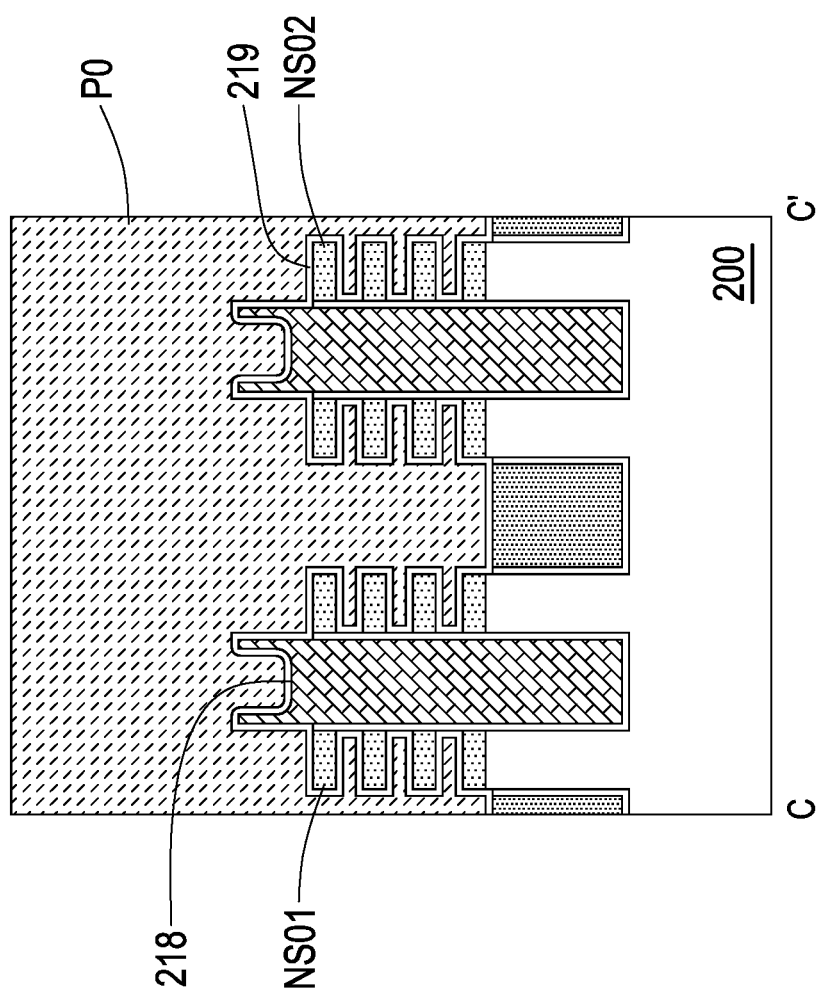

Referring to FIGS. 11A-11C, epitaxial layers (i.e., n-type epitaxial layers Epi01 and p-type epitaxial layers Epi02) are formed, and the steps include, for example, etching the stacks of semiconductor nanosheets (e.g., NS01-NS02) using the dielectric walls DW as an etching mask, and then performing an epitaxial growth process to form the n-type epitaxial layer Epi01 and the p-type epitaxial layer Epi02 at two sides of the dielectric walls DW, respectively. In some embodiments, the epitaxial growth process is, for example, a molecular beam epitaxy (MBE) process, a metalorganic chemical vapor deposition (MOCVD) process, or the like.

Figure 12A:
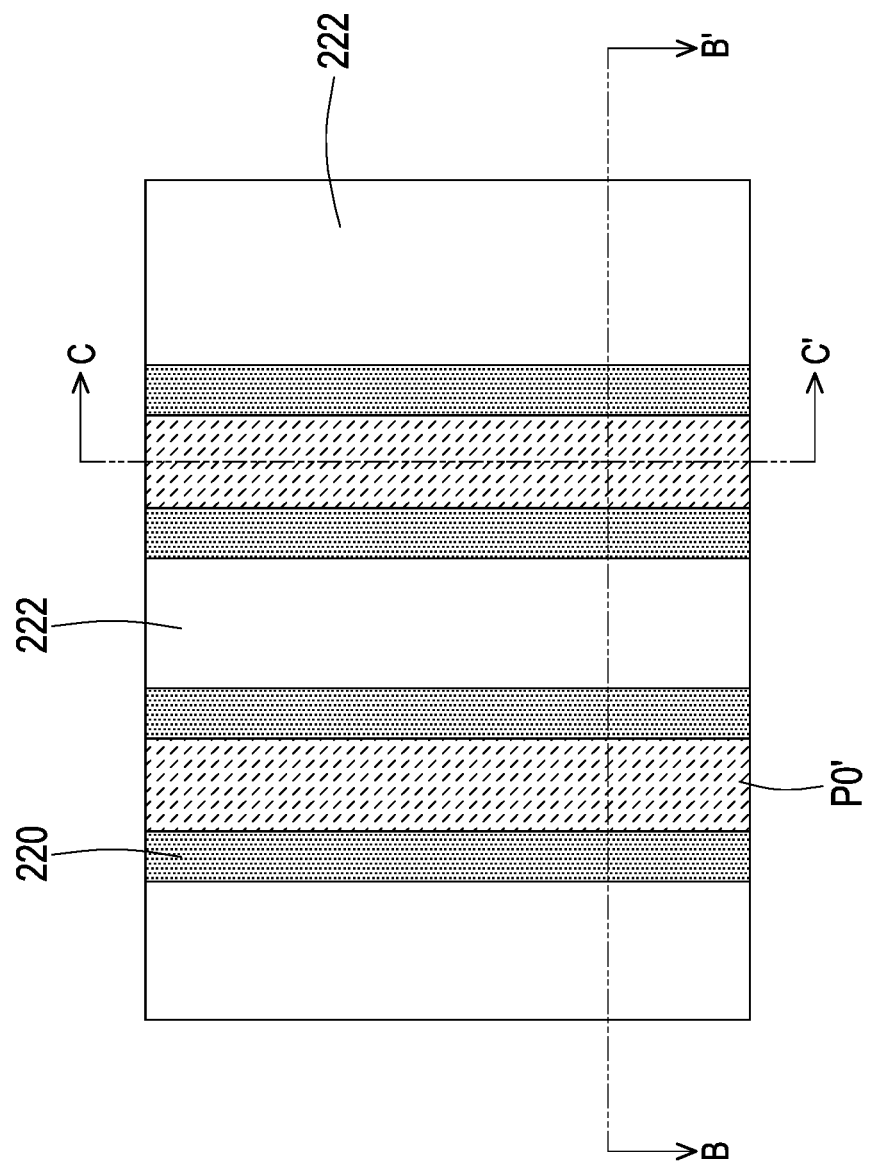
FIGS. 12A-12C are various views of a portion of a semiconductor device after formation of inter layer dielectric according to the second embodiment of the present disclosure.
Figure 12B:
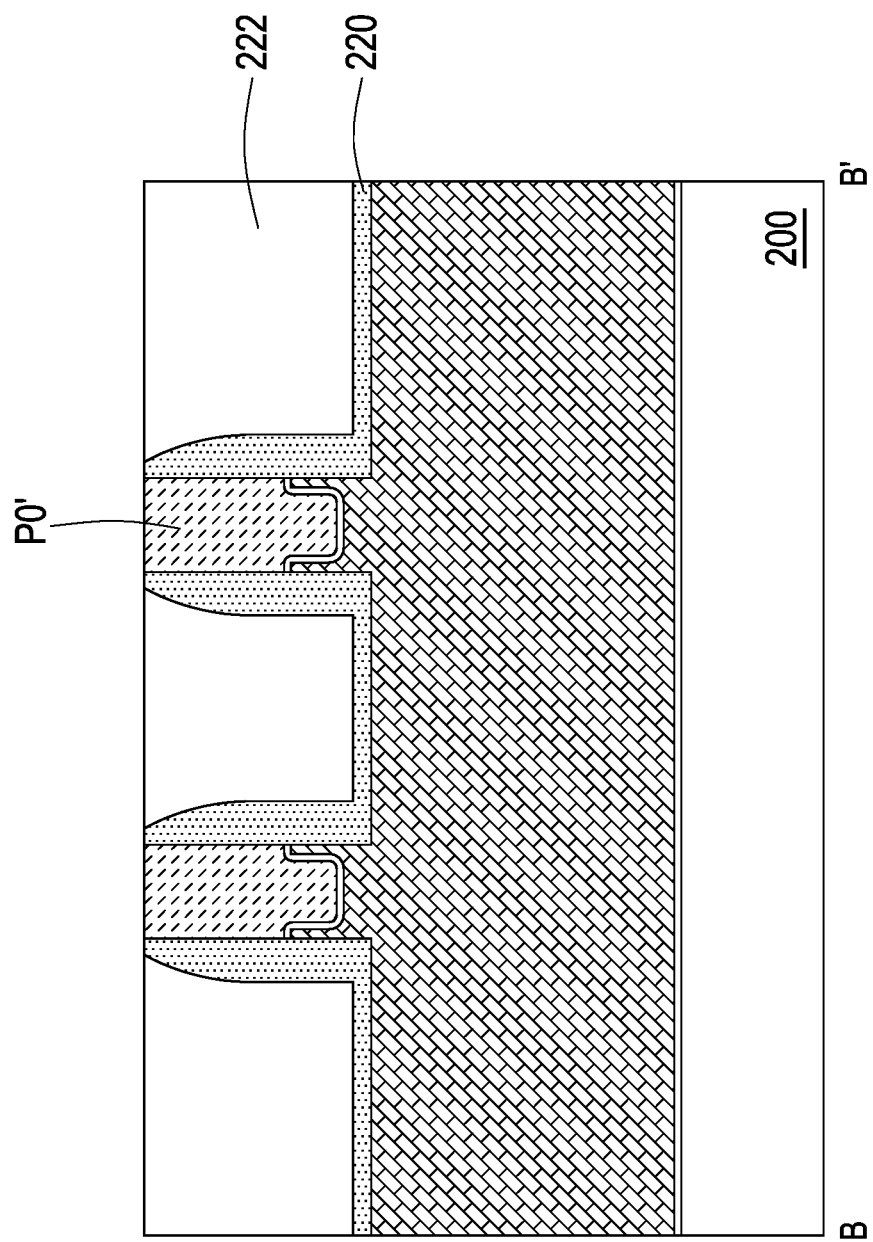
Figure 12C:
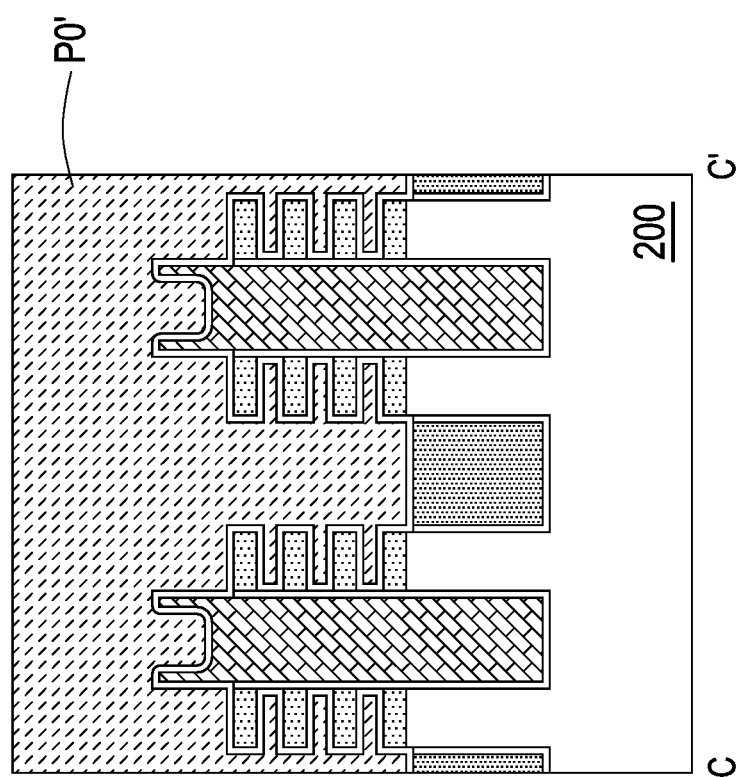

Referring to FIGS. 12A-12C, a contact etch stop layer (CESL) 220 is formed on the dielectric walls DW and on the sidewalls of the polysilicon layer PO. In some embodiments, the method for forming the CESL 220 includes conformally depositing a material of the CESL 220 on the dielectric walls DW and the polysilicon layer PO and then etching back the material to remain the CESL 220 and remove a portion of the material on the horizontal plane. The CESL 220 may include silicon nitride, silicon oxynitride, silicon nitride with oxygen (O) or carbon (C) elements, metal oxide such as $Al_2O_3$, the like, or a combination thereof, and the deposition method may be CVD, PVD, ALD, or a suitable process. An interlayer dielectric (ILD) layer 222 is formed over the CESL 220. In some embodiments, the ILD layer 222 is planarized by a planarization methods such as CMP, or the like. Accordingly, the top of the polysilicon layer PO' is lower than that of the polysilicon layer PO in FIG. 11C. In some embodiments, the ILD layer 222 includes silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), polyimide, the like, or a combination thereof.

Figure 13A:
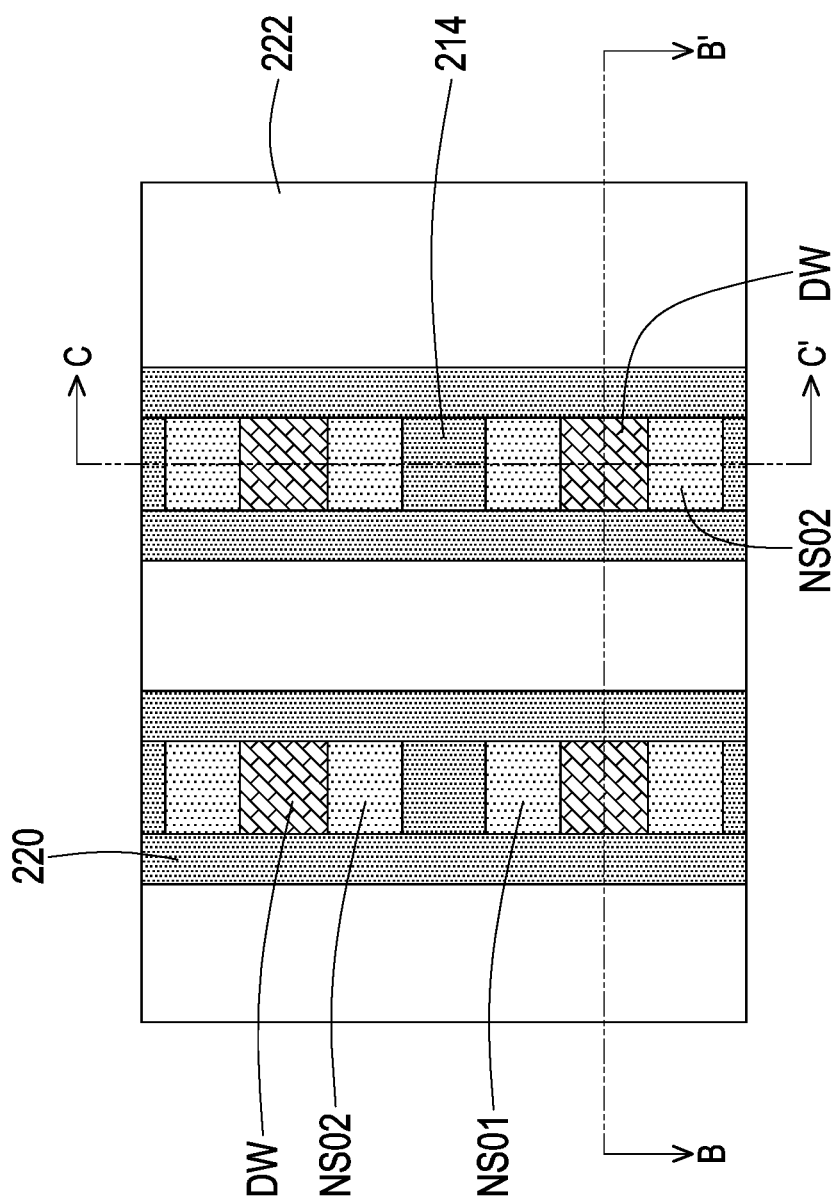
FIGS. 13A-13C are various views of a portion of a semiconductor device after removal of the dummy gate structure according to the second embodiment of the present disclosure.
Figure 13B:
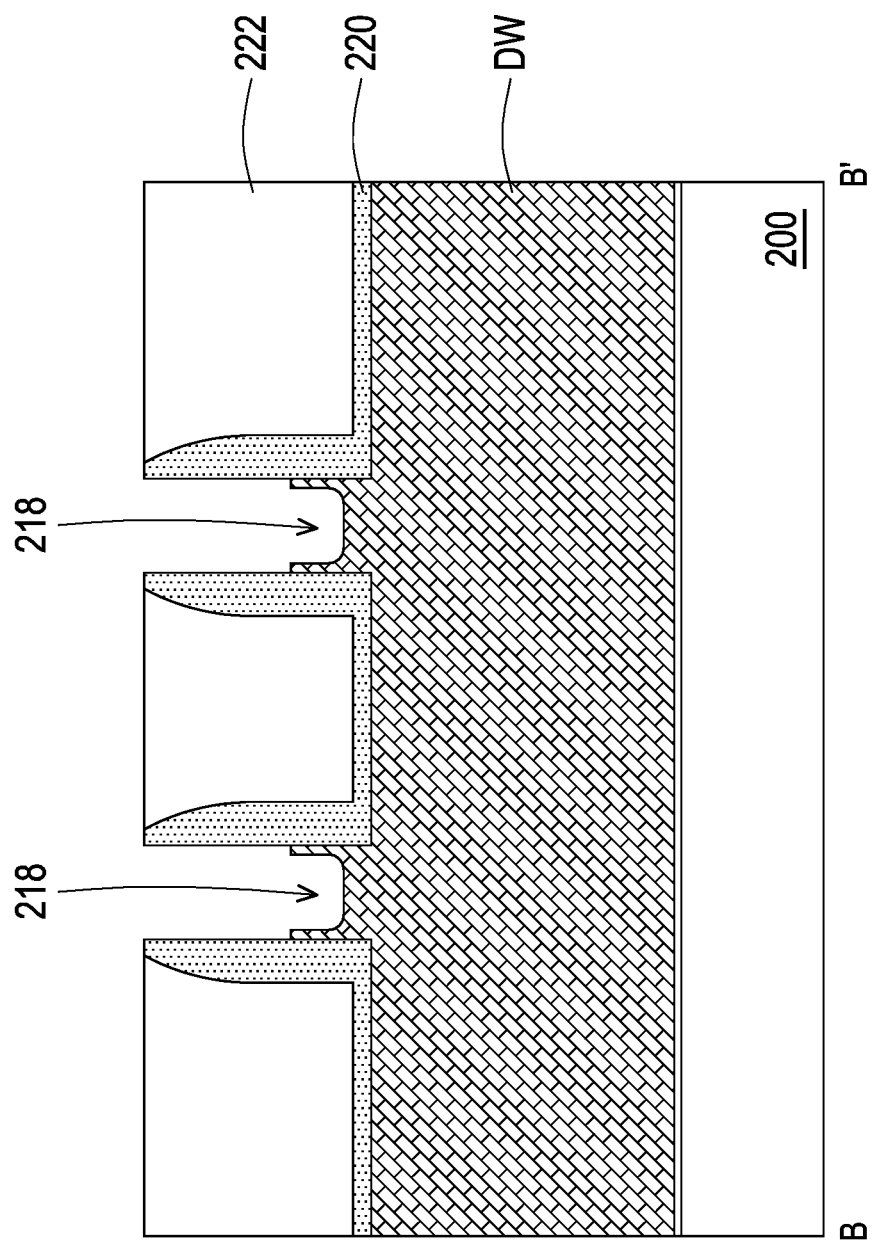
Figure 13C:
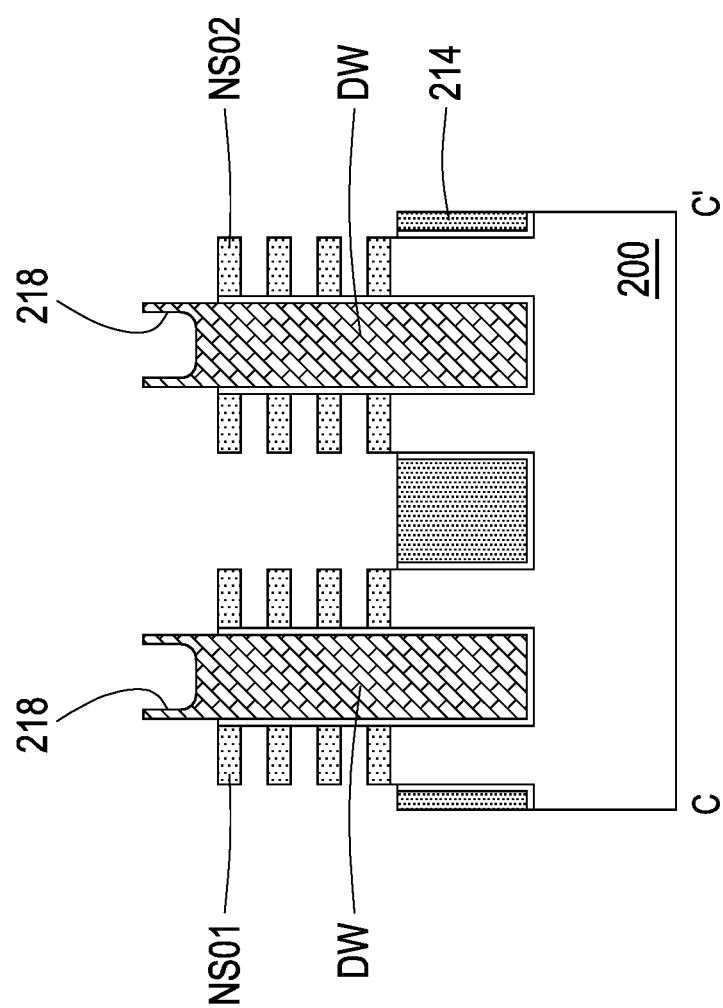

Referring to FIGS. 13A-13C, the dummy gate structure (i.e., the poly silicon layer PO' and the dielectric layer 219) is removed, and the recess 218 of each of the dielectric walls DW is exposed. The dummy gate structure may be removed using plasma dry etching and/or wet etching. When the dielectric layer 219 is silicon oxide, a wet etchant such as a TMAH solution may be used to selectively remove the polysilicon layer PO'. The dielectric layer 219 is then removed using plasma dry etching and/or wet etching.

Figure 14A:
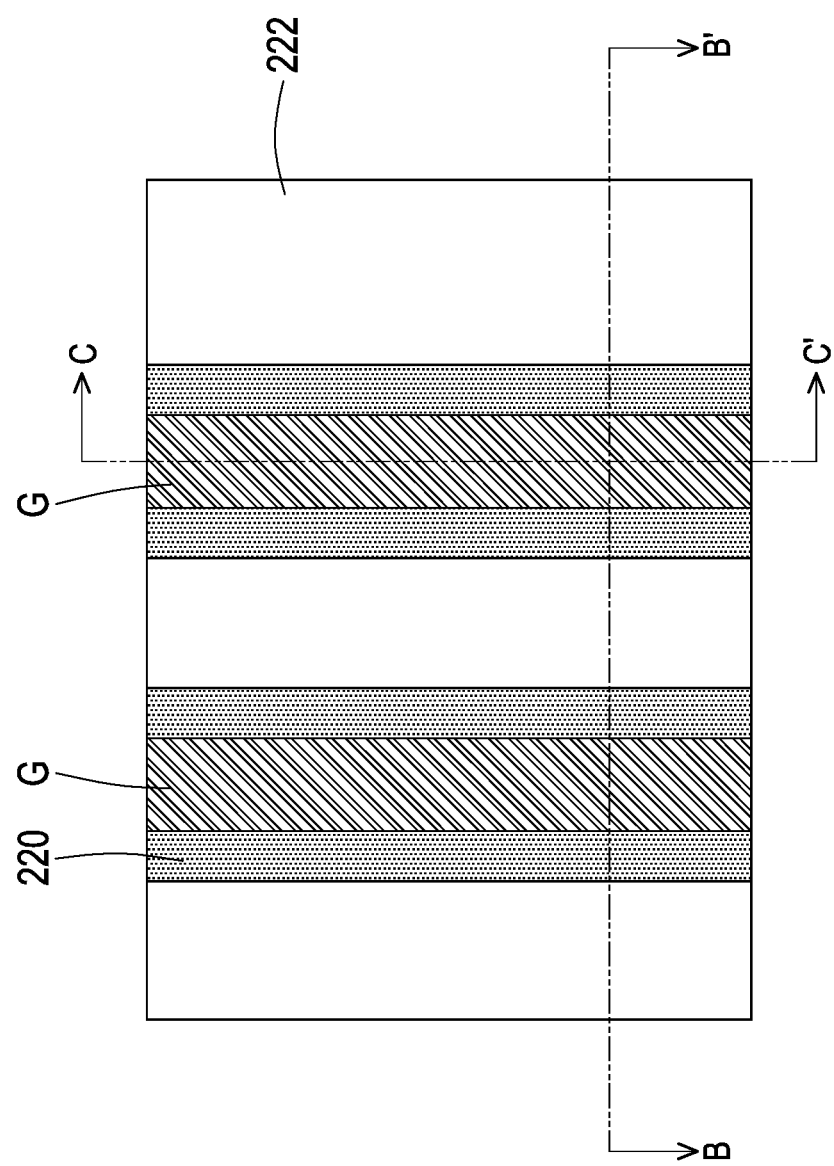
FIGS. 14A-14C are various views of a portion of a semiconductor device after formation of gate structures according to the second embodiment of the present disclosure.
Figure 14B:
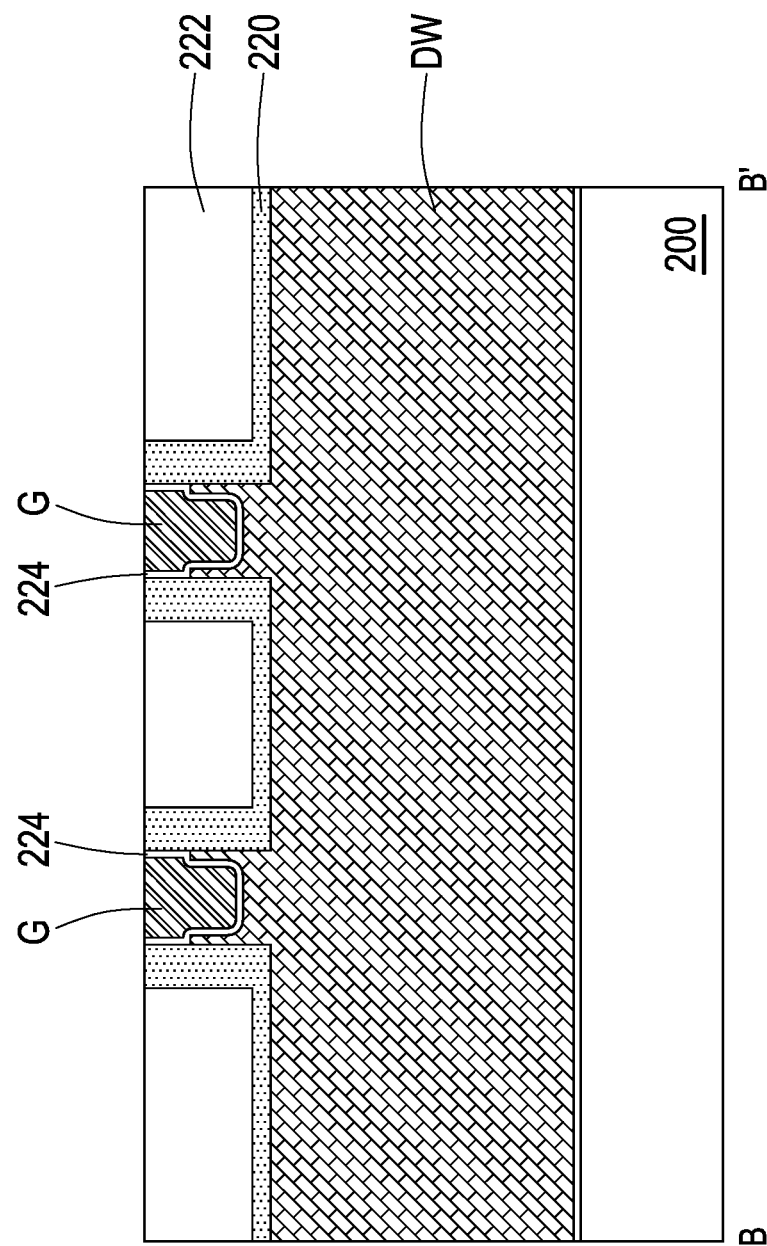
Figure 14C:
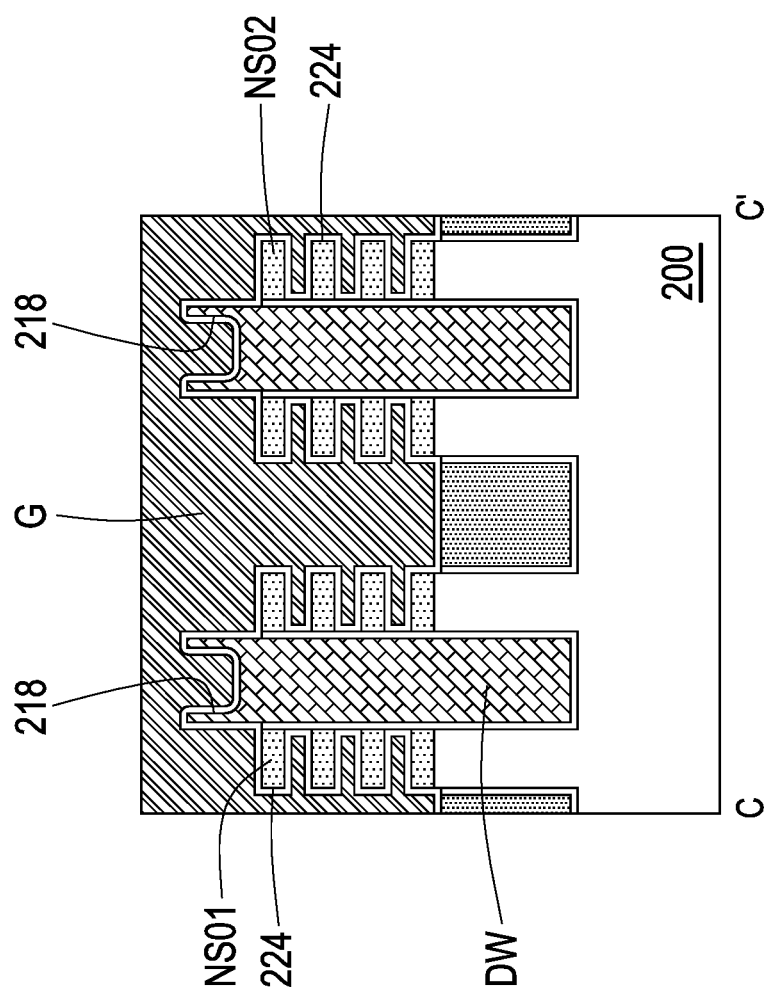

Referring to FIGS. 14A-14C, gate structures G are formed. In some embodiments, the gate structures G may include one or more conductive materials, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloy, a suitable material, or a combination thereof. Before the formation of the gate structures G, a gate dielectric layer 224 is formed on the stack of semiconductor nanosheets NS01-NS02 and the dielectric walls DW. The gate dielectric layer 224 includes at least one dielectric material, such as a high-k material. The gate dielectric layer 224 may be formed by CVD, ALD or a suitable method. In one embodiment, the gate dielectric layer 224 is formed by using a highly conformal deposition process, such as ALD in order to ensure the formation of a gate dielectric layer having a uniform thickness around each channel members (e.g., the stacks of semiconductor nanosheets NS01 and NS02). Examples of the high-k material include metal oxide, such as $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, the like, or combinations thereof.

Figure 15A:
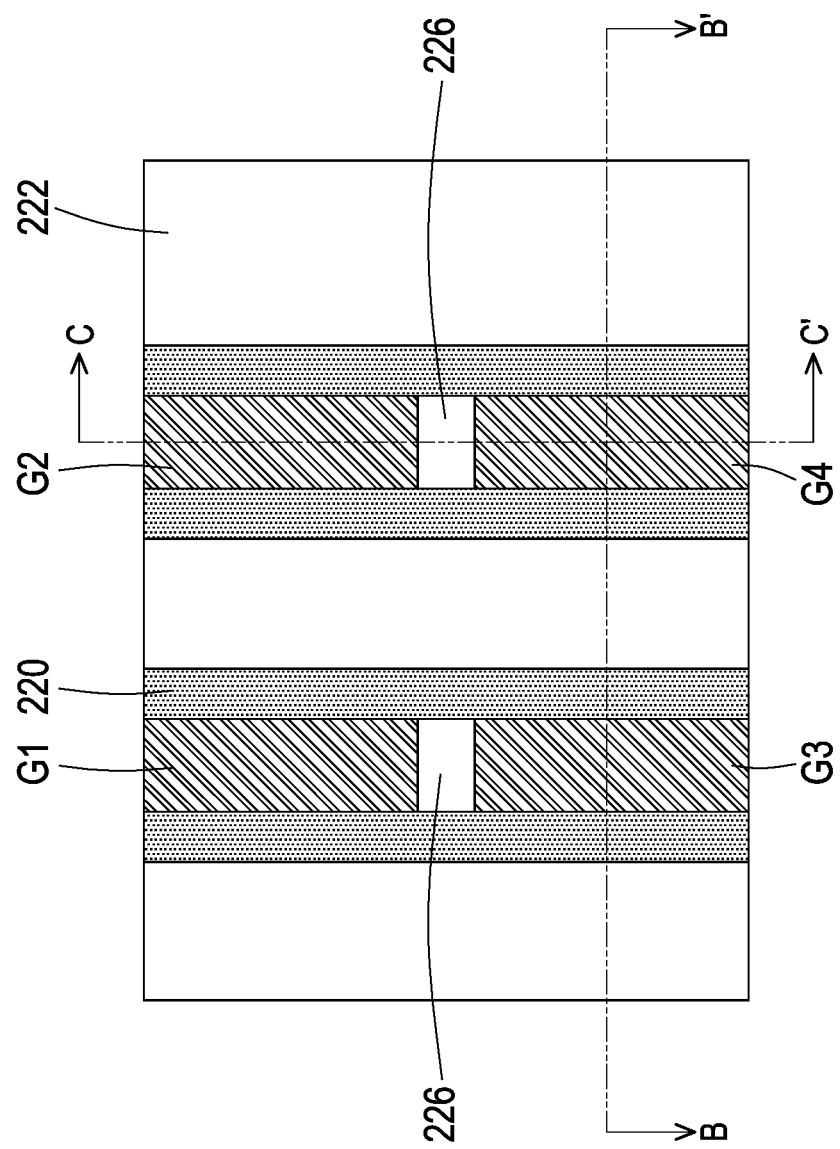
FIGS. 15A-15C are various views of a portion of a semiconductor device after formation of cut gate structures according to the second embodiment of the present disclosure.
Figure 15B:
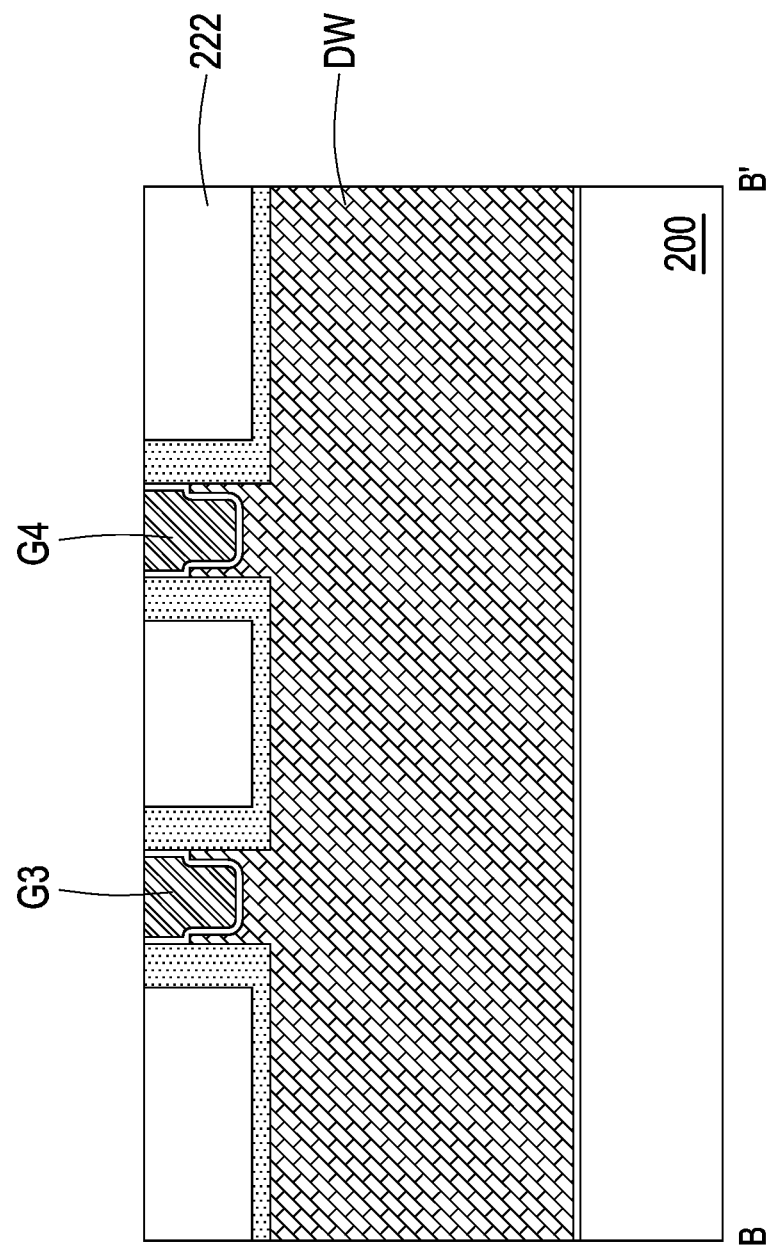
Figure 15C:
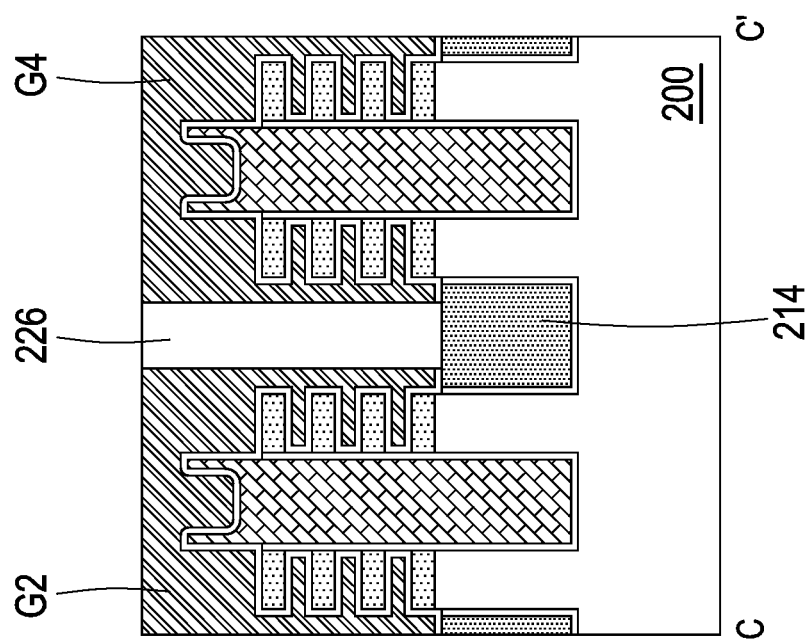

Referring to FIGS. 15A-15C, cut gate structures 226 are formed between the gate structures G so as to separate the two gate structures G into four gate structures G1-G4. The material of the cut gate structures 226 may include silicon oxide, silicon nitride, silicon oxynitride, a spin-on dielectric material, or a low-k material. The cut gate structures 226 are referred to as "isolation strips", "shallow trench isolation (STI) regions" or "deep trench isolation (DTI) regions" in some examples.

Figure 16A:
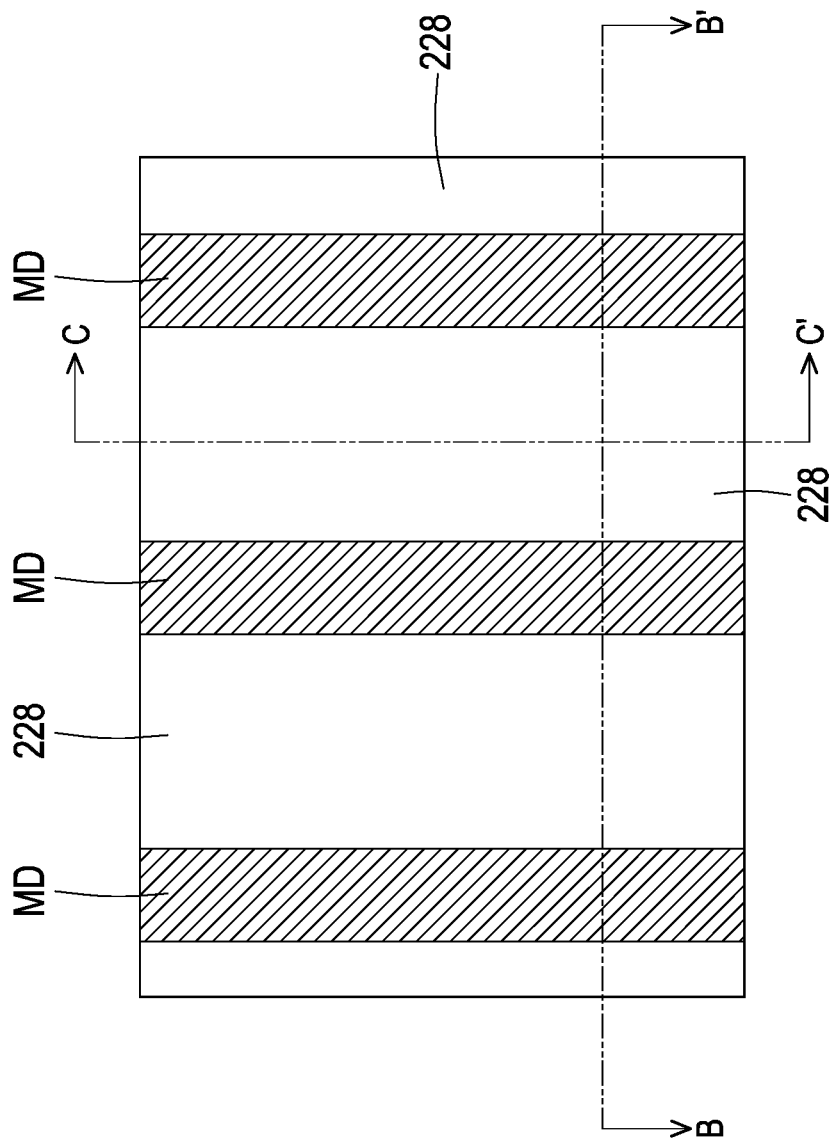
FIGS. 16A-16C are various views of a portion of a semiconductor device after formation of epi contacts according to the second embodiment of the present disclosure.
Figure 16B:
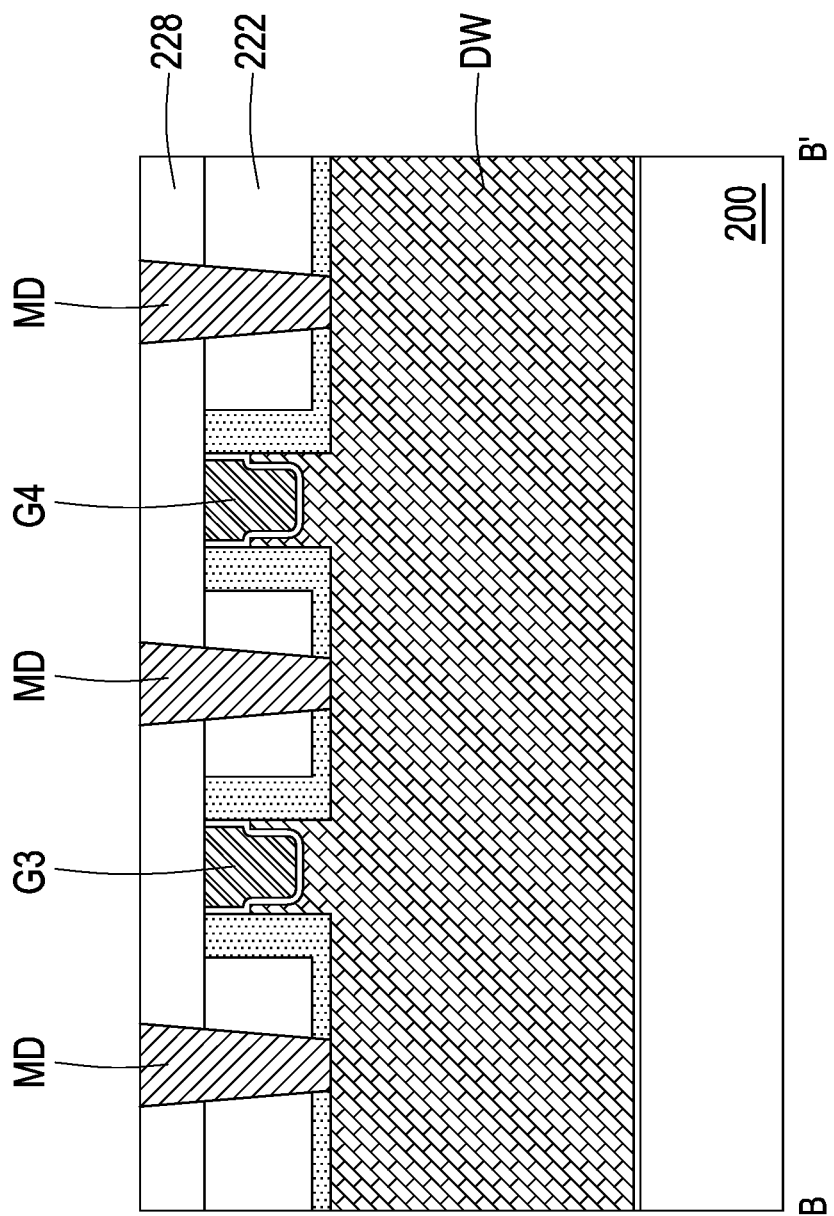
Figure 16C:
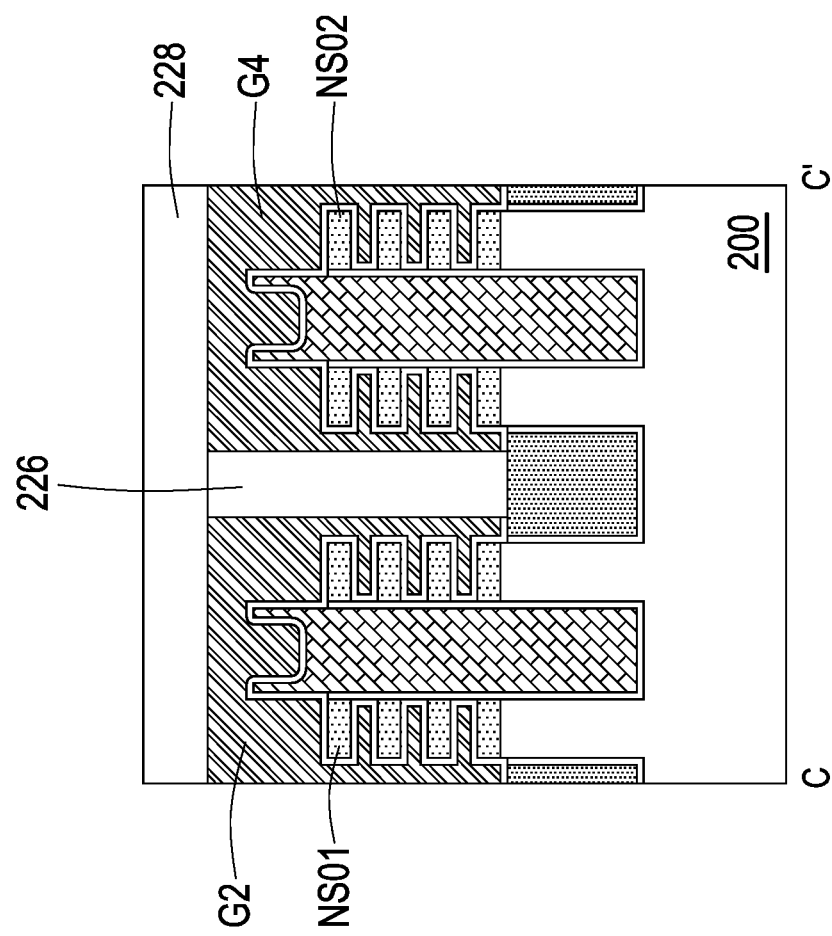

Referring to FIGS. 16A-16C, an interlayer dielectric (ILD) layer 228 is formed over the ILD layer 222 and the CESL 220, and then contacts MD are formed in the ILD layers 228 and 222 for the connection of the epitaxial layers (e.g., the n-type epitaxial layer Epi01 and the p-type epitaxial layer Epi02 in FIG. 11A). In some embodiments, the contacts MD are across the dielectric walls DW as shown in FIG. 16B, but the embodiments of the present disclosure are not limited thereto. In other embodiments, the contacts MD are not across the dielectric walls DW but formed in the form of vias on each of the epitaxial layers.

Figure 17A:
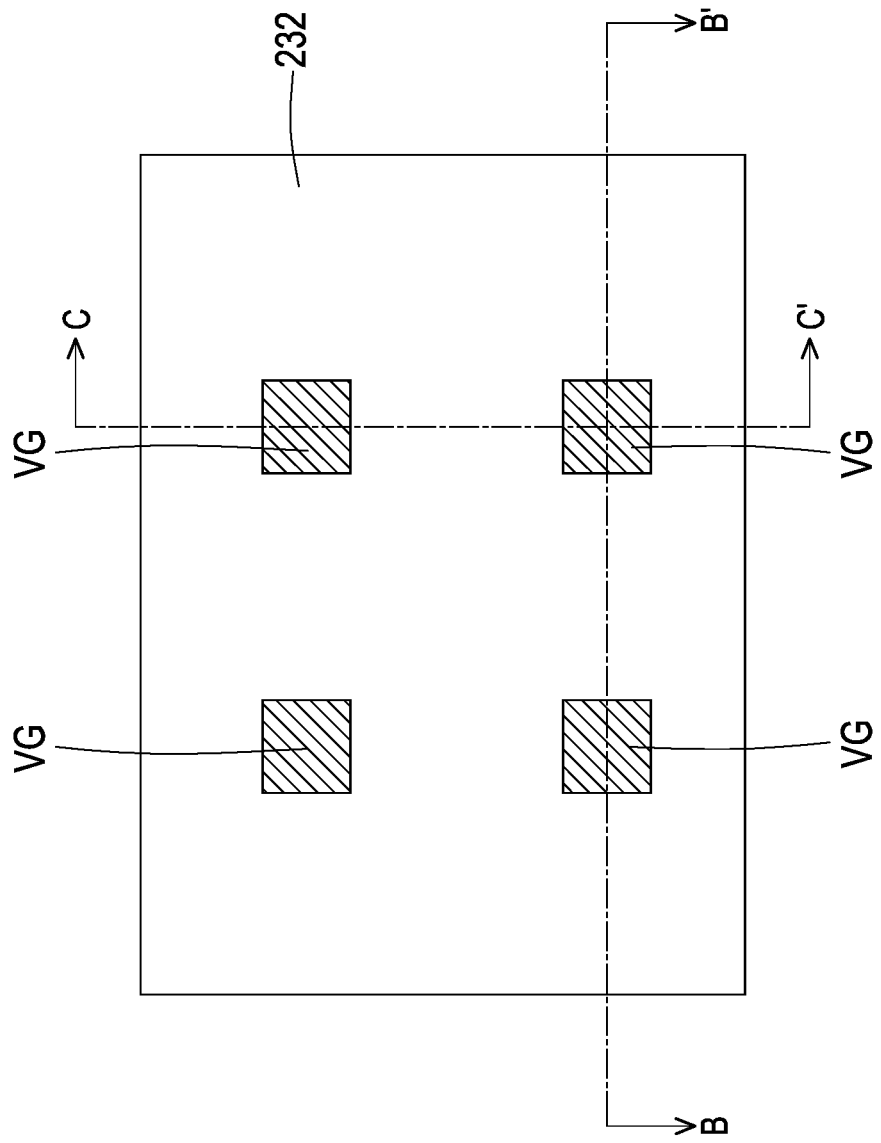
FIGS. 17A-17C are various views of a portion of a semiconductor device after formation of vertical gate contacts according to the second embodiment of the present disclosure.
Figure 17B:
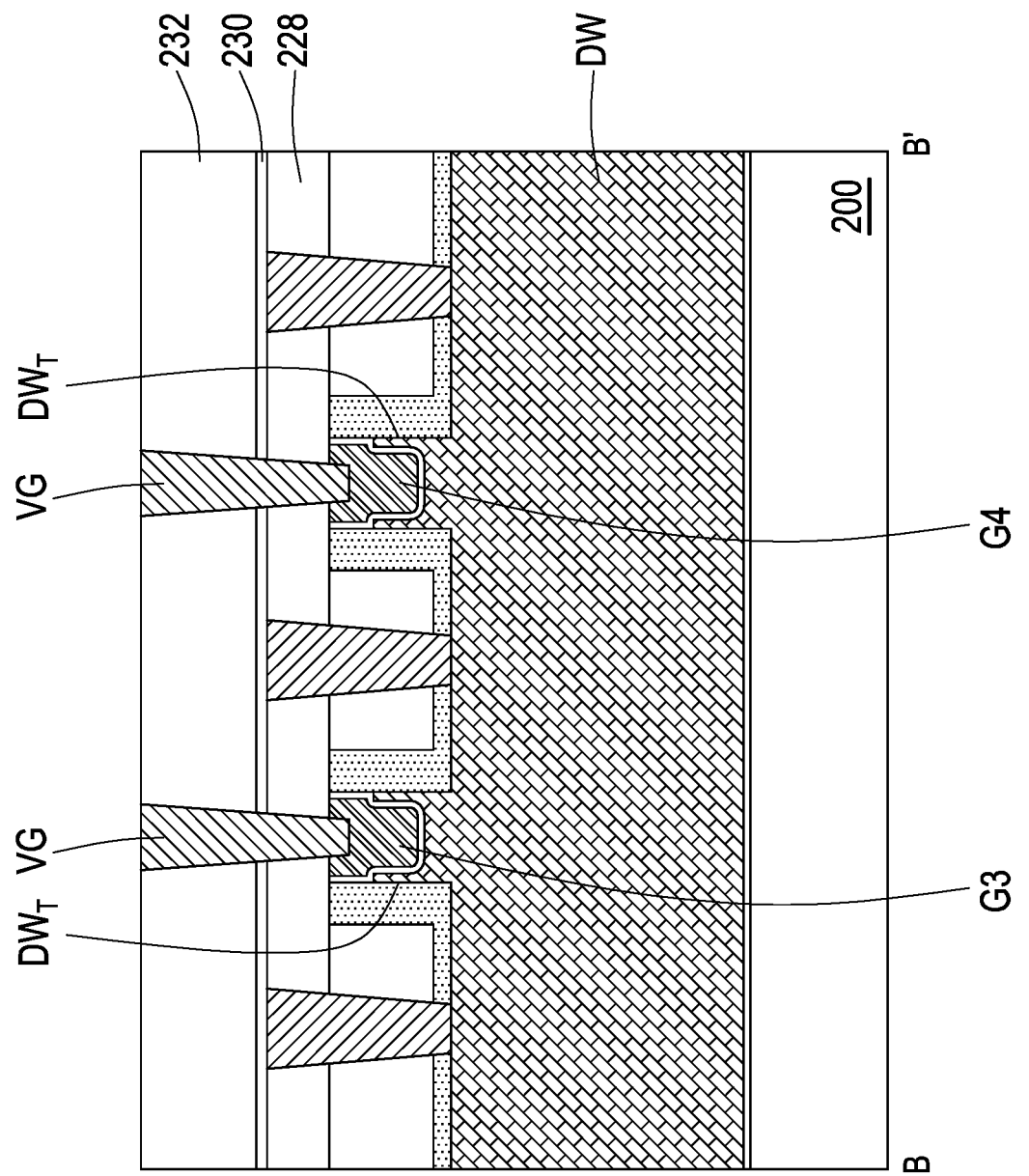
Figure 17C:
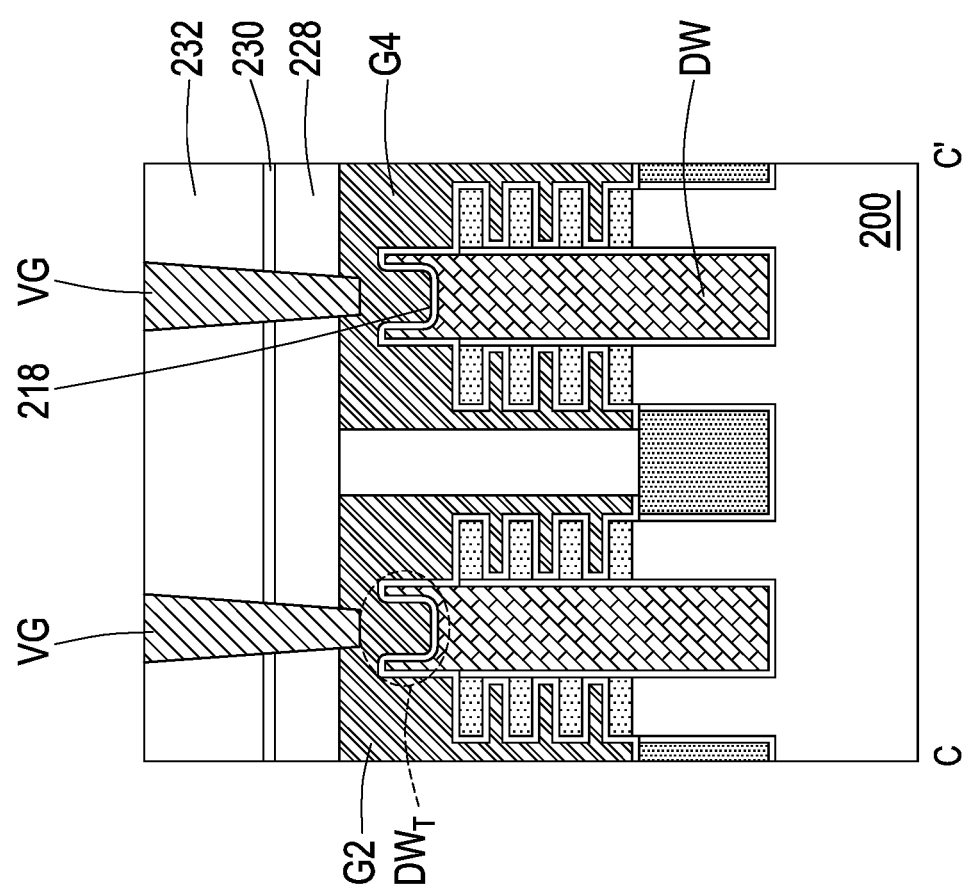

Referring to FIGS. 17A-17C, an etch stop layer 230 is formed on the contacts MD and the ILD layer 228, another ILD layer 232 is formed on the etch stop layer 230, and vertical gate contacts VG are formed in the ILD layers 228 and 232 over the recess 218 of the top $DW_T$ of each of the dielectric walls DW, resulting in the formation of a middle end-of-line (MEOL) structure. Due to the presence of the recess 218 of the top $DW_T$ of each of the dielectric walls DW, the resistance of the vertical gate contacts VG can be reduced. In addition, even if the vertical gate contacts VG are slightly misaligned, the connection between the vertical gate contacts VG and the gate structures G1-G4 cannot be affected.

Among figures of a third embodiment labeled with a figure numeral and an alphabetical suffix, figures with the alphabetical suffix "A" are a top-down view; figures of the third embodiment with the alphabetical suffix "B" are a vertical cross-sectional view along the vertical plane B-B' within the figure with the same figure numeral and the alphabetical suffix "A," figures of the third embodiment with the alphabetical suffix "C" are a vertical cross-sectional view along the vertical plane C-C' within the figure with the same figure numeral and the alphabetical suffix "A." Figures with the same figure numeral and different alphabetical suffices correspond to a same processing step.

Figure 18A:
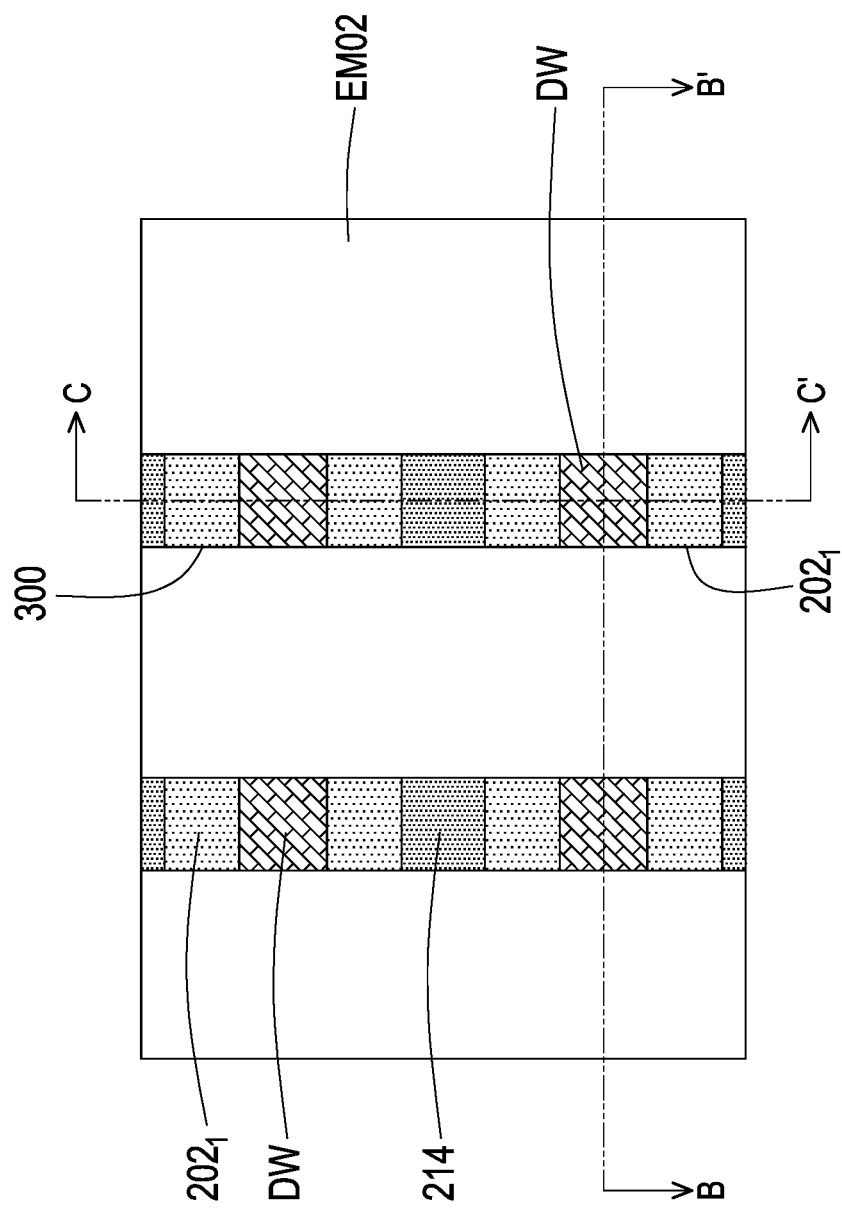
FIGS. 18A-18C are various views of a portion of a semiconductor device after formation of patterned mask according to a third embodiment of the present disclosure.
Figure 18B:
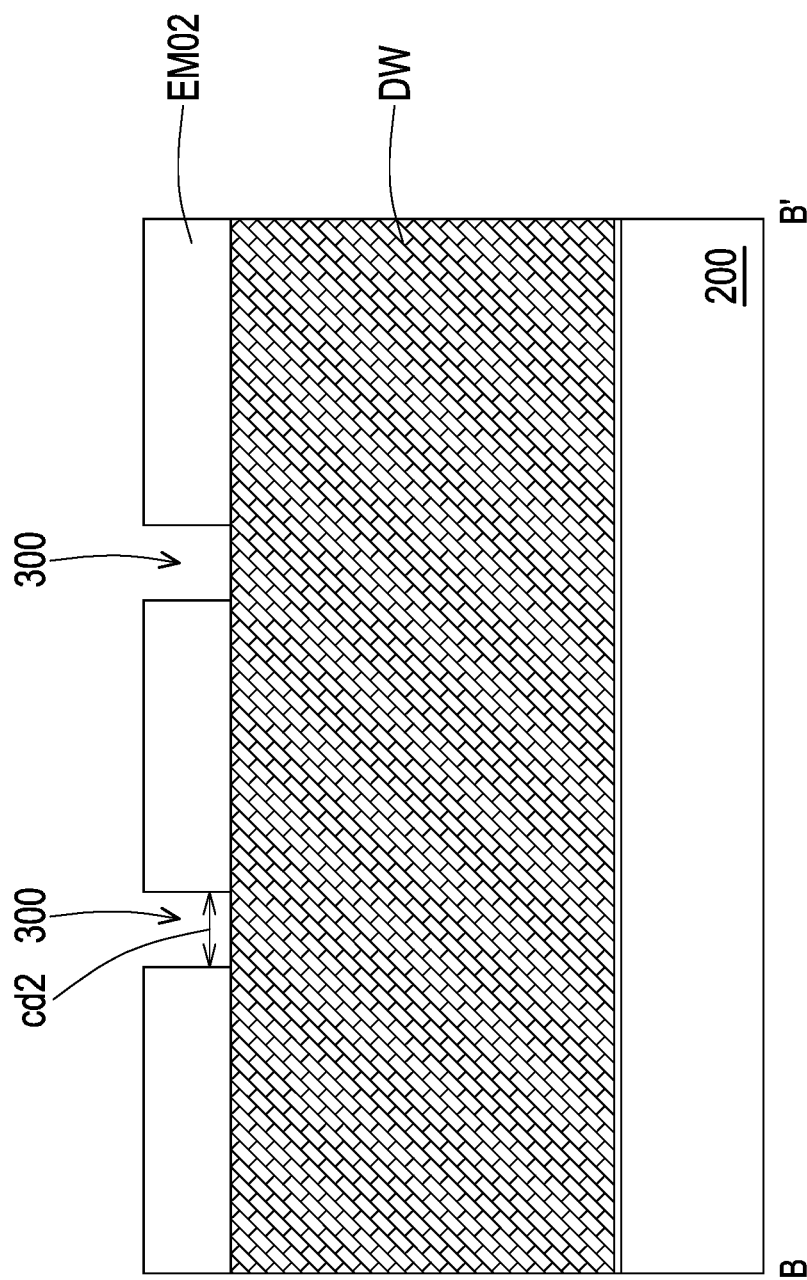
Figure 18C:
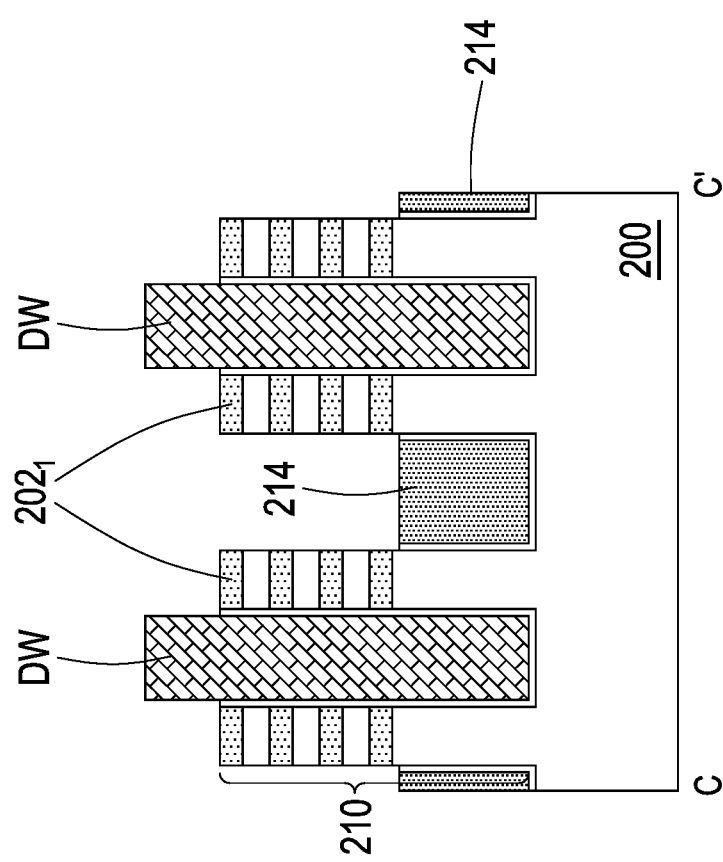

Referring to FIGS. 18A-18C, the preceding steps of the third embodiment are the same as FIGS. 1A to 6C of the second embodiment, and thus it will not be repeated herein. A second patterned mask EM02 is formed on the substrate 200, wherein a plurality of trenches 300 is within the second patterned mask EM02 in order to expose the dielectric walls DW. In some embodiments, the plurality of trenches 300 has an extending direction perpendicular to the extending direction of the dielectric walls DW, wherein the dimension cd2 of the trench 300 is more than 12 nm and 18 nm or less, and a length of the trench 300 is 20 nm to 10 μm, although lesser and greater dimension may also be used.

Figure 19A:
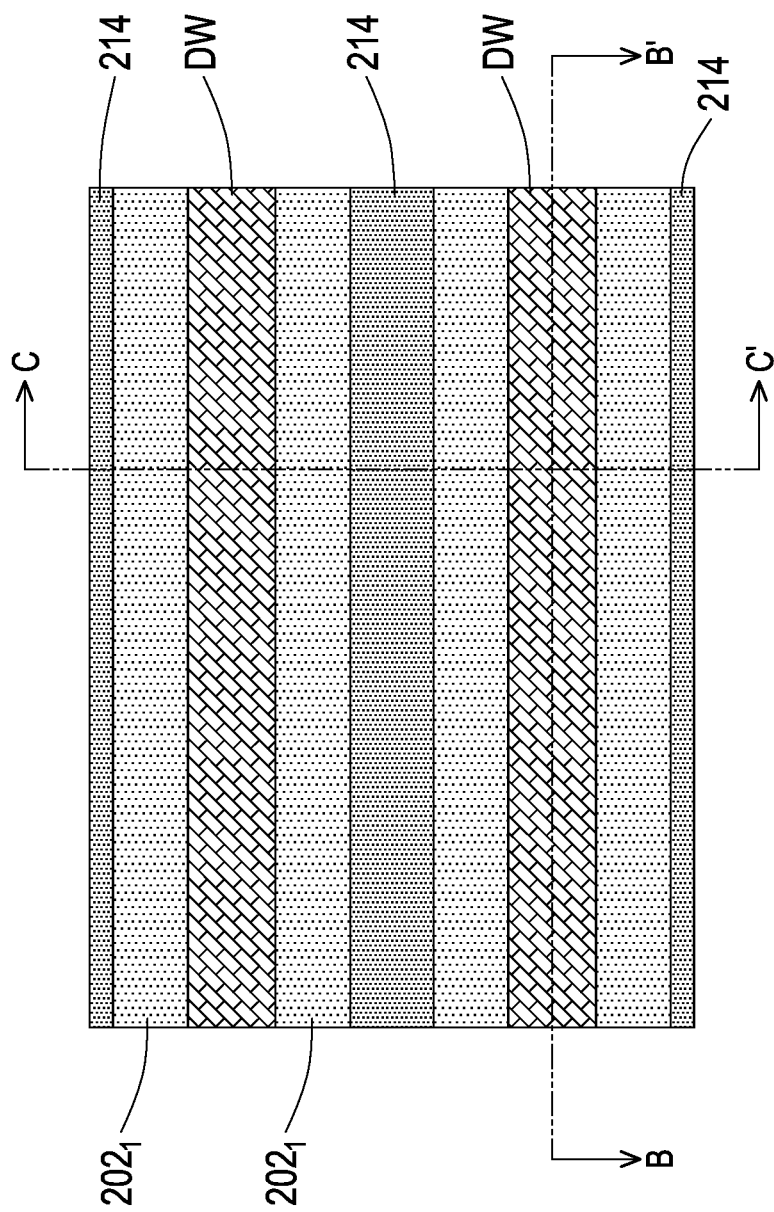
FIGS. 19A-19C are various views of a portion of a semiconductor device after etching the wall structures according to the third embodiment of the present disclosure.
Figure 19B:
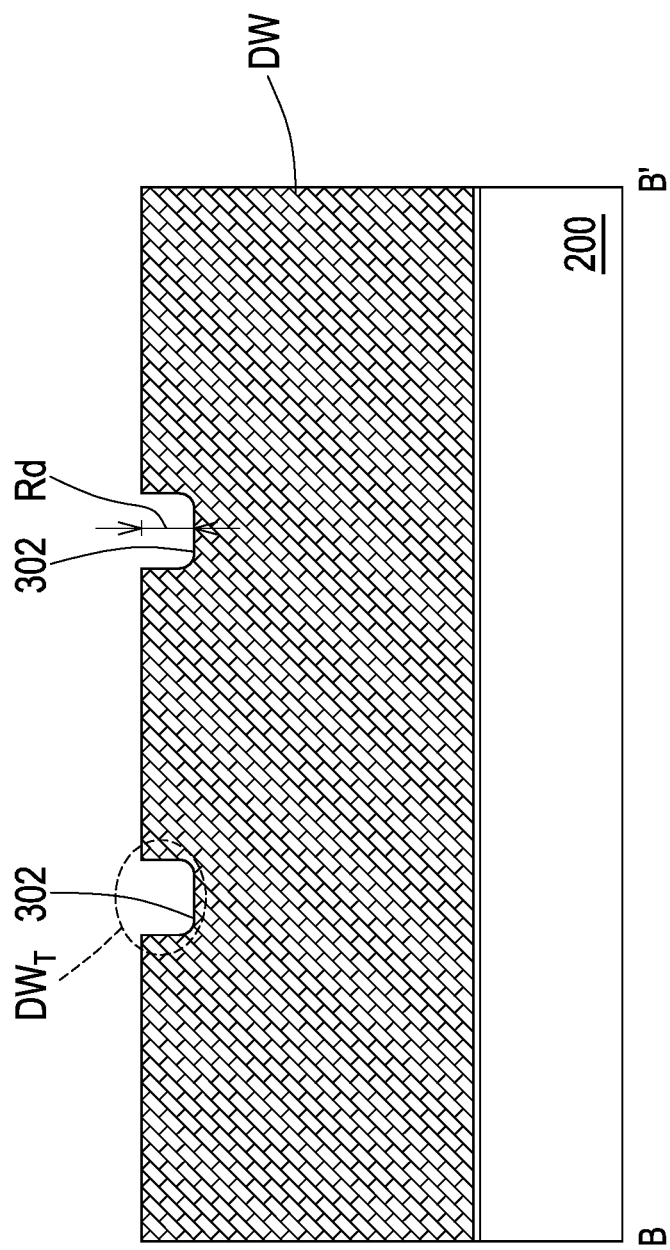
Figure 19C:
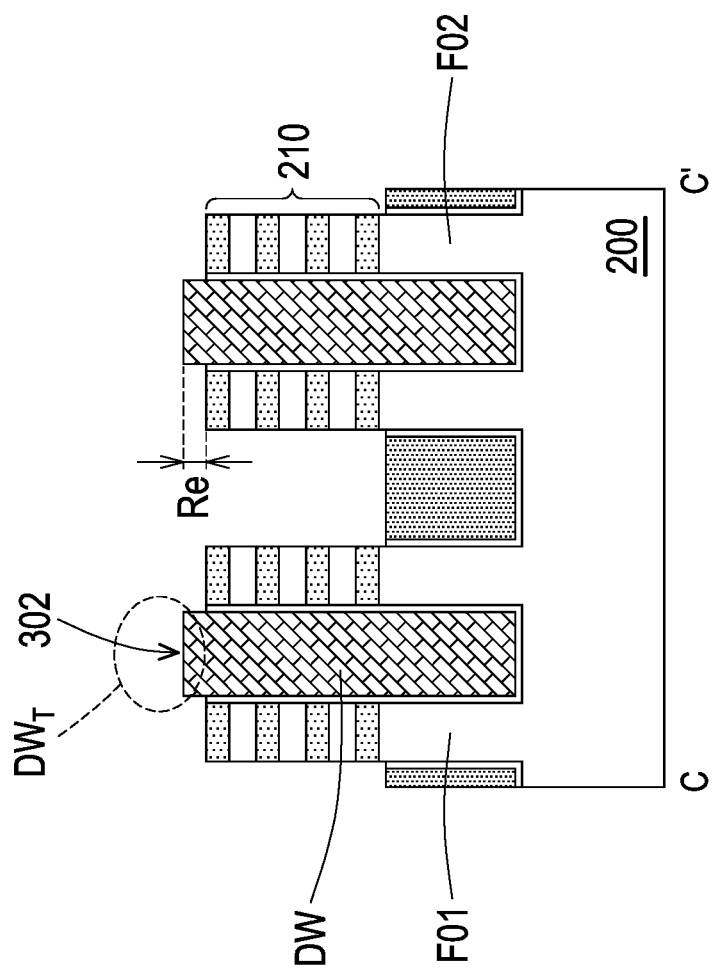

Referring to FIGS. 19A-19C, the dielectric walls DW are etched using the second patterned mask EM02 as an etching mask. After etching, the top $DW_T$ of each of the dielectric walls DW has a recess 302. The recess 302 is a groove perpendicular to an extension direction of the nanosheet mesa F01 and the nanosheet mesa F02. The top $DW_T$ of the dielectric walls DW has a U-shaped cross section. In some embodiments, a recess depth Rd of the recess 302 is 5 nm to 20 nm, although lesser and greater dimension may also be used. A remaining height Re of the dielectric walls DW over the semiconductor strips 210 is 0 nm to 5 nm, although lesser and greater remaining height may also be used. The second patterned mask EM02 is removed after the formation of the recesses 302.

Figure 20A:
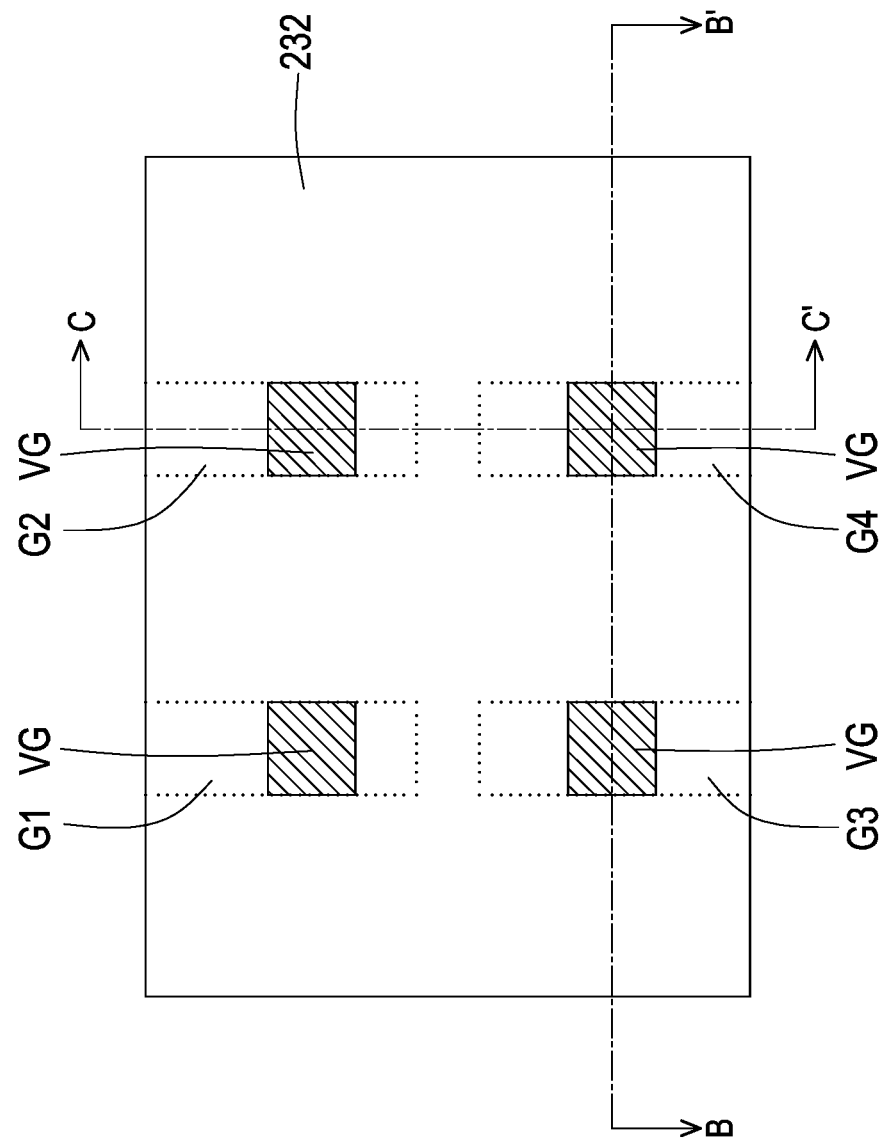
FIGS. 20A-20C are various views of a portion of a semiconductor device after formation of vertical gate contacts according to the third embodiment of the present disclosure.
Figure 20B:
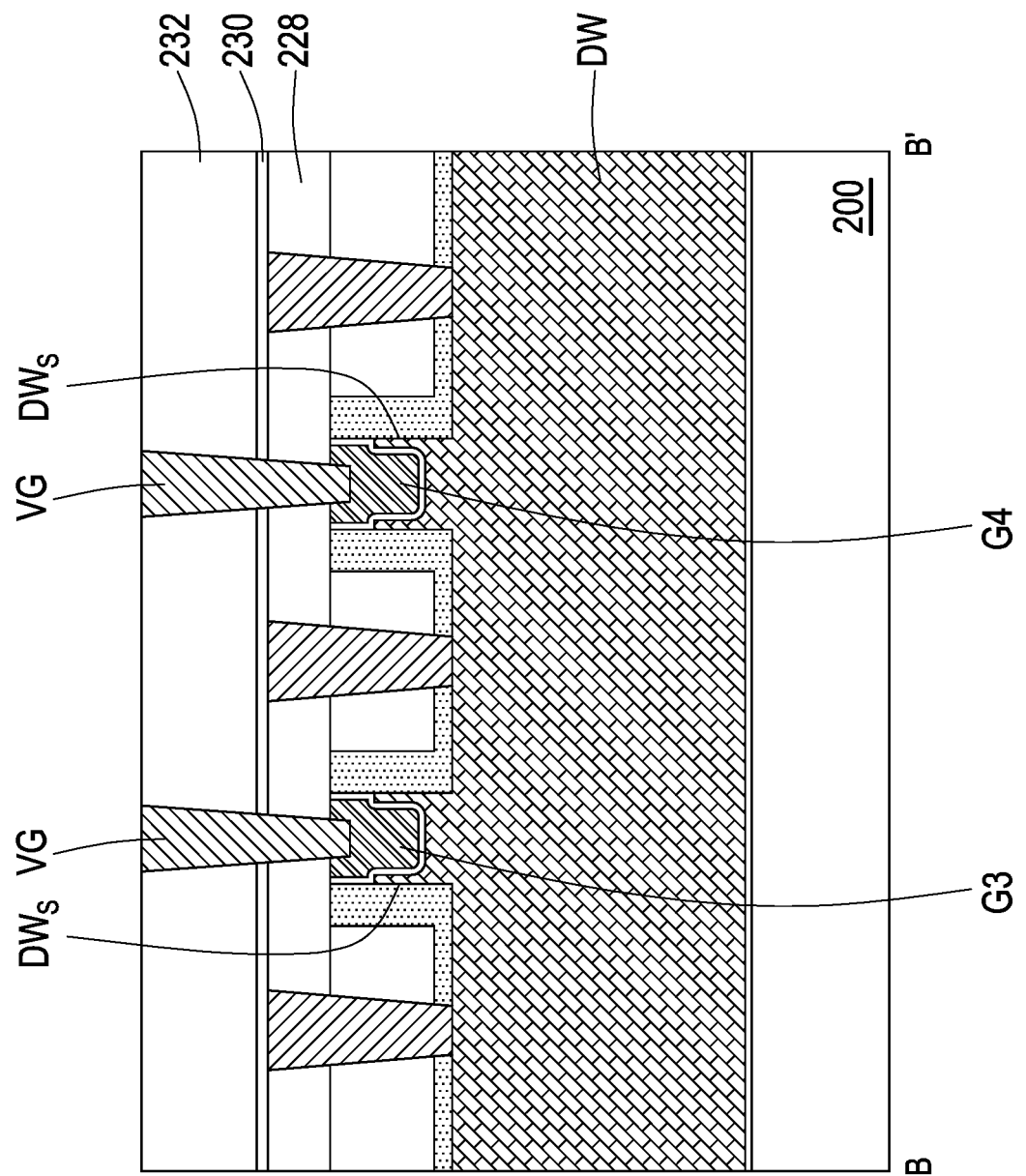
Figure 20C:
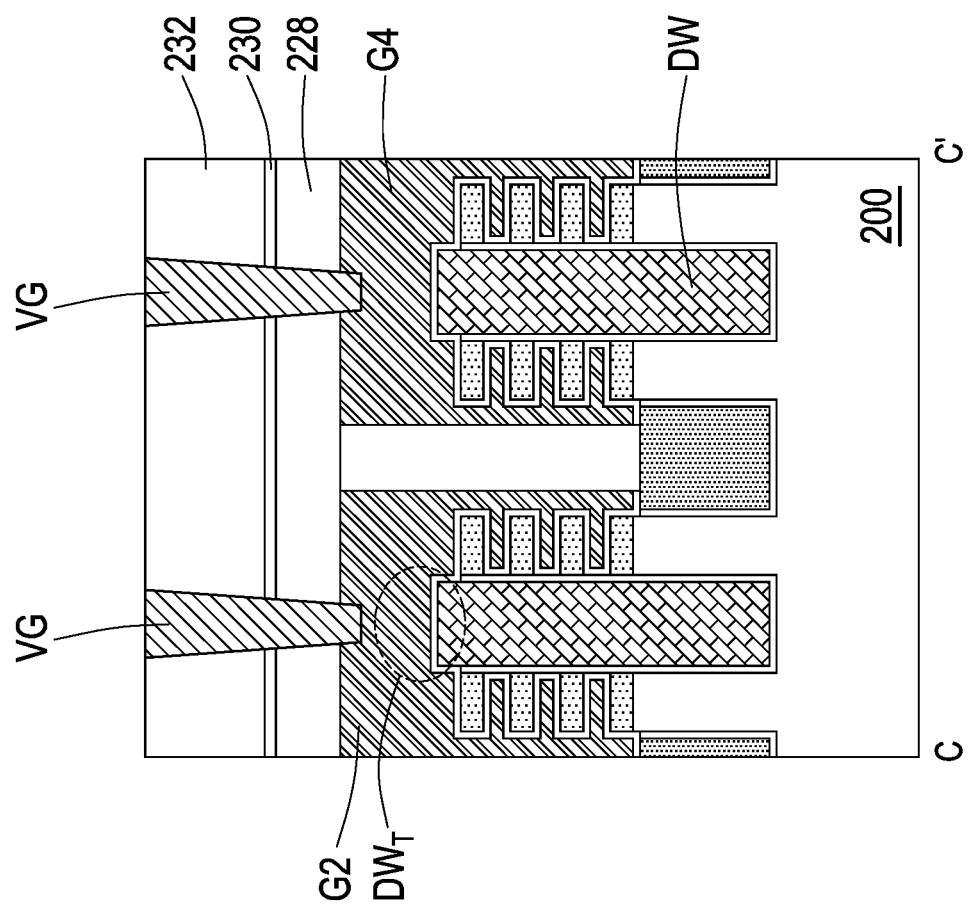

After the steps the same as FIGS. 9A to 17C of the second embodiment, the semiconductor device is formed shown in FIGS. 20A-20C. The top of each of the dielectric walls DW has sidewalls $DW_S$ parallel to an extension direction of the gate structures G1-G4 in a plan view. Since the recess 302 of the top $DW_T$ of each of the dielectric walls DW has low top surface along the vertical plane C-C', even if the vertical gate contacts VG are slightly misaligned, the connection between the vertical gate contacts VG and the gate structures G1-G4 cannot be affected.

Among figures of a fourth embodiment labeled with a figure numeral and an alphabetical suffix, figures with the alphabetical suffix "A" are a vertical cross-sectional view along a first vertical plane; figures of the fourth embodiment with the alphabetical suffix "B" are another vertical cross-sectional view along a second vertical plane perpendicular to the first vertical plane. Figures with the same figure numeral and different alphabetical suffices correspond to a same processing step.

Figure 21A:
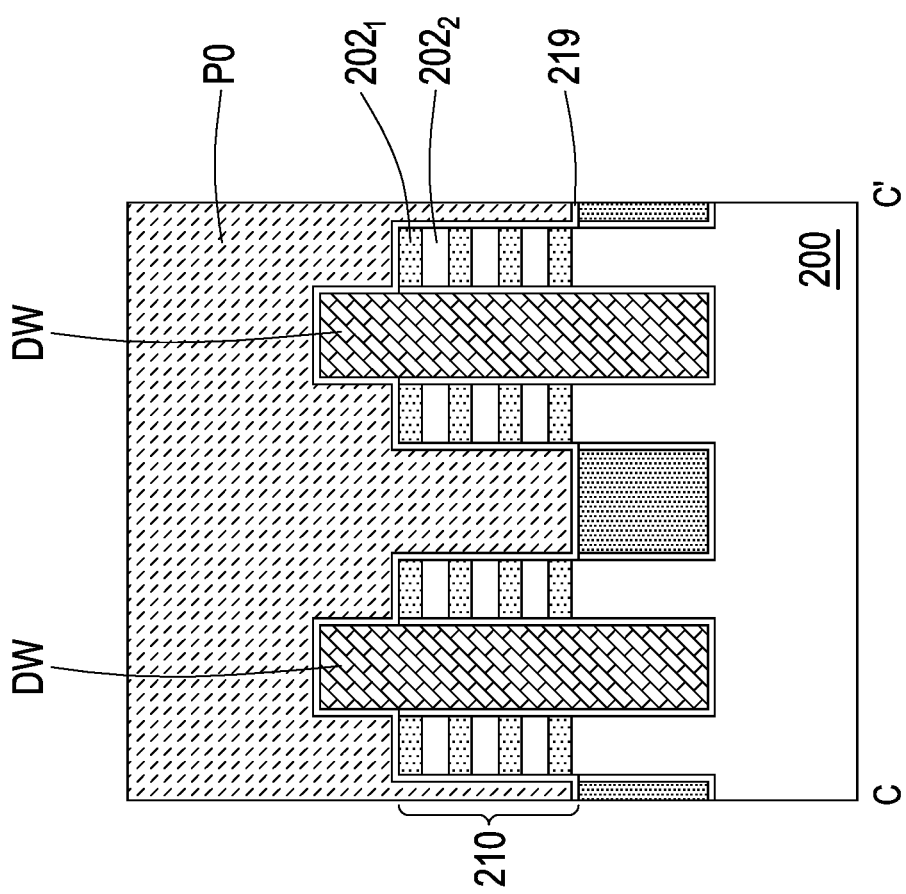
FIGS. 21A-21B are various views of a portion of a semiconductor device after formation of a dummy gate structure according to a fourth embodiment of the present disclosure.
Figure 21B:
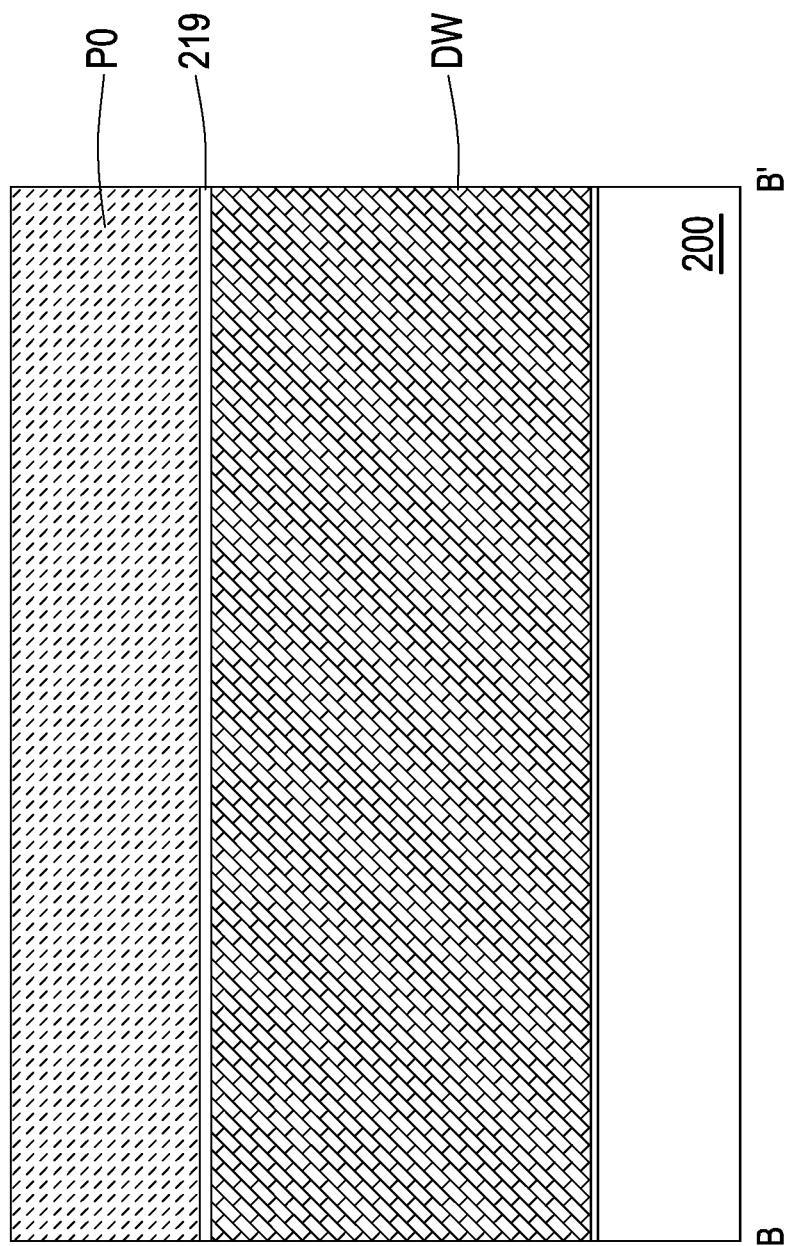

Referring to FIGS. 21A-21B, the preceding steps of the fourth embodiment are the same as FIGS. 1A to 6C of the second embodiment, and thus it will not be repeated herein. A dummy gate structure is formed first. In some embodiments, the dummy gate structure includes a dielectric layer 219 conformally deposited on the dielectric walls DW and a thick polysilicon layer PO formed on the dielectric layer 219.

Figure 22A:
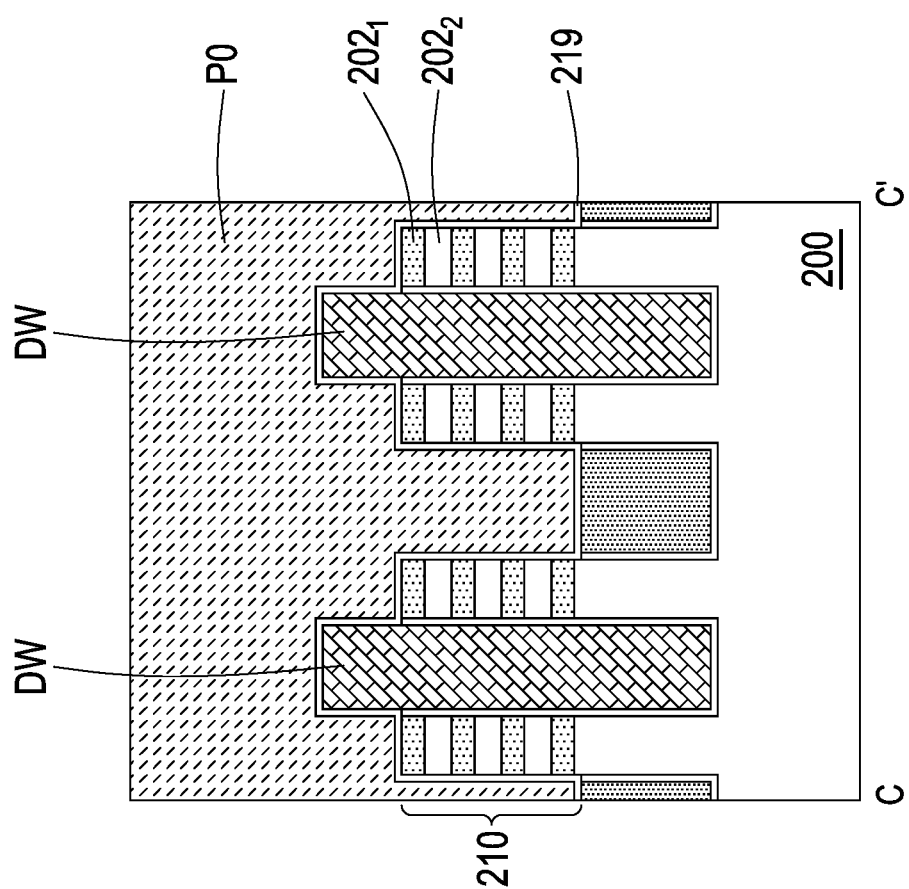
FIGS. 22A-22C are various views of a portion of a semiconductor device after formation of epitaxial layers according to the fourth embodiment of the present disclosure.
Figure 22B:
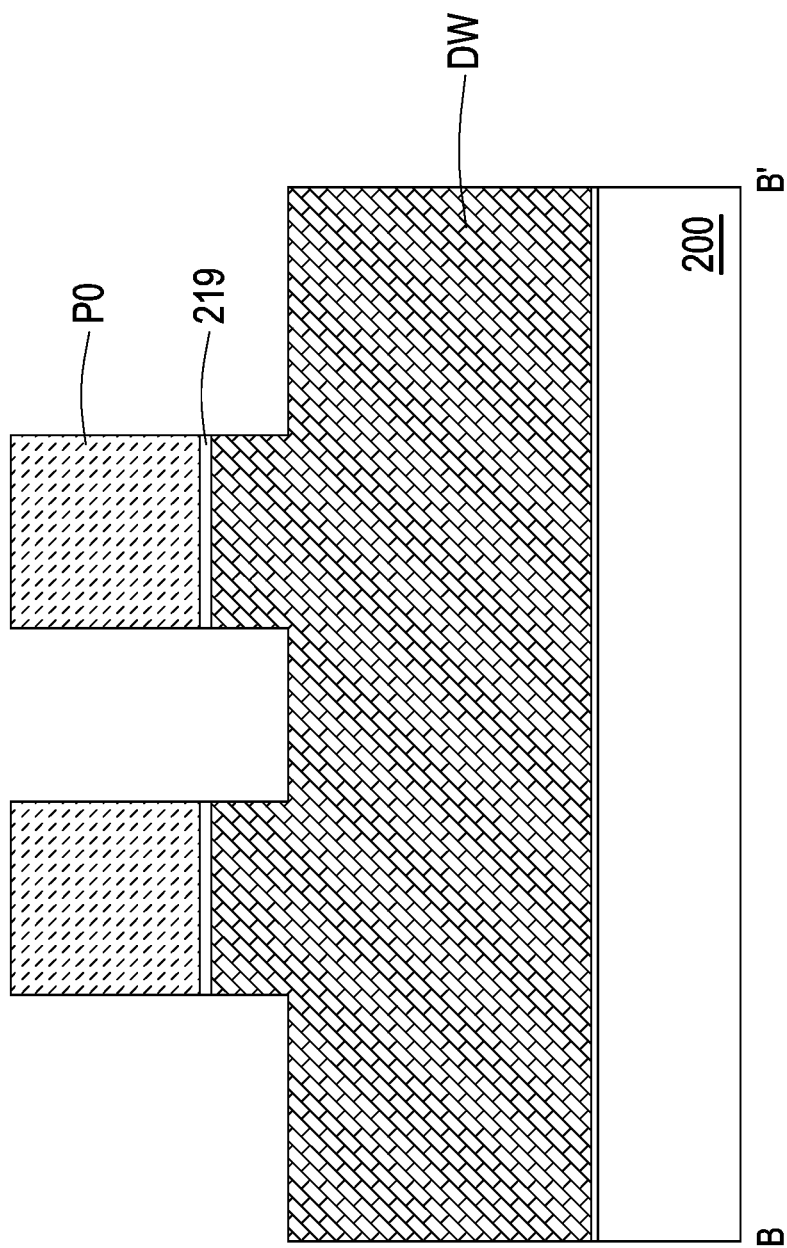
Figure 22C:
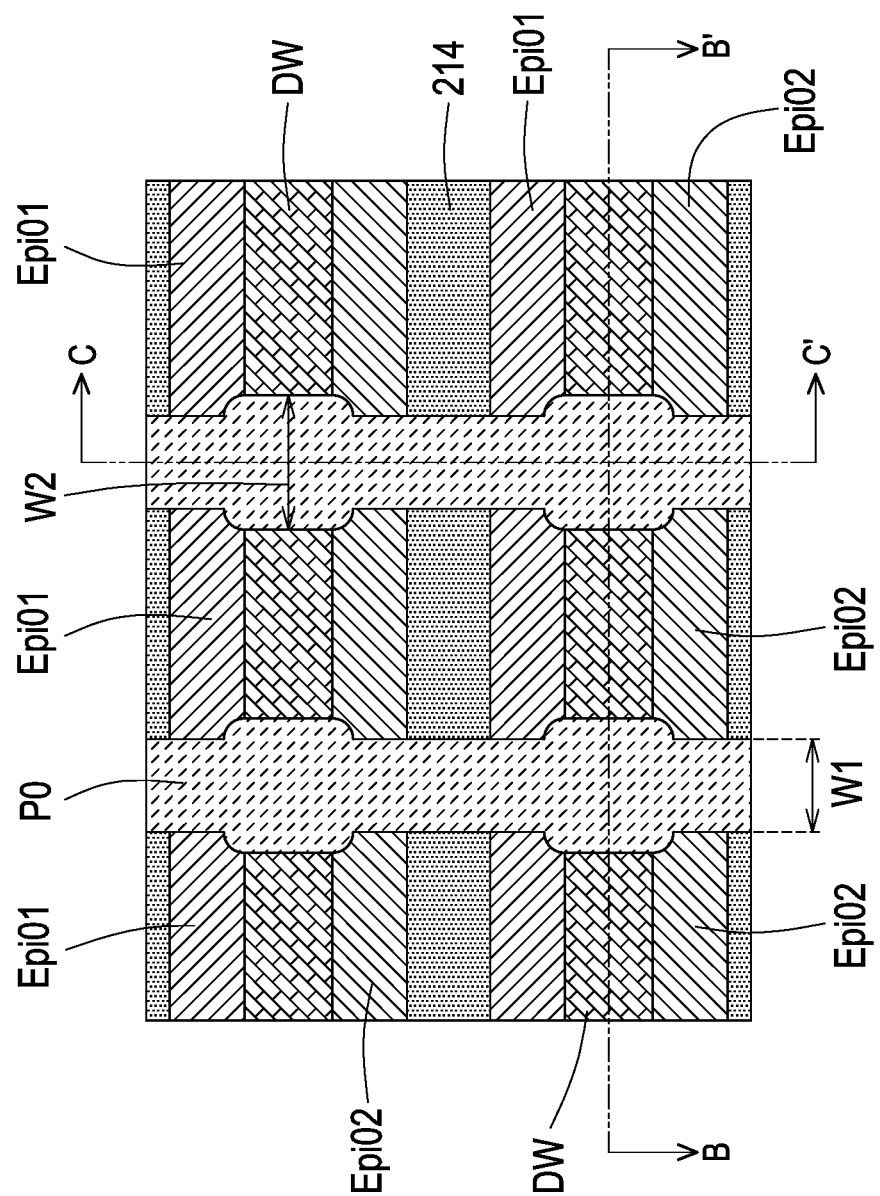

Referring to FIGS. 22A-22B, the dummy gate structure (i.e., the polysilicon layer PO and the dielectric layer 219) is patterned, and the patterned dummy gate structure has an extending direction perpendicular to the extending direction of the dielectric walls DW, for instance. FIG. 2C is a top-down view of the semiconductor device, and a width W2 of the polysilicon layer PO over the dielectric walls DW is wider than a width W1 of the polysilicon layer PO over other structures. After that, epitaxial layers (i.e., n-type epitaxial layers Epi01 and p-type epitaxial layers Epi02) are formed, and the steps include, for example, etching the semiconductor strips 210 using the dielectric walls DW as an etching mask, and then performing an epitaxial growth process to form the n-type epitaxial layer Epi01 and the p-type epitaxial layer Epi02 at two sides of the dielectric walls DW, respectively. In some embodiments, the epitaxial growth process is, for example, a molecular beam epitaxy (MBE) process, a metalorganic chemical vapor deposition (MOCVD) process, or the like.

Figure 23A:
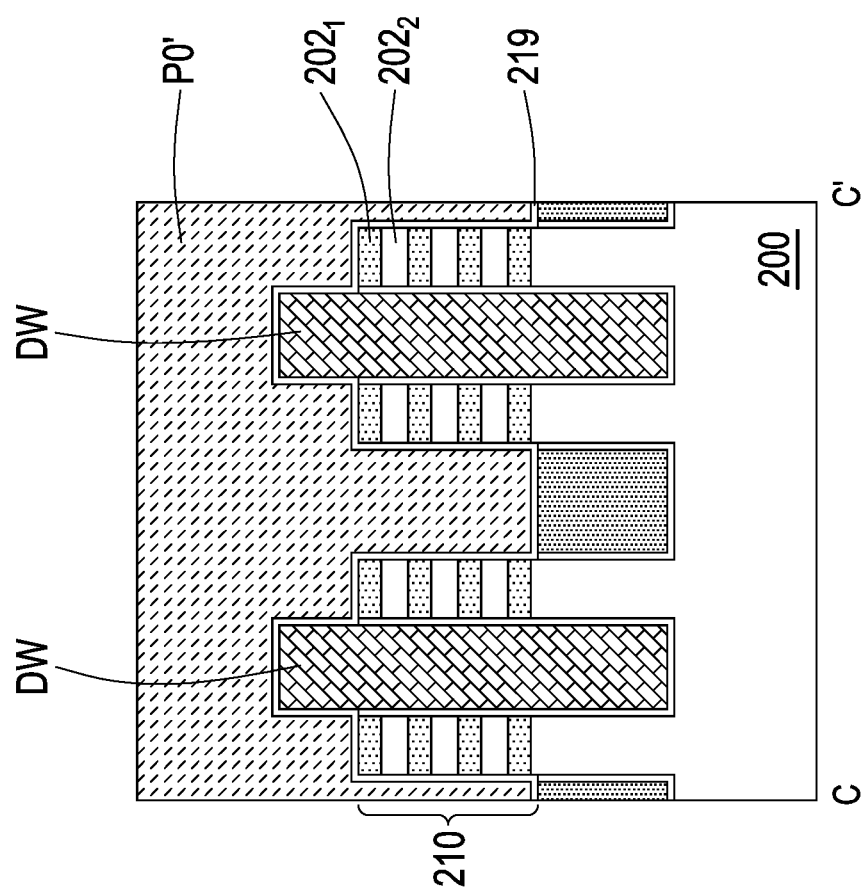
FIGS. 23A-23B are various views of a portion of a semiconductor device after formation of inter layer dielectric according to the fourth embodiment of the present disclosure.
Figure 23B:
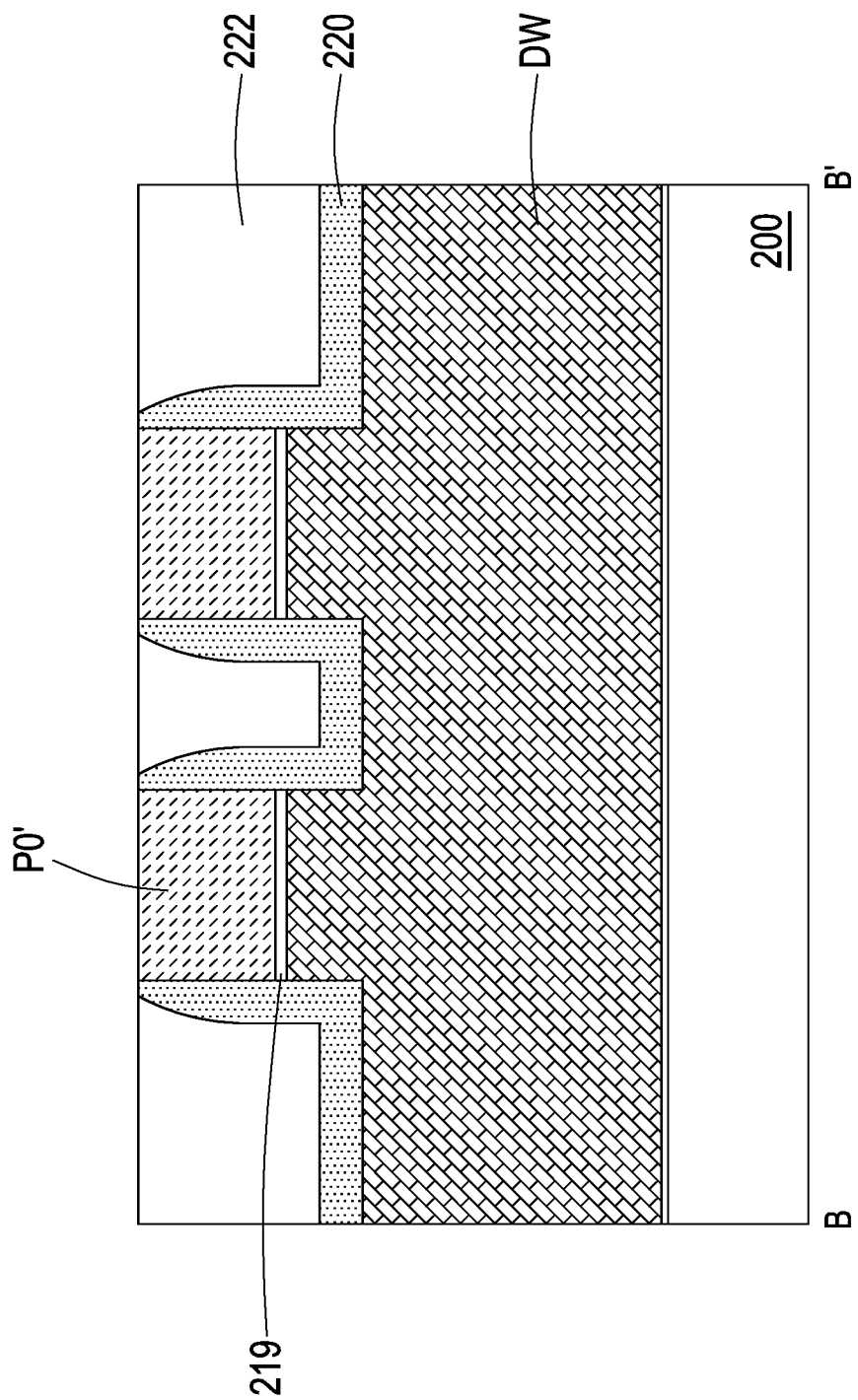

Referring to FIGS. 23A-23B, a contact etch stop layer (CESL) 220 is formed on the dielectric walls DW and on the sidewalls of the polysilicon layer PO. In some embodiments, the method for forming the CESL 220 includes conformally depositing a material of the CESL 220 on the dielectric walls DW and the polysilicon layer PO and then etching back the material to remain the CESL 220 and remove a portion of the material on the horizontal plane. The CESL 220 may include silicon nitride, silicon oxynitride, silicon nitride with oxygen (O) or carbon (C) elements, metal oxide such as $Al_2O_3$, the like, or a combination thereof, and the deposition method may be CVD, PVD, ALD, or a suitable process. An interlayer dielectric (ILD) layer 222 is formed over the CESL 220. In some embodiments, the ILD layer 222 is planarized by a planarization methods such as CMP, or the like. Accordingly, the top of the polysilicon layer PO' is lower than that of the polysilicon layer PO in FIG. 11C. In some embodiments, the ILD layer 222 includes silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), polyimide, the like, or a combination thereof.

Figure 24A:
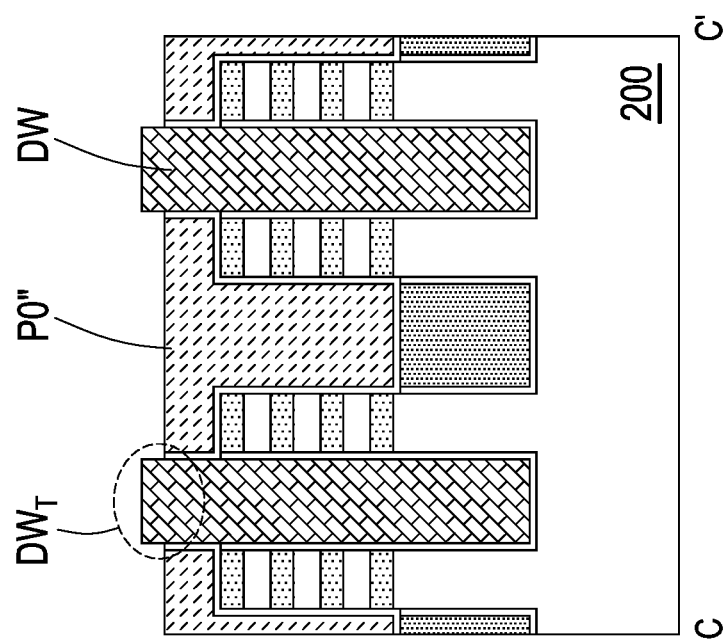
FIGS. 24A-24B are various views of a portion of a semiconductor device after etching the dummy gate structure according to the fourth embodiment of the present disclosure.
Figure 24B:
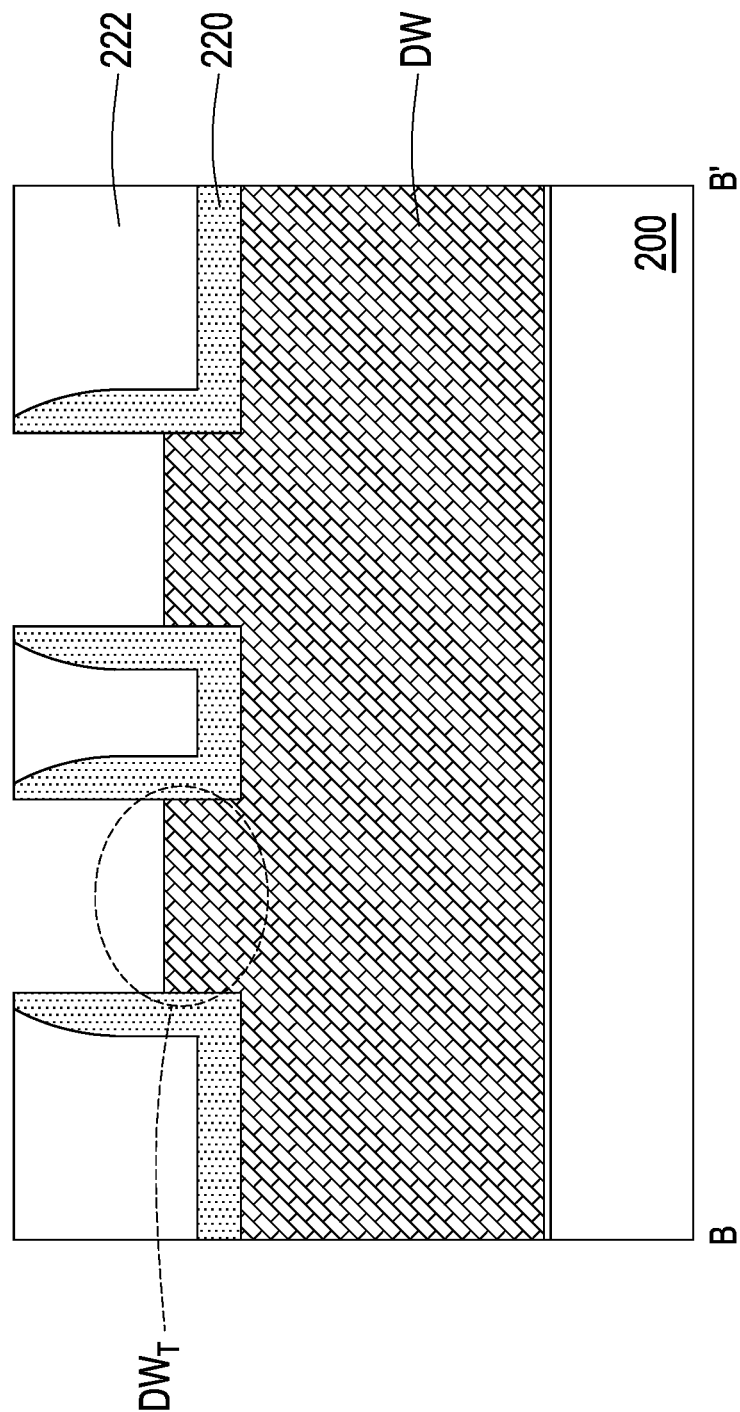

Referring to FIGS. 24A-24B, the polysilicon layer PO' of the dummy gate structure is etched back until the top surface of the polysilicon layer PO'' is lower than or coplanar with the top surface of the dielectric walls DW. Therefore, the top $DW_T$ of the dielectric walls DW can be exposed.

Figure 25A:
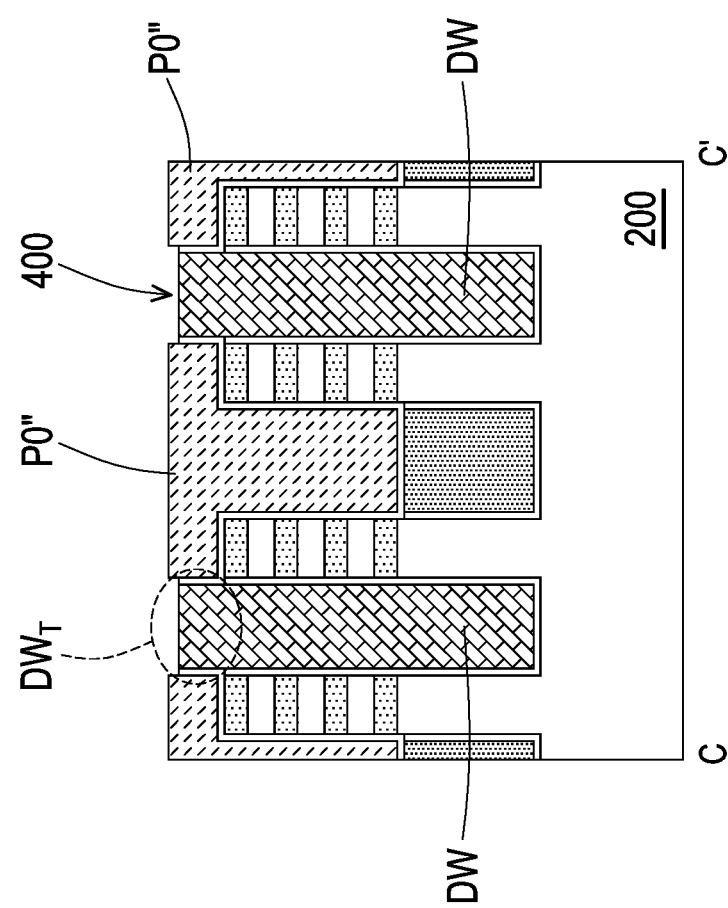
FIGS. 25A-25B are various views of a portion of a semiconductor device after etching the wall structures according to the fourth embodiment of the present disclosure.
Figure 25B:
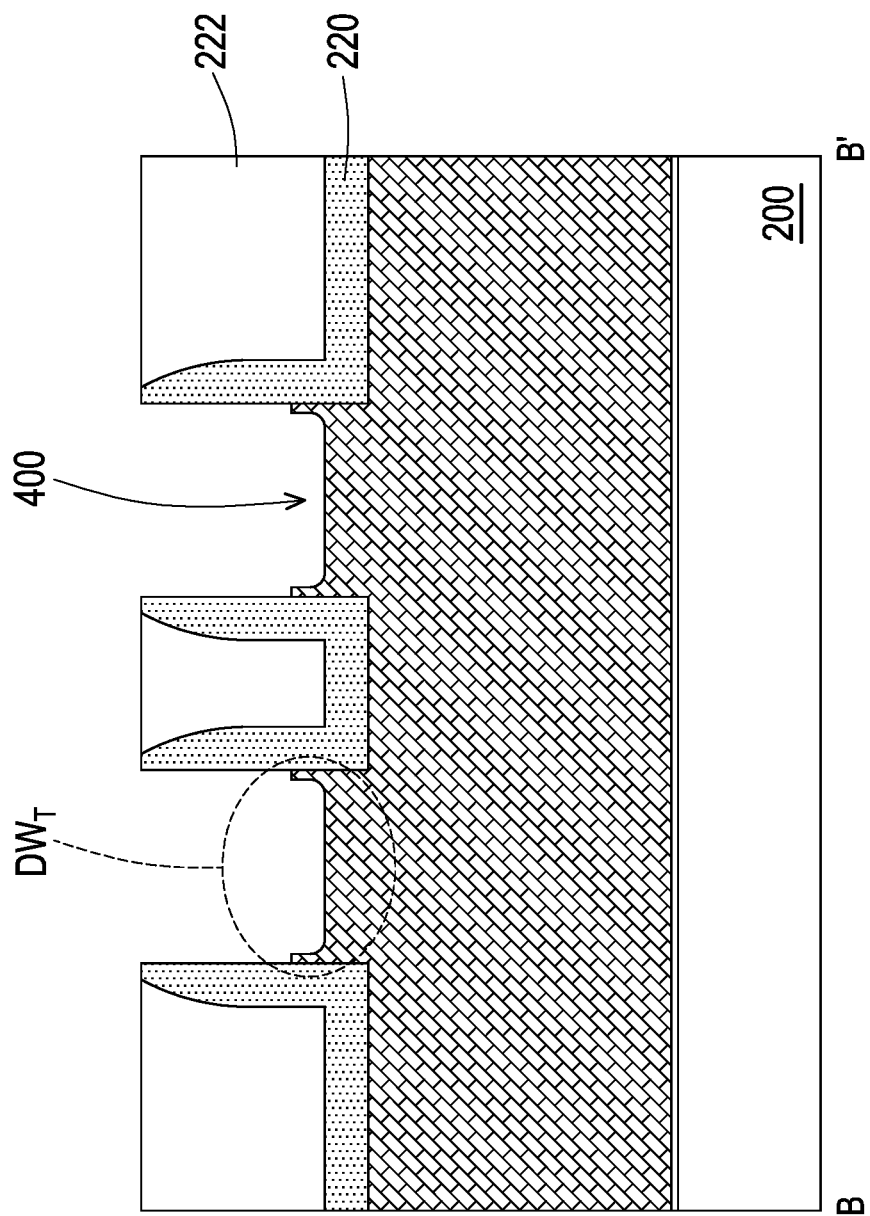

Referring to FIGS. 25A-25B, a portion of the top $DW_T$ of the dielectric walls DW is removed by etching the top $DW_T$ of the dielectric walls DW using the ILD 222 as an etching mask. After etching, the top $DW_T$ of each of the dielectric walls DW has a recess 400. In some embodiments, the recess 400 is a groove, and the top $DW_T$ of the dielectric walls DW has a U-shaped cross section. In the fourth embodiment, the recess 400 is formed without additional patterned mask, and thus the manufacture time and cost can be saved.

Figure 26B:
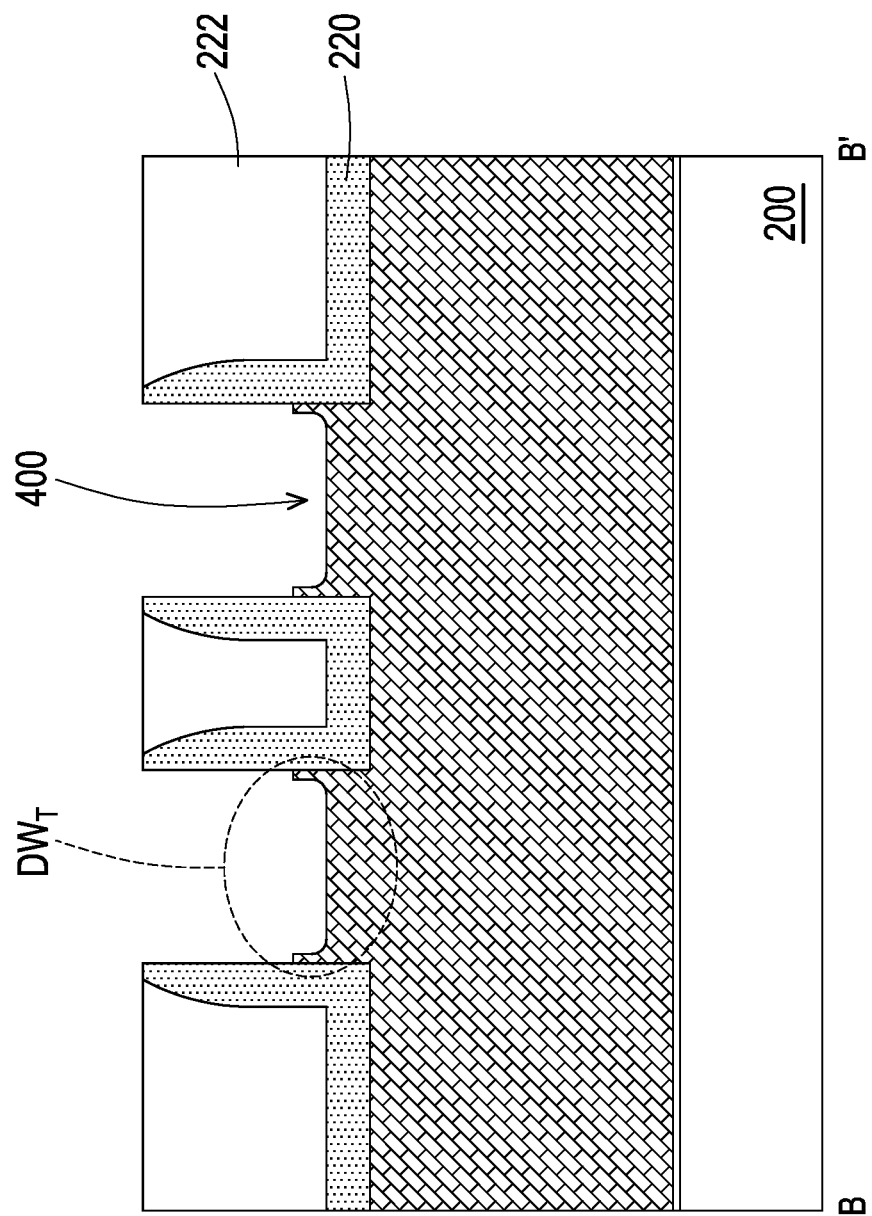

Referring to FIGS. 26A-26B, the dummy gate structure (i.e., the polysilicon layer PO'' and the dielectric layer 219) is removed, and the stacks of semiconductor nanosheets (e.g., NS01-NS02) are formed by removing the second layers $202_2$.

Figure 27A:
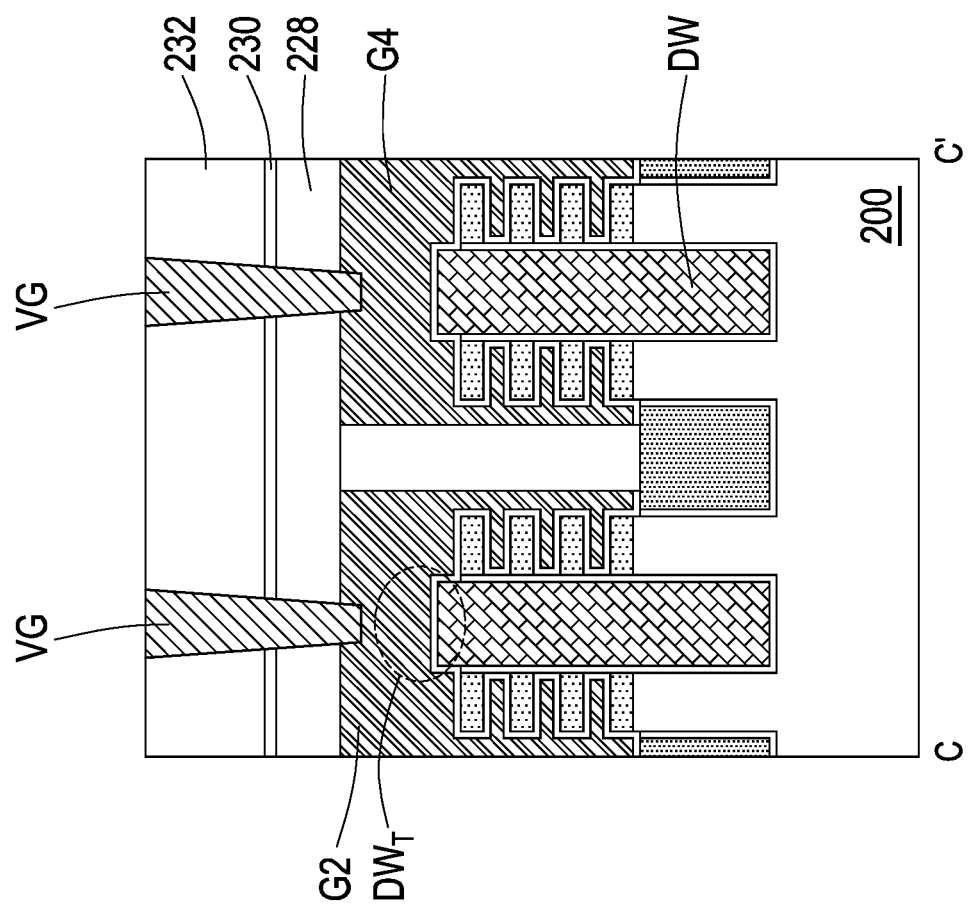
FIGS. 27A-27B are various views of a portion of a semiconductor device after formation of vertical gate contacts according to the fourth embodiment of the present disclosure.
Figure 27B:
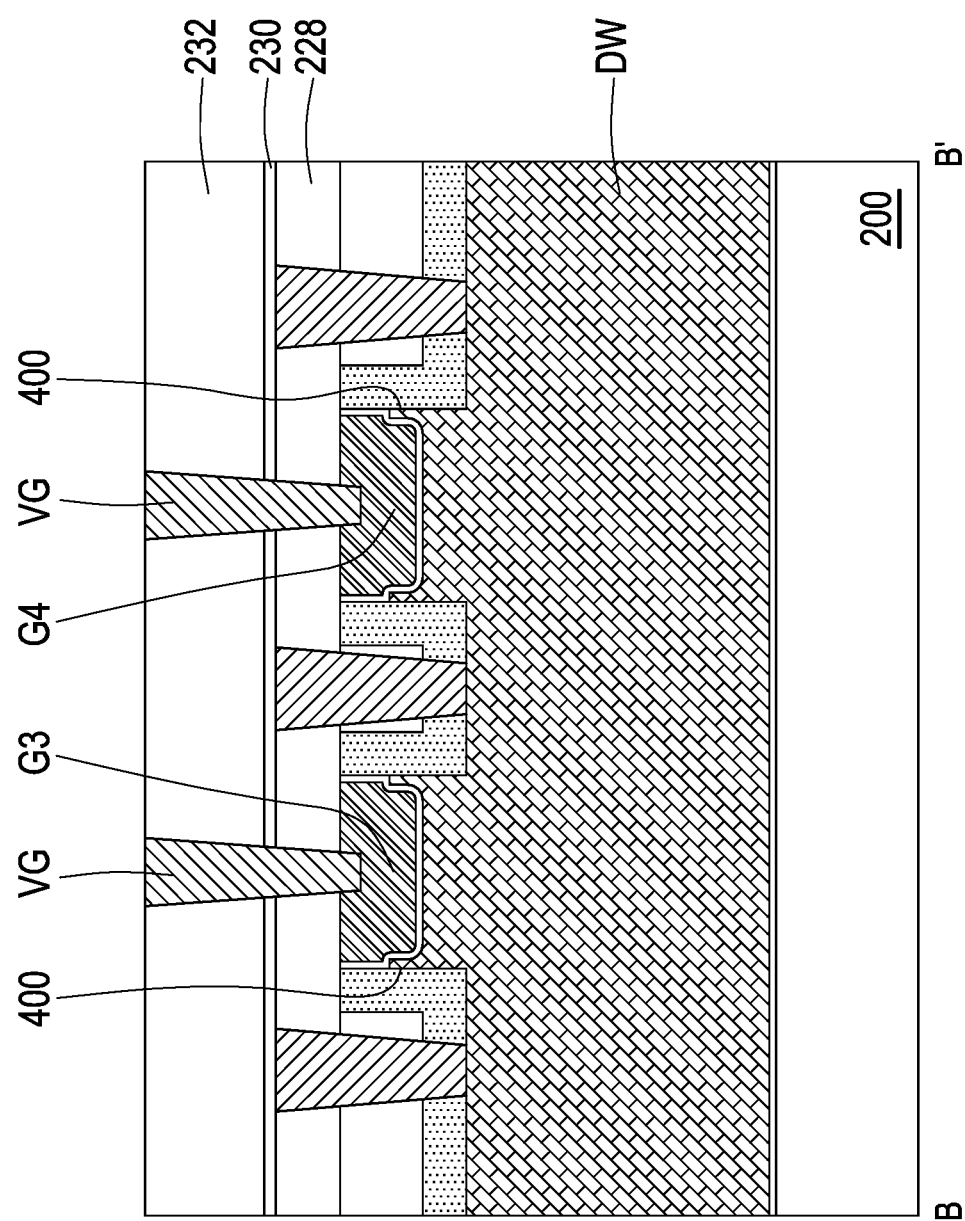

After the steps the same as FIGS. 14A to 17C of the second embodiment, the semiconductor device is formed shown in FIGS. 27A-27B, a middle end-of-line (MEOL) structure including vertical gate contacts VG is formed over the dielectric walls DW.

Figure 28A:
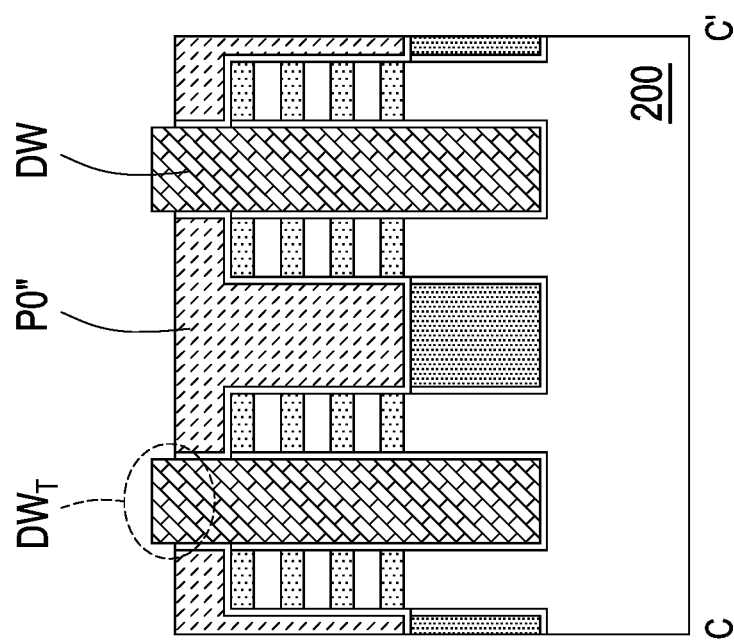
FIGS. 28A-28B are various views of a portion of a semiconductor device of another exemplary structure after formation of a dielectric layer according to the fourth embodiment of the present disclosure.
Figure 28B:
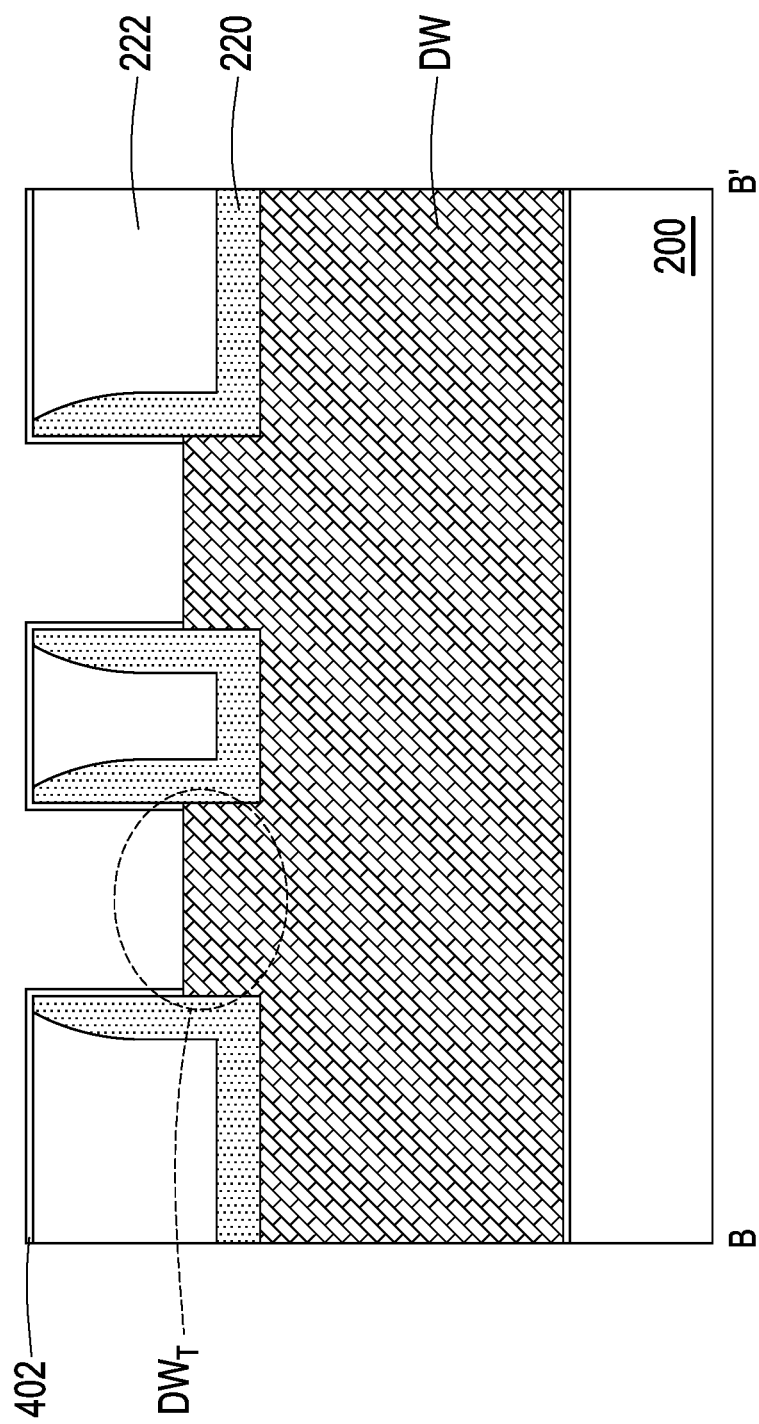

FIGS. 28A-29B are various views of a portion of a semiconductor device of another exemplary structure during the formation of the recess according to the fourth embodiment of the present disclosure. In FIGS. 28A-28B, a polymer layer 402 is formed on the CESL 220 and the ILD layer 222 by a dry etching tool. The polymer layer 402 may be a byproduct generated in the dry etching tool.

Figure 29A:
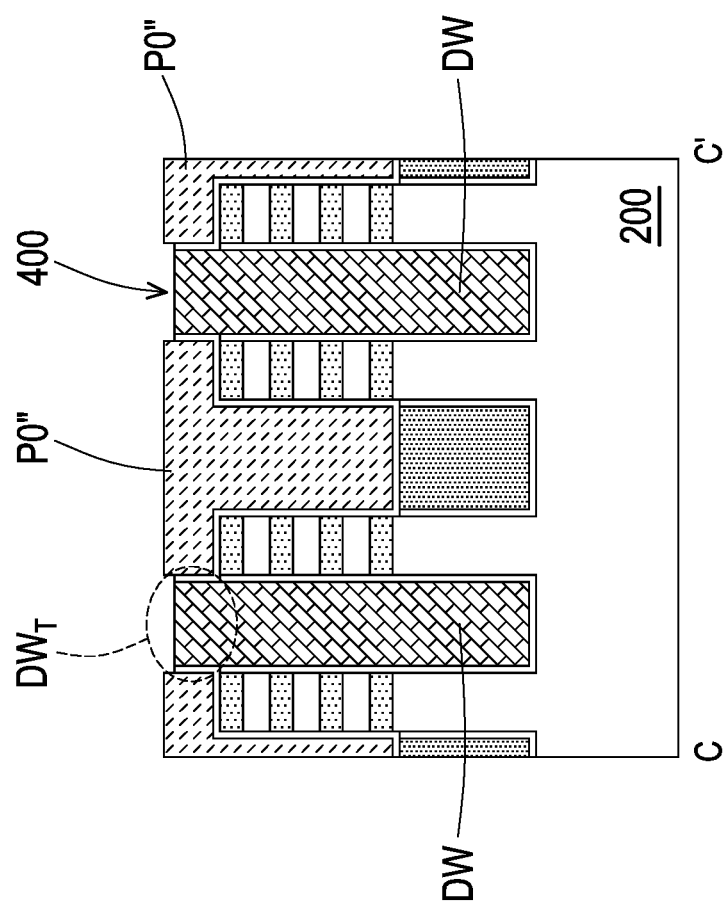
FIGS. 29A-29B are various views of a portion of a semiconductor device of another exemplary structure after etching the wall structures according to the fourth embodiment of the present disclosure.
Figure 29B:
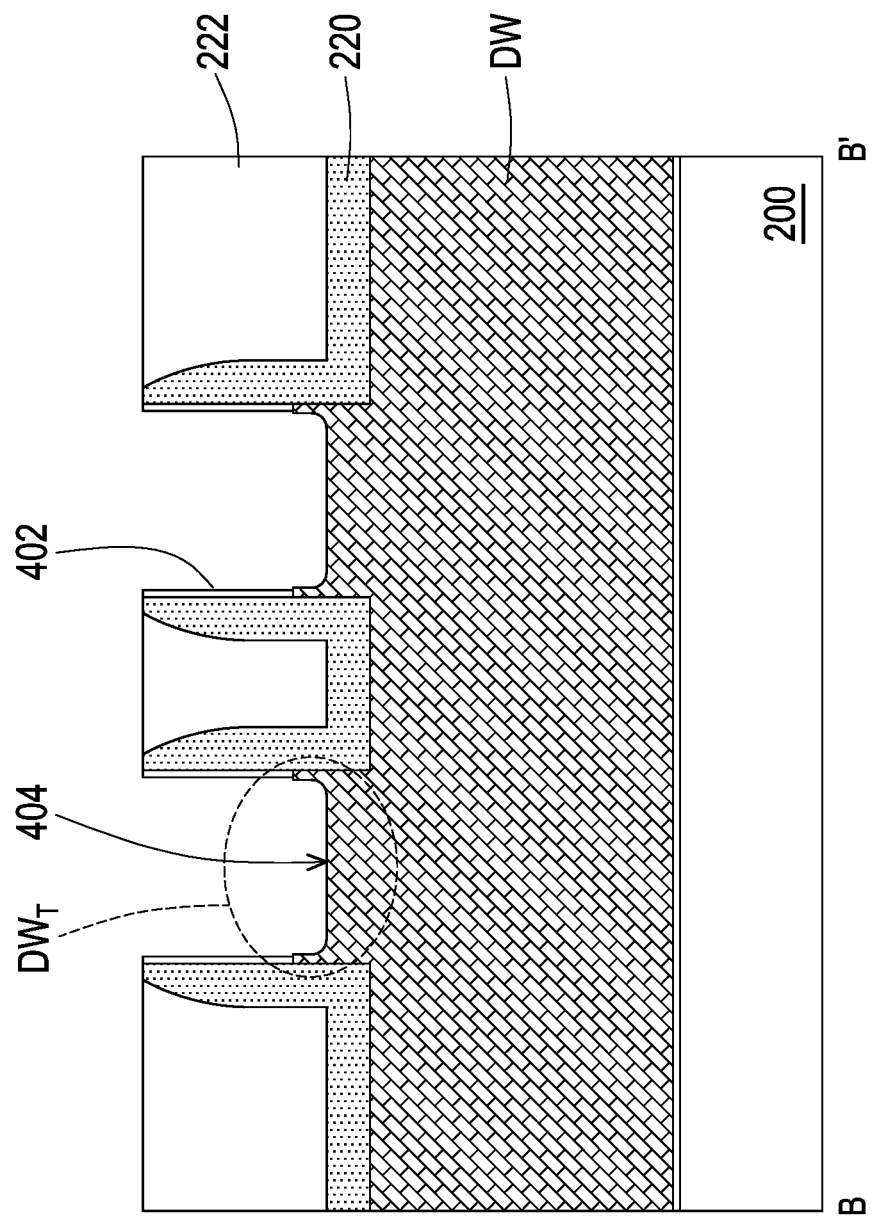

Referring to FIGS. 29A-29B, the top $DW_T$ of the dielectric walls DW is etched using the polymer layer 402 as an etching mask in order to form a recess 404 on the top $DW_T$ of each of the dielectric walls DW, wherein an etchant for dry etching the dielectric walls DW may include $CF_4$, $NF_3$, Cl like gas, or a combination thereof. However, the embodiments of the present disclosure are not limited thereto. In other embodiments, the polymer layer 402 may be omitted if the recess 404 can be directly formed by adjusting the parameters of the etching process.

Figure 30:
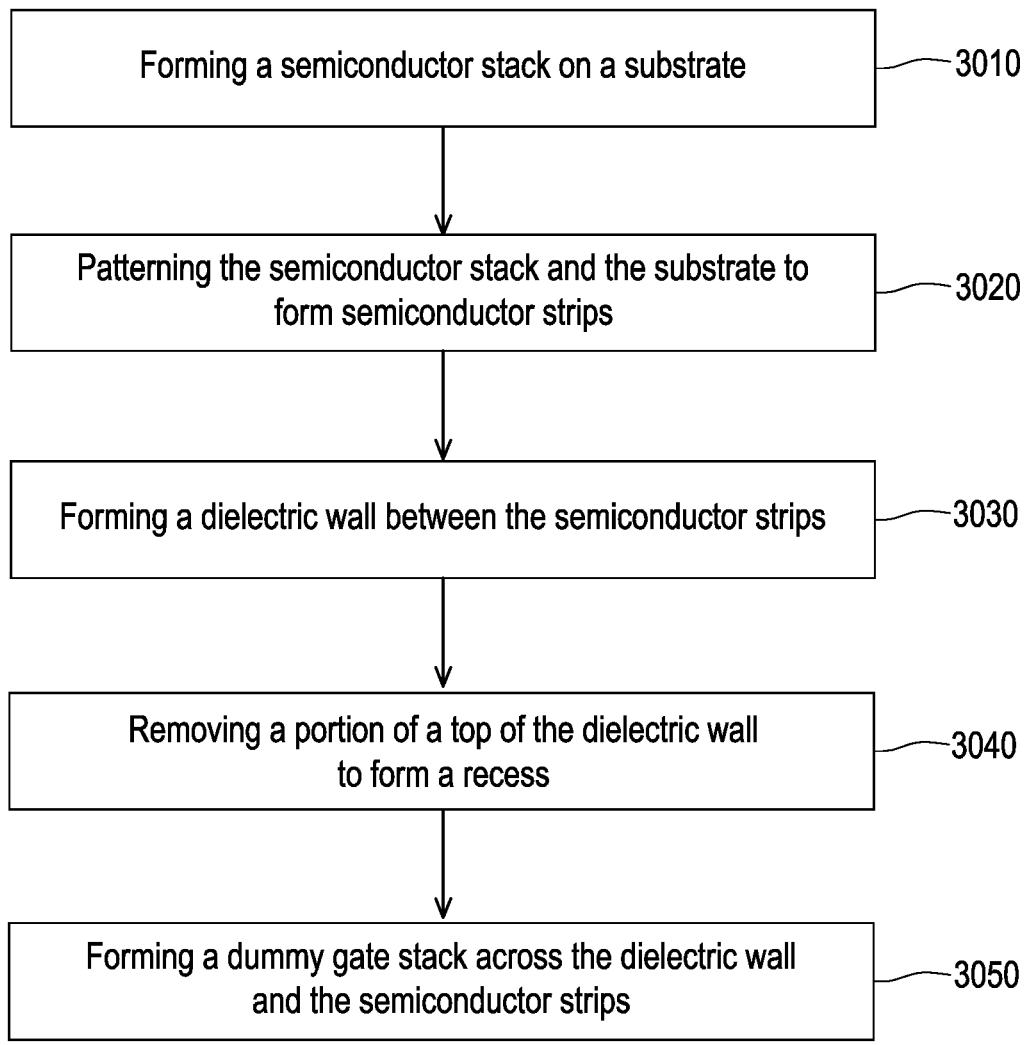
FIG. 30 is a flowchart that illustrates the general processing steps for manufacturing a semiconductor device of the present disclosure.

FIG. 30 is a flowchart that illustrates the general processing steps for manufacturing a semiconductor device of the present disclosure.

Referring to step 3010 and FIGS. 2A-2C, a semiconductor stack (202) is formed on a substrate (200), wherein the semiconductor stack (202) includes first layers ($202_1$) and second layers ($202_2$) stacked alternately.

Referring to step 3020 and FIGS. 3A-4C, the semiconductor stack (202) and the substrate (200) are patterned to form semiconductor strips (210).

Referring to step 3030 and FIGS. 5A-5C, a dielectric wall (DW) is formed between the semiconductor strips (210).

Referring to step 3040 and FIGS. 7A-8C, FIGS. 18A-19B, FIGS. 24A-25B, and FIGS. 28A-29B, a portion of a top ($DW_T$) of the dielectric wall (DW) is removed to form a recess (218, 302, 400, 404).

Referring to step 3050 and FIGS. 9A-10C and FIGS. 21A-22C, a dummy gate structure (PO) is formed across the dielectric wall (DW) and the semiconductor strips (210).

The structures of the disclosure are illustrated below. In some embodiments, a semiconductor device includes a substrate 100, a stack of semiconductor nanosheets (e.g., NS01-NS02), a dielectric wall (e.g., 102, 104, DW), and a gate structure (e.g., G1, G2, G3, G4). The substrate 100 includes a nanosheet mesa (e.g., F01, F02), and the stack of semiconductor nanosheets (e.g., NS01-NS02) is disposed on the nanosheet mesa (e.g., F01, F02). The dielectric wall (e.g., 102, 104, DW) crosses through the nanosheet mesa (e.g., F01, F02) and the stack of semiconductor nanosheets (e.g., NS01-NS02). The gate structure (e.g., G1, G2, G3, G4) wraps the stack of semiconductor nanosheets (e.g., NS01-NS02) and crosses over the dielectric wall (e.g., 102, 104, DW), wherein a top (e.g., 102a, 104a, $DW_T$) of the dielectric wall (e.g., 102, 104, DW) has a recess (e.g., 106, 218, 302, 400, 404).

In some embodiments, a bottom surface (e.g., DW B) of the recess (e.g., 218) is higher than a top surface of the stack of semiconductor nanosheets (e.g., NS01-NS02).

In some embodiments, the recess (e.g., 106, 218) is a hole, and the gate structure (e.g., G1, G2, G3, G4) fills the hole.

In some embodiments, the recess (e.g., 302, 400, 404) is a groove perpendicular to an extension direction of the nanosheet mesa (e.g., F01, F02).

According to some embodiments, the semiconductor device includes a substrate 100, a dielectric wall (e.g., 102, 104, DW), a first stack of semiconductor nanosheets (e.g., NS01), a second stack of semiconductor nanosheets (e.g., NS02), and a gate structure (e.g., G1, G2, G3, G4). The dielectric wall (e.g., 102, 104, DW) is disposed on the substrate 100. The first stack of semiconductor nanosheets (e.g., NS01) is disposed at a first side of the dielectric wall (e.g., 102, 104, DW) on the substrate 100. The second stack of semiconductor nanosheets (e.g., NS01) is disposed at a second side of the dielectric wall (e.g., 102, 104, DW) on the substrate 100. The gate structure (e.g., G1, G2, G3, G4) wraps the first stack of semiconductor nanosheets (e.g., NS01) and the second stack of semiconductor nanosheets (e.g., NS02). A top (e.g., 102a, 104a, $DW_T$) of the dielectric wall (e.g., 102, 104, DW) has a recess (e.g., 106, 218, 302, 400, 404), and the gate structure (e.g., G1, G2, G3, G4) covers the top (e.g., 102a, 104a, $DW_T$) of the dielectric wall (e.g., 102, 104, DW) and fills in the recess (e.g., 106, 218, 302, 400, 404).

In some embodiments, a bottom surface (e.g., DW B) of the recess (e.g., 218) is higher than a top surface of the first stack of semiconductor nanosheets (e.g., NS01) and a top surface of the second stack of semiconductor nanosheets (e.g., NS02).

In some embodiments, the top (e.g., $DW_T$) of the dielectric wall (e.g., 102, 104, DW) is bowl-shaped.

In some embodiments, the top (e.g., $DW_T$) of the dielectric wall (e.g., 102, 104, DW) has a U-shaped cross section.

In some embodiments, the top (e.g., $DW_T$) of the dielectric wall (e.g., 102, 104, DW) has sidewalls (e.g., $DW_S$) parallel to an extension direction of the gate structure (e.g., G1, G2, G3, G4) in a plan view.

In some embodiments, the semiconductor device further includes an n-type epitaxial layer (e.g., Epi01) disposed at the first side of the dielectric wall (e.g., 102, 104, DW); and a p-type epitaxial layer (e.g., Epi02) disposed at the second side of the dielectric wall (e.g., 102, 104, DW).

In some embodiments, the semiconductor device further includes a vertical gate contact (e.g., VG) disposed on the recess (e.g., 106, 218, 302, 400).

According to some embodiments, the semiconductor device includes a substrate, a stack of semiconductor nanosheets, a dielectric wall, and a gate structure. The substrate includes a nanosheet mesa, and the stack of semiconductor nanosheets is disposed on the nanosheet mesa. The dielectric wall crosses through the nanosheet mesa and the stack of semiconductor nanosheets. The gate structure wraps the stack of semiconductor nanosheets and crosses over the dielectric wall, wherein a top of the dielectric wall has a recess.

According to some embodiments, the semiconductor device includes a substrate, a dielectric wall, a first stack of semiconductor nanosheets, a second stack of semiconductor nanosheets, and a gate structure. The dielectric wall is disposed on the substrate. The first stack of semiconductor nanosheets is disposed at a first side of the dielectric wall on the substrate. The second stack of semiconductor nanosheets is disposed at a second side of the dielectric wall on the substrate. The gate structure wraps the first stack of semiconductor nanosheets and the second stack of semiconductor nanosheets. A top of the dielectric wall has a recess, and the gate structure covers the top of the dielectric wall and fills in the recess.

According to some embodiments, the method of forming a semiconductor device includes: forming a semiconductor stack on a substrate, wherein the semiconductor stack comprises first layers and second layers stacked alternately; patterning the semiconductor stack and the substrate to form semiconductor strips; forming a dielectric wall between the semiconductor strips; removing a portion of a top of the dielectric wall to form a recess; and forming a dummy gate structure across the dielectric wall and the semiconductor strips.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a substrate comprising a nanosheet mesa
a stack of semiconductor nanosheets disposed on the nanosheet mesa;
a dielectric wall crossing through the nanosheet mesa and the stack of semiconductor nanosheets; and
a gate structure wrapping the stack of semiconductor nanosheets and crossing over the dielectric wall,
wherein a top of the dielectric wall has a recess.

2. The semiconductor device of claim 1, wherein a bottom surface of the recess is higher than a top surface of the stack of semiconductor nanosheets.

3. The semiconductor device of claim 1, wherein the recess is a hole, and the gate structure fills the hole.

4. The semiconductor device of claim 1, wherein the recess is a groove perpendicular to an extension direction of the nanosheet mesa.

5. The semiconductor device of claim 1, further comprising:
an n-type epitaxial layer disposed at a first side of the dielectric wall; and
a p-type epitaxial layer disposed at a second side of the dielectric wall.

6. The semiconductor device of claim 1, further comprising: a vertical gate contact disposed on the recess.

7. A semiconductor device, comprising:
a substrate;
a dielectric wall disposed on the substrate;
a first stack of semiconductor nanosheets disposed at a first side of the dielectric wall on the substrate;
a second stack of semiconductor nanosheets disposed at a second side of the dielectric wall on the substrate; and
a gate structure wrapping the first stack of semiconductor nanosheets and the second stack of semiconductor nanosheets,
wherein a top of the dielectric wall has a recess, and
the gate structure covers the top of the dielectric wall and fills in the recess.

8. The semiconductor device of claim 7, wherein a bottom surface of the recess is higher than a top surface of the first stack of semiconductor nanosheets and a top surface of the second stack of semiconductor nanosheets.

9. The semiconductor device of claim 7, wherein the top of the dielectric wall is bowl-shaped.

10. The semiconductor device of claim 7, wherein the top of the dielectric wall has a U-shaped cross section.

11. The semiconductor device of claim 10, wherein the top of the dielectric wall has sidewalls parallel to an extension direction of the gate structure in a plan view.

12. The semiconductor device of claim 7, further comprising:
an n-type epitaxial layer disposed at the first side of the dielectric wall; and
an p-type epitaxial layer disposed at the second side of the dielectric wall.

13. The semiconductor device of claim 7, further comprising: a vertical gate contact disposed on the recess.

14. A method of forming a semiconductor device, comprising
providing a substrate comprising a nanosheet mesa
forming a stack of semiconductor nanosheets disposed on the nanosheet mesa;
forming a dielectric wall crossing through the nanosheet mesa and the stack of semiconductor nanosheets, wherein a top of the dielectric wall has a recess; and
forming a gate structure wrapping the stack of semiconductor nanosheets and crossing over the dielectric wall.

15. The method of claim 14, wherein a step of forming the dielectric wall is followed by a step of forming a dummy gate structure.

16. The method of claim 15, wherein the step of forming the dielectric wall comprises etching the top of the dielectric wall using an etching mask with a hole.

17. The method of claim 15, wherein the step of forming the dielectric wall comprises etching the top of the dielectric wall using an etching mask with a trench.

18. The method of claim 14, wherein a step of forming the dielectric wall follows a step of forming a dummy gate structure.

19. The method of claim 18, further comprising
forming an inter layer dielectric (ILD) to cover a fill in on the dummy gate structure;
performing a planarization process on the ILD until the dummy gate structure is exposed; and
removing the dummy gate structure to expose the top of the dielectric wall.

20. The method of claim 19, wherein the step of forming the dielectric wall comprises etching the top of the dielectric wall using the ILD as an etching mask.

* * * * *